United States Patent
Ozumi

(10) Patent No.: US 7,148,524 B2
(45) Date of Patent: Dec. 12, 2006

(54) SOLID-STATE IMAGING DEVICE AND METHOD FOR DRIVING THE SAME

(75) Inventor: Takehiko Ozumi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 378 days.

(21) Appl. No.: 10/893,023

(22) Filed: Jul. 15, 2004

(65) Prior Publication Data

US 2005/0017154 A1    Jan. 27, 2005

(30) Foreign Application Priority Data

Jul. 15, 2003    (JP)    ............................. 2003-275021

(51) Int. Cl.
*H01L 27/148*    (2006.01)
*H04N 9/64*    (2006.01)

(52) U.S. Cl. ....................... 257/223; 348/245
(58) Field of Classification Search ................ 257/223, 257/232; 348/241, 245
See application file for complete search history.

(56) References Cited

U.S. PATENT DOCUMENTS 6,198,507 B1    3/2001    Ishigami 6,980,242 B1 *   12/2005   Funakoshi et al. .......... 348/245
2005/0224842 A1 *   10/2005   Toyama .................... 257/225

FOREIGN PATENT DOCUMENTS

| JP | 11-054741 | 2/1999 |
|---|---|---|
| JP | 2000-115643 | 4/2000 |
| KR | 1998-702357 | 7/1998 |

* cited by examiner

*Primary Examiner*—W. David Coleman
(74) *Attorney, Agent, or Firm*—David C. Conlin; David A. Tucker; Edwards Angell Palmer & Dodge LLP

(57) ABSTRACT

A solid-state imaging device including a plurality of light receiving sections; a pixel area vertical transfer register section for transferring, column by column, charges generated by the plurality of light receiving sections; a dummy area vertical transfer register section for transferring, column by column in the vertical direction, the charges which have been transferred by the pixel area vertical transfer register section, the dummy area vertical transfer register section providing a control such that the transfer of the charges of at least one of the plurality of columns is performed in the same manner as the charges in the other columns in one case, and in a different manner from the transfer of the charges in the other columns in another case; and a horizontal transfer register section for transferring, in a horizontal direction, the charges which have been transferred from the dummy area vertical transfer register section.

22 Claims, 34 Drawing Sheets

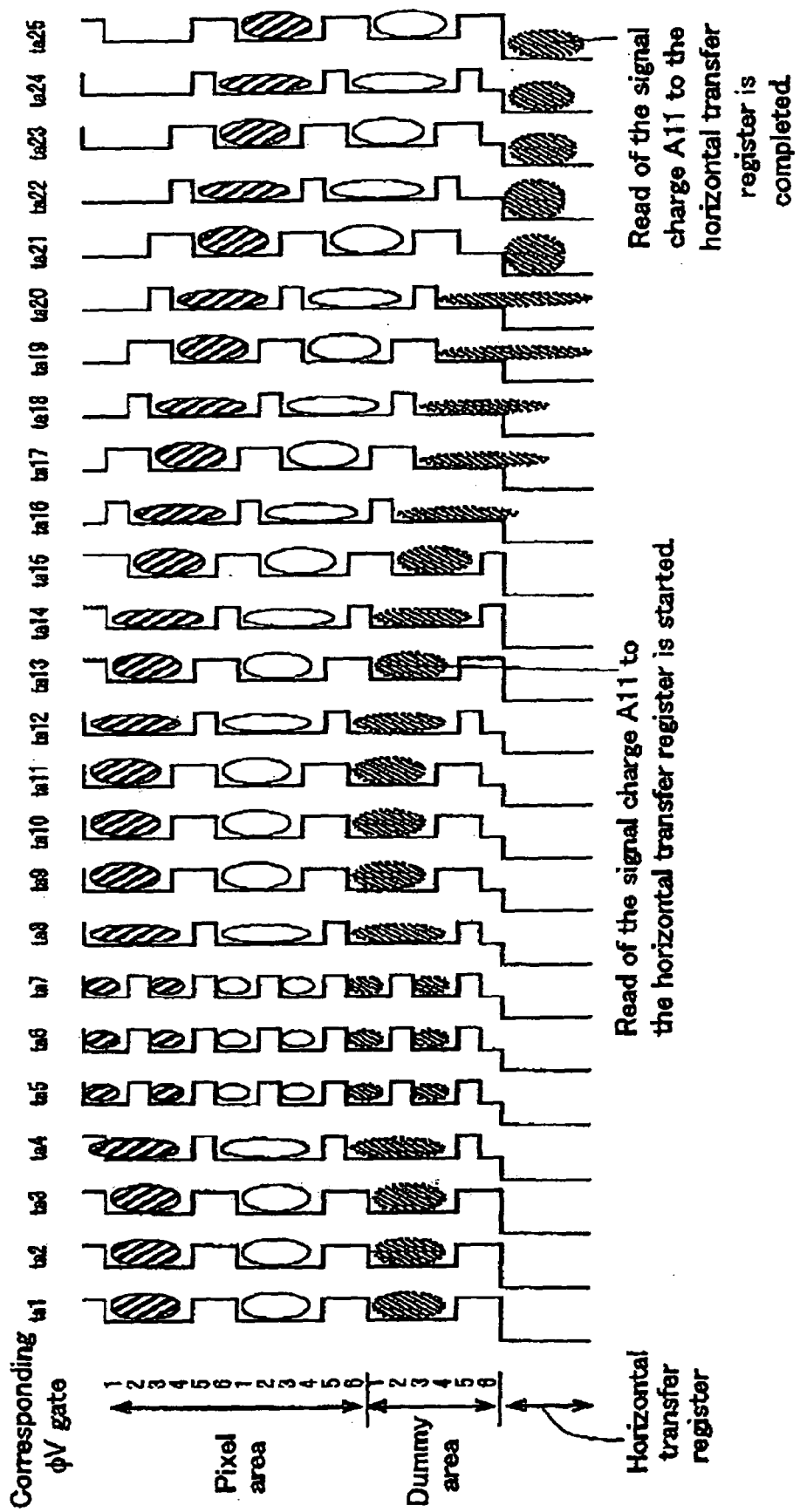

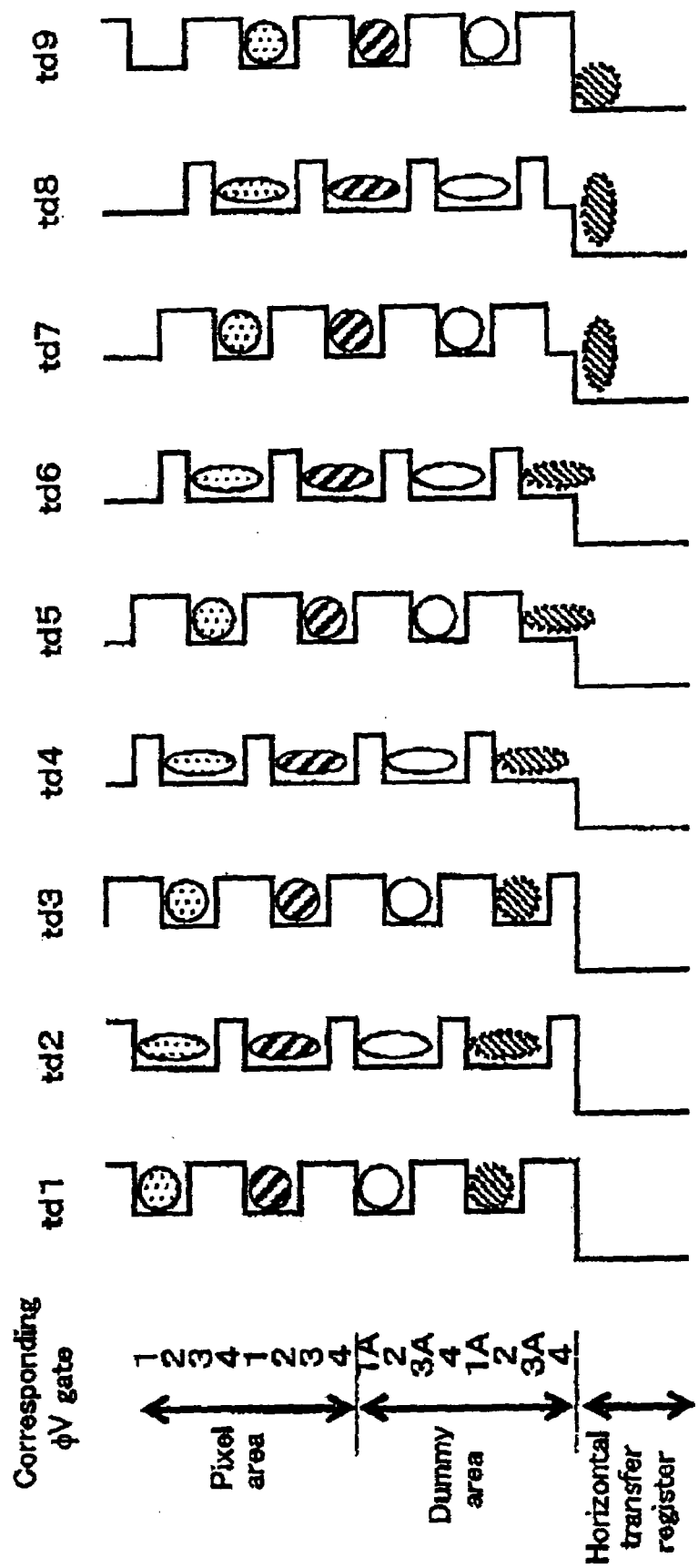

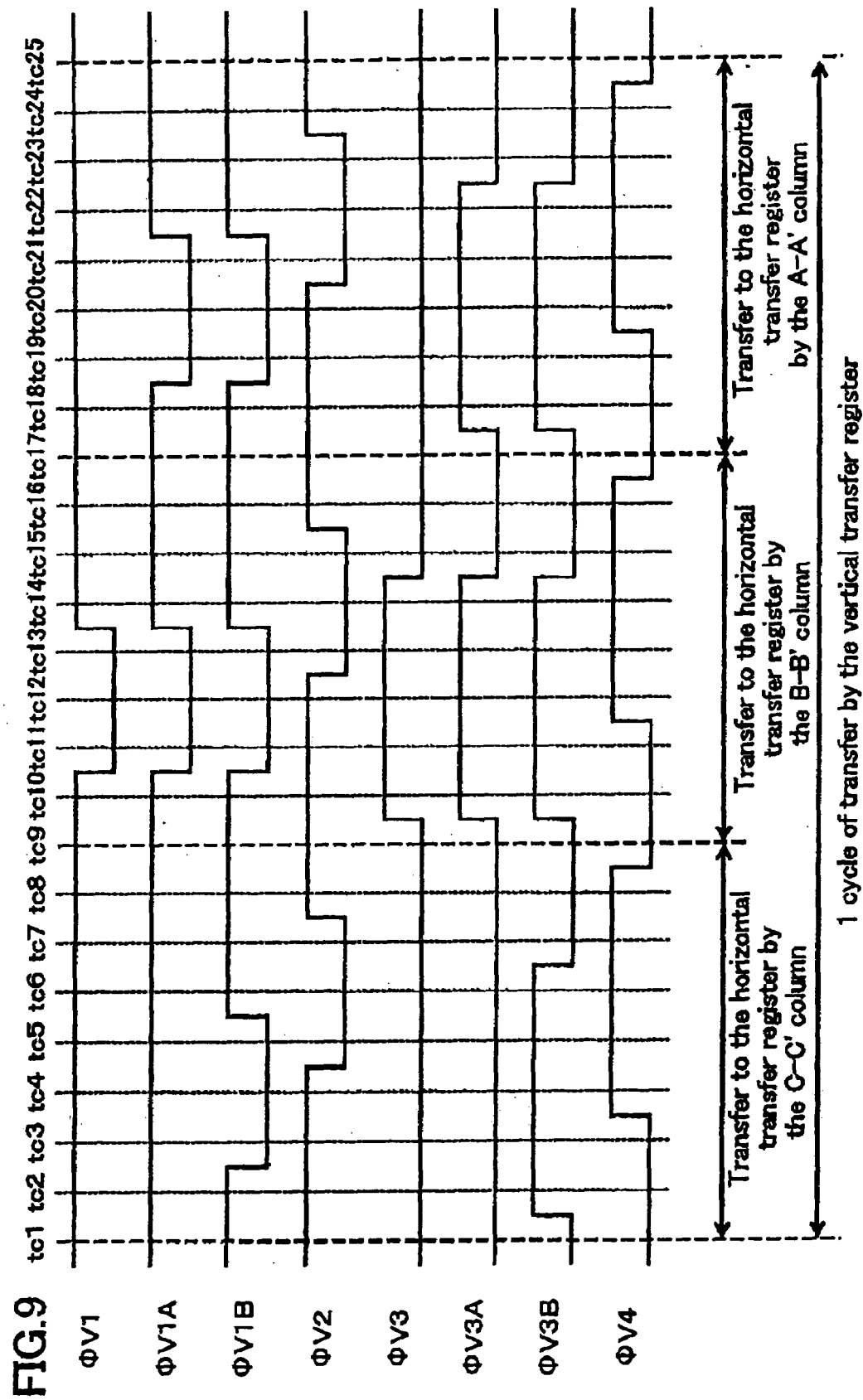

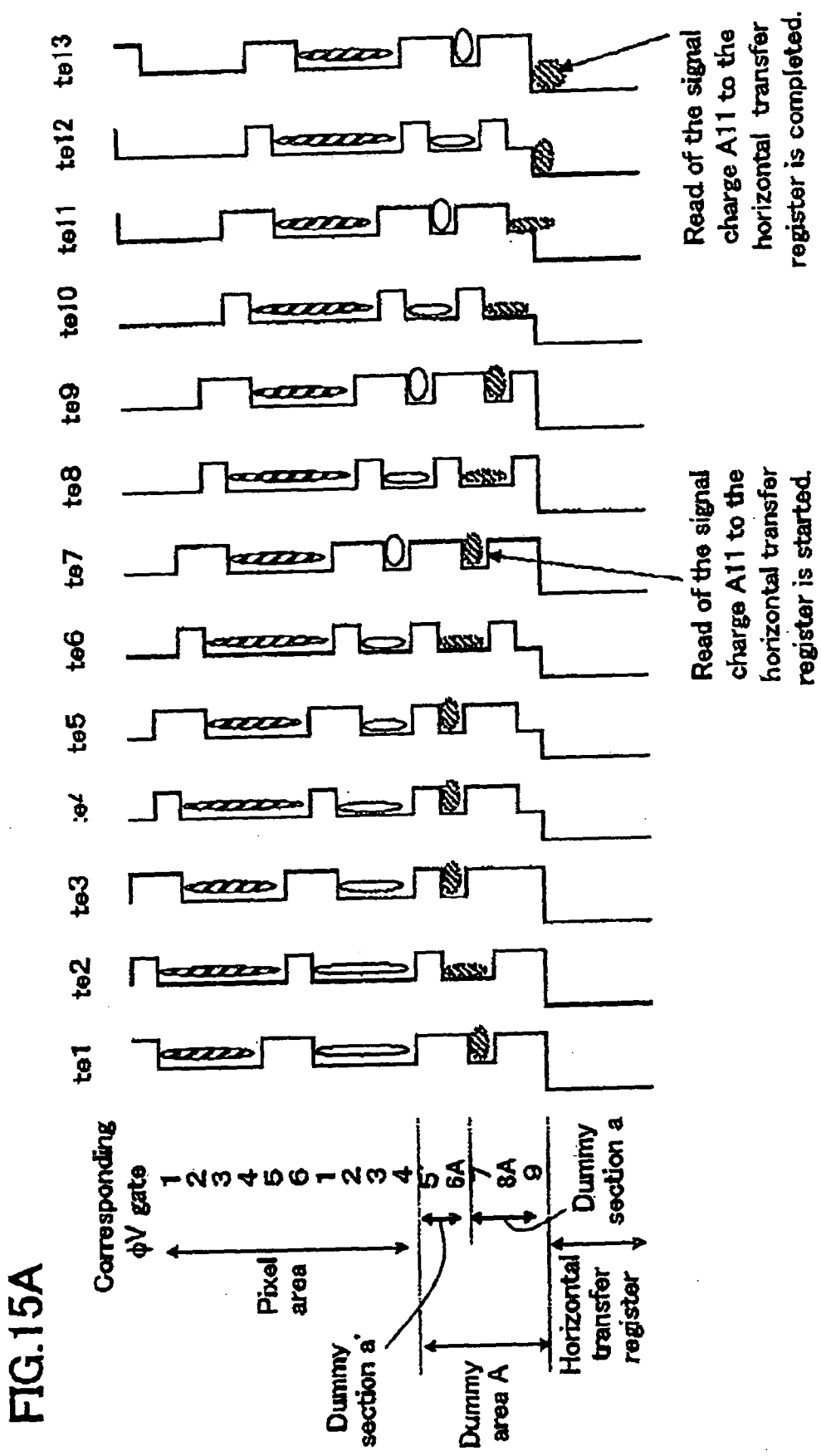

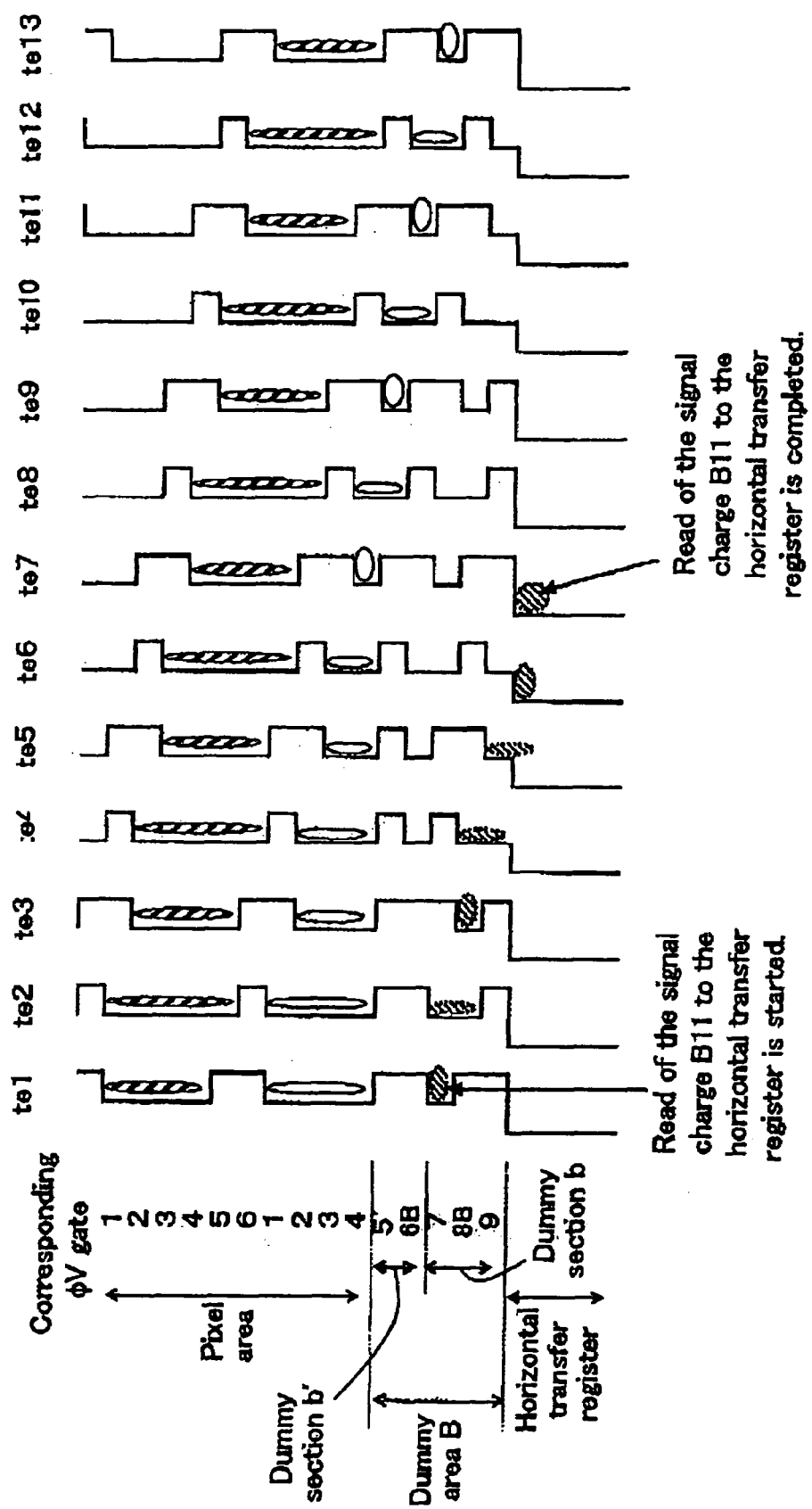

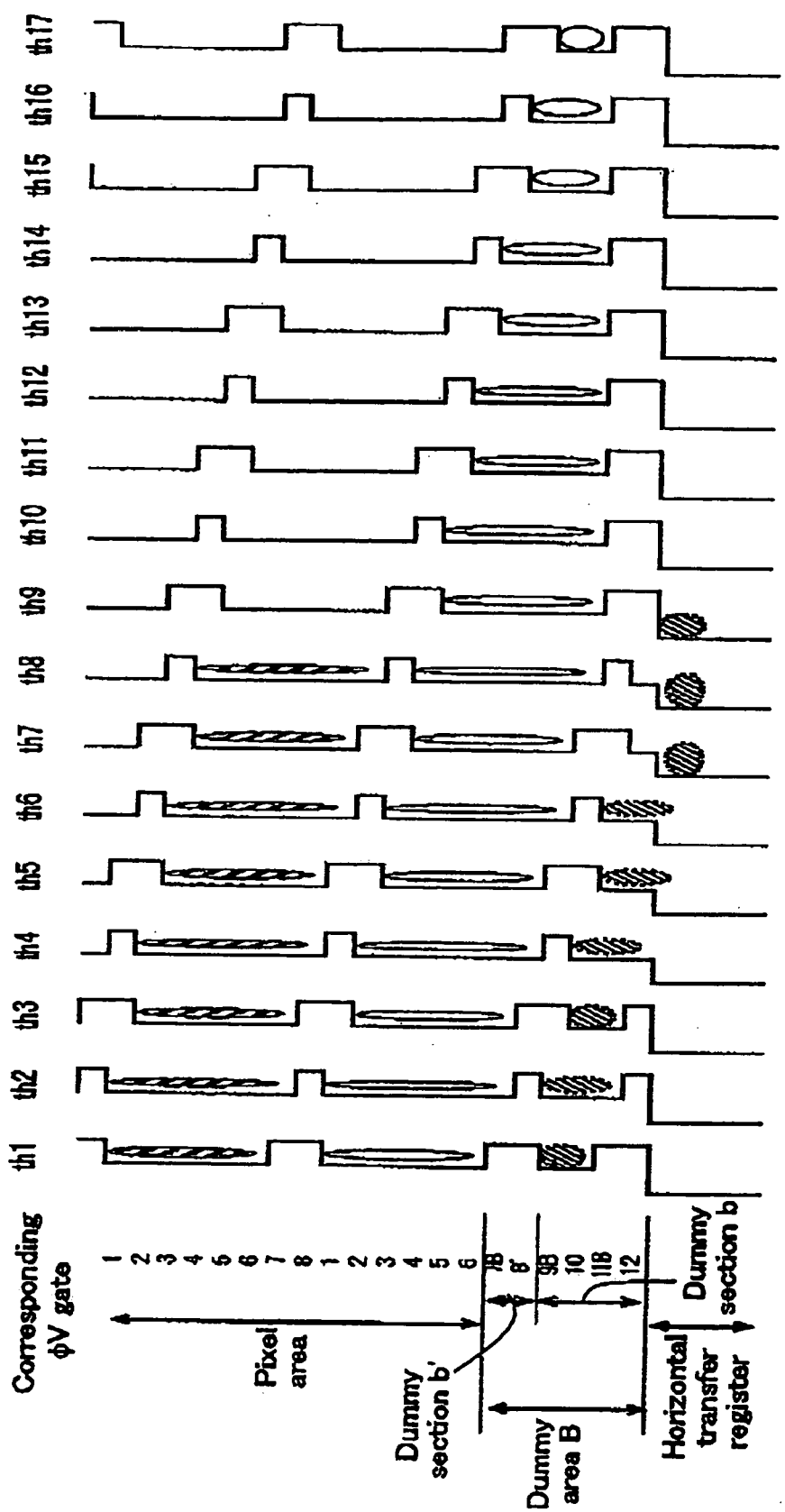

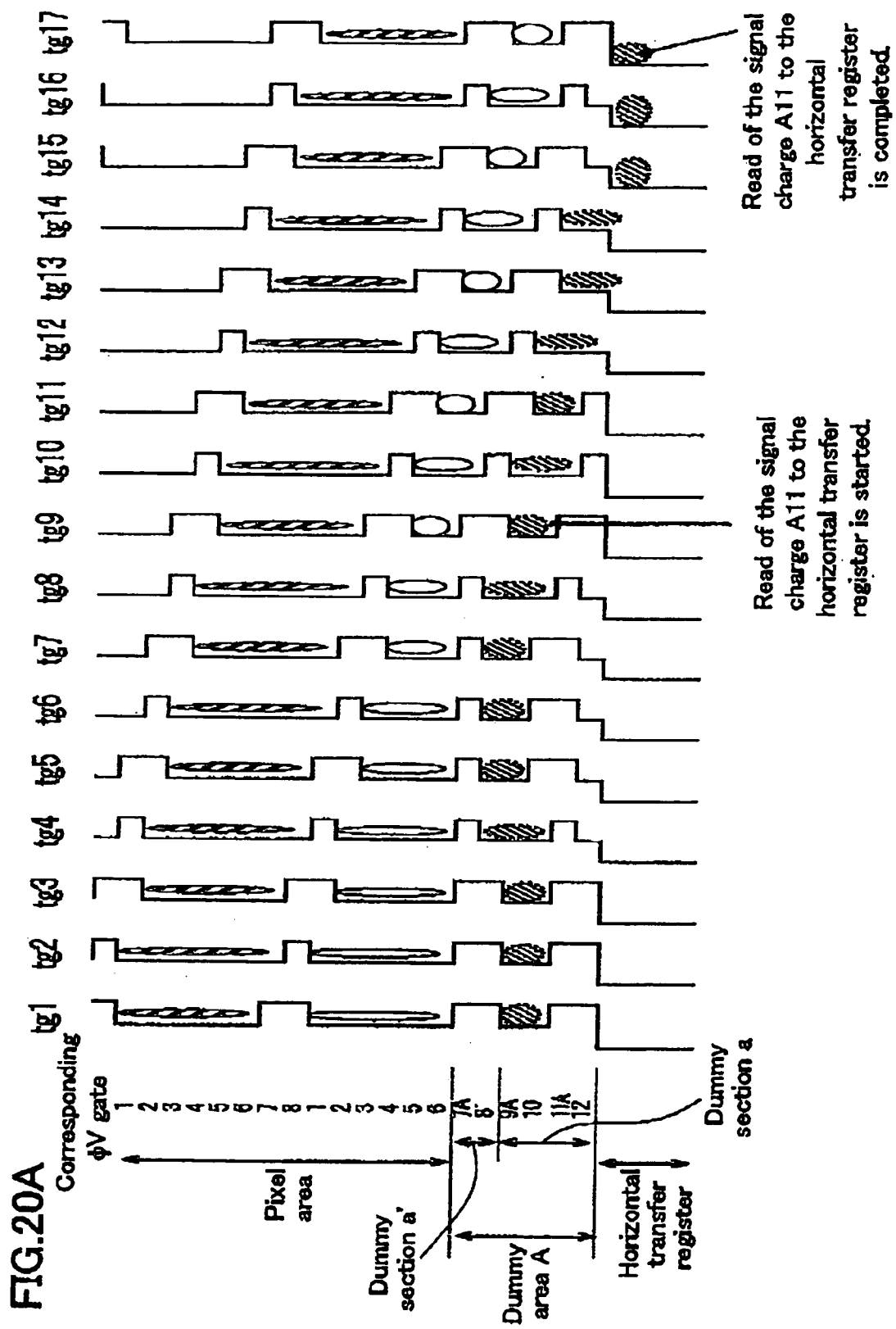

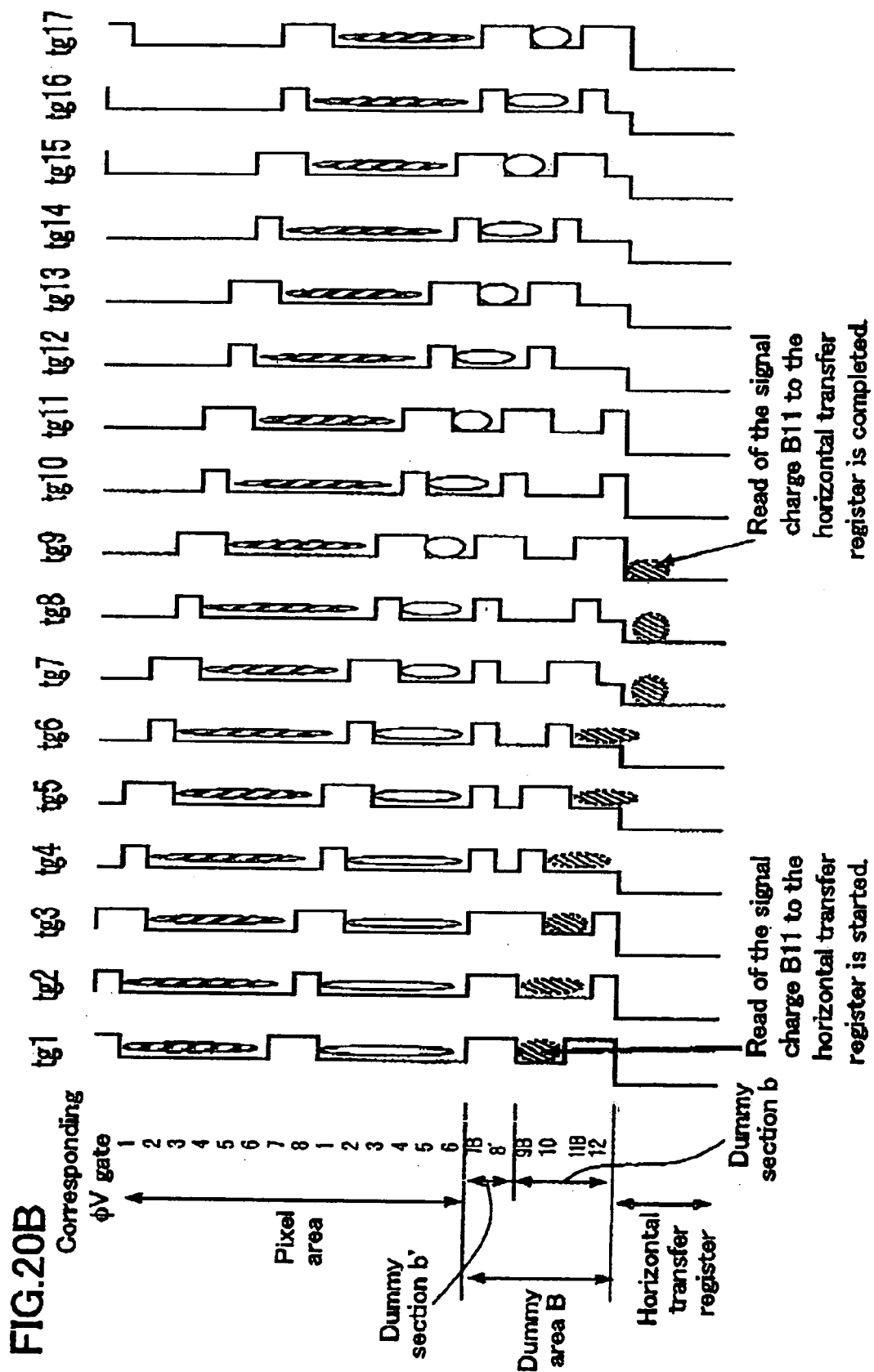

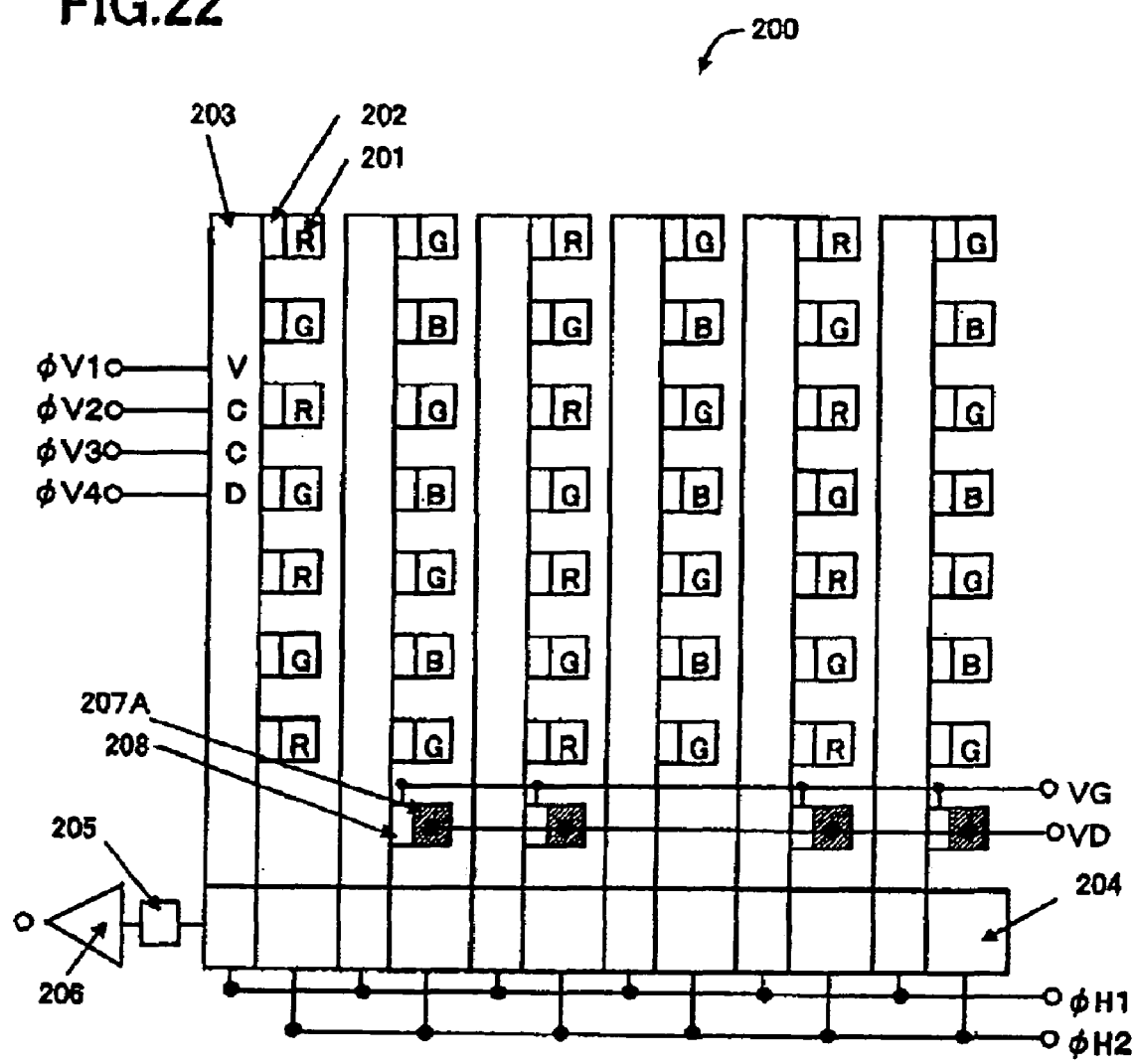

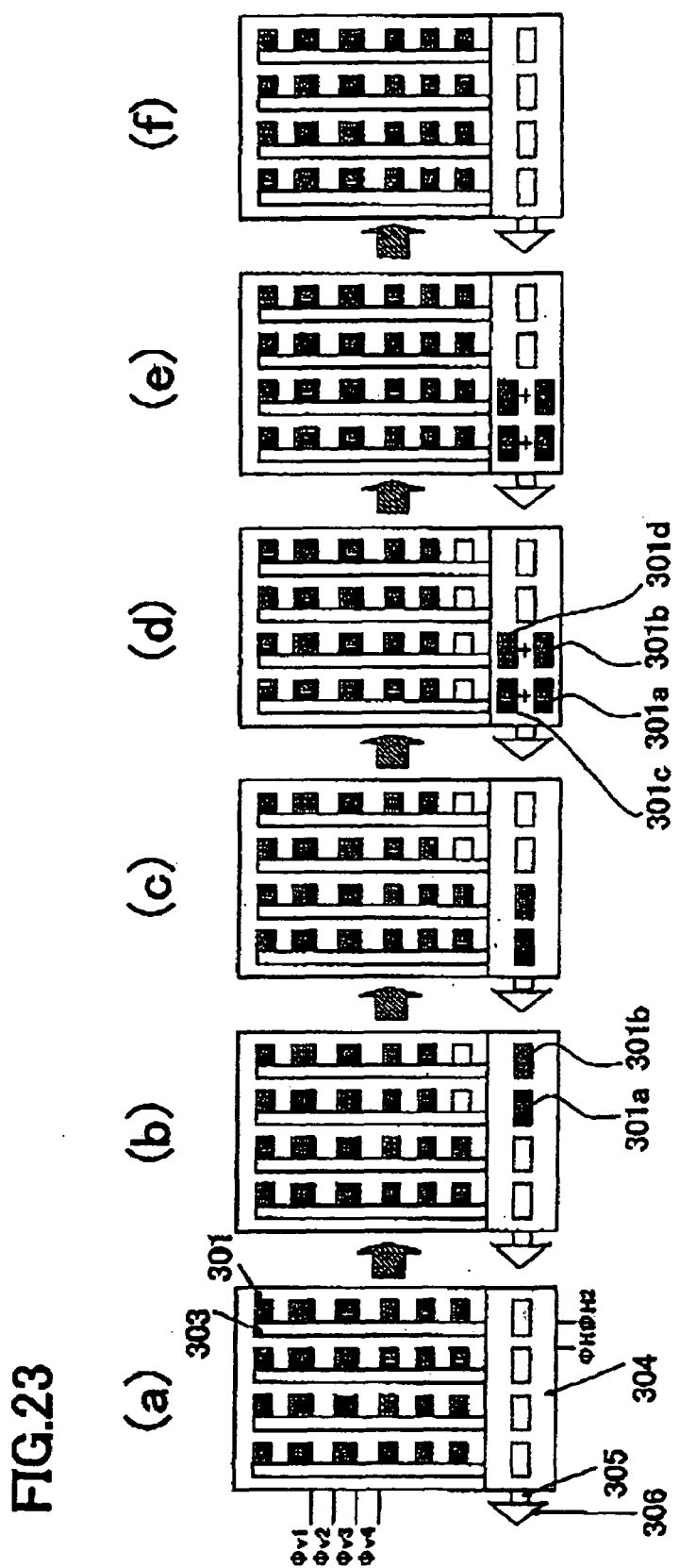

SOLID-STATE IMAGING DEVICE AND METHOD FOR DRIVING THE SAME

This non-provisional application claims priority under 35 U.S.C., §119(a), on Patent Application No. 2003-275021 filed in Japan on Jul. 15, 2003, the entire contents of which are hereby incorporated by reference.

BACKGROUND OF THE INVENTION

1. Field of the Invention

The present invention relates to a solid-state imaging device and a method for driving the same, and in particular to a solid-state imaging device usable as an imaging device for a digital still camera, a video camera or the like, and a method for driving the same.

2. Description of the Related Art

Recently, the image quality of digital still cameras has been rapidly enhanced. As an imaging device therefor, solid-state imaging devices, especially CCD image sensors having a pixel number of one million or greater have been widely used. These CCD image sensors are generally switchable between two driving modes, i.e., a still mode in which a signal charge is independently read from all the pixels so as to obtain a still picture, and a monitoring mode in which a moving picture is displayed on a liquid crystal monitor or the like.

In order to realize the function of the monitoring mode, a frame rate of about 30 frames per second is considered to be required. However, there is a limit in the driving frequency characteristics of a CCD image sensor, and a low power consumption is demanded. Therefore, it in not easy to raise the driving frequency. This makes it difficult to obtain the necessary frame rate in the monitoring mode as the number of pixels of a CCD image sensor increases.

In order to solve this problem, CCD image sensors having a pixel number of one million or greater currently adopt a method of increasing the frame rate by reading a signal charge only from a part of the pixels arranged in a vertical direction to remove data of some of the lines and thus reducing the data amount.

Another method for reducing the data amount in the vertical direction has also been proposed. This method will be described with reference to FIG. 21.

FIG. 21 in a plan view of a conventional CCD image sensor 100 as an exemplary conventional solid-state imaging device. The CCD image sensor 100 is of an interlace system and has four-phase driving vertical transfer registers.

The CCD image sensor 100 includes a plurality of photodiodes 101 each acting as a light receiving section, a plurality of transfer gates 102 provided in correspondence with the plurality of photodiodes 101 respectively, a plurality of vertical transfer registers 103, a horizontal transfer register 104, a charge detection section 105, an output amplifier 106, and a sweep-out drain 107.

The plurality of photodiodes 101 are arranged in a matrix in rows and columns on a semiconductor substrate. On the top surface of each of the photodiodes 101, an R, G or B color filter is provided. The RGB color filters are arranged in the Bayer pattern. Each of the photodiodes 101 generates an electric charge in response to receiving light. In this specification, the electric charge is also referred to as the "signal charge". The charge represents data.

Each of the vertical transfer registers 103 is provided adjacent to a corresponding column of the photodiodes 101. Each vertical transfer register 103 is connected to the corresponding photodiodes 101 via the corresponding transfer gates 102. Each vertical transfer register 103 transfers the signal charge read from the photodiodes 101 in a vertical direction by the four-phase driving of $\phi V1$ through $\phi V4$.

The horizontal transfer register 104 is provided perpendicular to the vertical transfer registers 103. The horizontal transfer register 104 transfers the signal charge which has been transferred by each of the vertical transfer registers 103 in a horizontal direction by two-phase driving of $\phi H1$ and $\phi H2$. A signal charge transferred by the horizontal transfer register 104 is detected by the charge detection section 105 and output by the output amplifier 106.

The sweep-out drain 107 is provided adjacent to the horizontal transfer register 104. The sweep-out drain 107 discharges unnecessary charges row by row, so that the data of come unnecessary rows of the plurality of rows arranged in the vertical direction can be removed.

A method for reducing the data amount in the horizontal direction in order to raise the frame rate will be described with reference to FIG. 22.

FIG. 22 is a plan view of a conventional CCD image sensor 200 as another exemplary conventional solid-state imaging device. The CCD image sensor 200 is of an interlace system and has four-phase driving vertical transfer registers.

The CCD image sensor 200 includes a plurality of photodiodes 201 each acting as a light receiving section, a plurality of transfer gates 202 provided in correspondence with the plurality of photodiodes 201 respectively, a plurality of vertical transfer registers 203, a horizontal transfer register 204, a charge detection section 205, an output amplifier 206, a sweep-out drain 207A provided between a specified vertical transfer register 203 and the horizontal transfer register 204 for discharging unnecessary charges, and a control gate 208 for controlling the discharge of the charges performed by the sweep-out drain 207A.

The control gate 208 is controlled so as to allow the sweep-out drain 207A to discharge charges, so that the transfer of the signal charges from the specified vertical transfer register 203 to the horizontal transfer register 204 is prevented. Therefore, unnecessary data is removed in the horizontal direction, and the frame rate can be raised.

Another method for reducing the data amount in the horizontal direction will be described regarding a CCD image sensor 300 shown in FIG. 23 as another exemplary conventional solid-state imaging device. This method does not sweep data, but removes unnecessary data by adding signals from the light receiving sections for the same color in the same row.

FIG. 23(a) shows the initial state. In FIG. 23(b) showing the state after the first data read, data 301a has been read from a photodiode 301 for red and data 301b has been read from a photodiode 301 for green to a horizontal transfer register 304 via corresponding vertical transfer registers 303.

Then, as shown in FIG. 23(c), the data 301a and 301b, which were red in the first data read from the photodiodes 301 are transferred by two column by the horizontal transfer register 304.

In FIG. 23(d) showing the state after the second data read, data 301c has been read from a photodiode 301 for red and data 301d has been read from a photodiode 301 for green to the horizontal transfer register 304 via corresponding vertical transfer registers 303. The data read by the second data read is added to the data for the same color which was read by the first data read. Specifically, the data 301c for red is added to the data 301a for red, and data 301d for green is added to the data 301b for green.

Then, as shown in FIG. 23(e), the data corresponding to each photodiode 301 is transferred by one row in the vertical direction by the vertical transfer registers 303.

As shown in FIG. 23(f), the data 301a, the data 301b, the data 301c and the data 301d are transferred in the horizontal direction by the horizontal transfer register 304, and the signal charges are output from an output amplifier 306 via a charge detection section 305.

In this manner, unnecessary data is removed in the horizontal direction, and the frame rate is raised.

In the CCD image sensor 300, the color filters are generally arranged such that two adjacent filters in the horizontal direction are not of the same color. Once a signal is read from one of the vertical transfer registers 303 to the horizontal transfer register 304, signals corresponding to the same color cannot be added together. In order to allow signals (data) of the same color to be added together, the data read is performed as follows. As shown in FIG. 23, the data read from the vertical transfer registers 303 to the horizontal transfer register 304 performed in a plurality of stages. After data read in performed once from the vertical transfer register 303 to the horizontal transfer register 304 and before the data read is performed the next time from the vertical transfer register 303 to the horizontal transfer register 304, the signals which have been read are moved to the vertical column having the same color of data at the bottom (horizontal transfer). The horizontal transfer is repeated.

Solid-state imaging devices operating in such a manner are disclosed in, for example, Japanese Laid-Open Publication No. 11-54741 and Japanese Laid-Open Publication No. 2000-115643.

The solid-state imaging device disclosed in Japanese Laid-Open Publication No. 11-54741 has a three-layer transfer electrode between the vertical transfer registers and the horizontal transfer register. While some of the signal charges are held in the transfer electrode section, the other signal charges are first transferred to the horizontal transfer register. Then, the remaining signal charges are transferred to the horizontal transfer register. Thus, the newly transferred signal charges can be added to the first transferred signal charges.

The solid-state imaging device disclosed in Japanese Laid-Open Publication No. 2000-115643 includes a two-layer transfer electrode between the vertical transfer registers and the horizontal transfer register. The transfer number (the number of times that the signal is applied to a register which is necessary for the signal charge transferred by the register arrives at the horizontal transfer register) is different among different vertical transfers. The signal charges of pixels which are in the same row and are not adjacent to each other are sequentially transferred from the corresponding vertical transfer register to the horizontal transfer register. Thus, a signal charge which is transferred later in added to a signal charge first transferred.

The above-described conventional methods for removing unnecessary data can realize highly free data removal in the vertical direction. For data removal in the horizontal direction, the methods have the following problems.

In the structure shown in FIG. 22, the sweep-out drain 207A for discharging unnecessary charges and the control gate 208 for controlling the discharge of the charges are provided. Due to the progressing reduction in chip size and the progressing reduction in pixel size owing to increasing pixel density, it is inevitable to desire to provide the sweep-out drain 207A in a narrow area between the vertical transfer registers 203 and the horizontal transfer register 204. This is very difficult. In the case where the sweep-out drain 107 is provided adjacent to the horizontal transfer register 104, no problem is caused by the reduction in the pixel size since there is still a sufficient space adjacent to the horizontal transfer register 104. However, in this case, the discharge operation of the charges is performed at a time, unnecessary data in the horizontal direction cannot be selectively removed.

In order to perform the method of adding the signals of the some color which are adjacent in the horizontal direction with the conventional data removal methods, it is necessary to control the signal read from the vertical transfer registers to the horizontal transfer register column by column, such that there in a delay in the time to read the signals.

However, Japanese Laid-Open Publication No. 11-54741 only shows a structure for providing a time difference between times at which data is read from different vertical transfer registers. In addition, the solid-state imaging device disclosed in this publication requires a three-layer electrode, which complicates the production process. Japanese Laid-Open Publication No. 2000-115643 only shows a structure for providing a time difference between times at which data is read from different vertical transfer registers. In addition, in the solid-state imaging device disclosed in this publication, the number of phases of the two-layer electrode forming each vertical transfer register is different column by column. Therefore, the structure of the solid-state imaging device is complicated.

SUMMARY OF THE INVENTION

According to one aspect of the invention, a solid-state imaging device includes a plurality of light receiving sections provided in a matrix in a plurality of rows and a plurality columns, each of the plurality of light receiving sections generating a charge in accordance with the amount of light received; a pixel area vertical transfer register section for transferring, column by column, the charges generated by the plurality of light receiving sections in a vertical direction; a dummy area vertical transfer register section for transferring, column by column in the vertical direction, the charges which have been transferred by the pixel area vertical transfer register section, the dummy area vertical transfer register section providing a control such that the transfer of the charges of at least one of the plurality of columns is performed in the same manner as the charges in the other columns in one case, and in a different manner from the transfer of the charges in the other columns in another case; and a horizontal transfer register section for transferring, in a horizontal direction, the charges which have been transferred from the dummy area vertical transfer register section.

In one embodiment of the invention, the dummy area vertical transfer register section includes a plurality of dummy area vertical transfer registers, each of which transfers, in the vertical direction, the charges in a corresponding column among the plurality of columns, the charges having been transferred by the pixel area vertical transfer register section; and a dummy area transfer control section for controlling the plurality of dummy area vertical transfer registers, such that the transfer of the charges by at least one of the plurality of dummy area vertical transfer register is performed in the same manner as the transfer of the charges by the other dummy area vertical transfer registers in one case, and in a different manner from the transfer of the charges by the other dummy area vertical transfer registers in another case.

In one embodiment of the invention, the dummy area vertical transfer register section includes a dummy area transfer electrode. The dummy area transfer control section supplies the dummy area transfer electrode with a signal for allowing the plurality of dummy area vertical transfer registers to transfer the charges.

In one embodiment of the invention, the pixel area vertical transfer register section includes a plurality of pixel area vertical transfer registers, each of which transfers, in the vertical direction, the charges in a corresponding column among the plurality of columns; and a pixel area transfer control section for controlling the plurality of pixel area vertical transfer registers.

In one embodiment of the invention, the pixel area vertical transfer register section includes a pixel area transfer electrode. The pixel area transfer control section supplies the pixel area transfer electrode with a signal for allowing the plurality of pixel area vertical transfer registers to transfer the charges.

In one embodiment of the invention, the solid-state imaging device further includes a control section including the pixel area transfer control section and the dummy area transfer control section.

In one embodiment of the invention, the solid-state imaging device further includes a sweep-out drain section for discharging the charges of the horizontal transfer register section.

In one embodiment of the invention, the pixel area transfer electrode includes a plurality of first layer transfer electrodes and a plurality of second layer transfer electrodes in a pixel area. The dummy area transfer electrode includes a plurality of first layer transfer electrodes and a plurality of second layer transfer electrodes in a dummy area.

In one embodiment of the invention, the pixel area vertical transfer register section and the dummy area vertical transfer register section each transfer the charges in the vertical direction by n-phase driving, with n number of transfer electrodes being treated as one set (wherein n=2k; k is an integer of 2 or greater).

In one embodiment of the invention, the dummy area includes a first dummy area and a second dummy area. In the first dummy area, a plurality of first dummy area first layer transfer electrodes among the plurality of first layer transfer electrodes and a plurality of first dummy area second layer transfer electrodes among the plurality of second layer transfer electrodes are provided alternately in the vertical direction. The plurality of first dummy area first layer transfer electrodes are the plurality of first dummy area second layer transfer electrodes transfer the charges, transferred by the pixel area vertical transfer register section, by n-phase driving in the vertical direction, with n number of transfer electrodes being treated as one set. In the second dummy area, a plurality of second dummy area first layer transfer electrodes among the plurality of first layer transfer electrodes and a plurality of second dummy area second layer transfer electrodes among the plurality of second layer transfer electrodes are provided alternately in the vertical direction; one of the plurality of second dummy area first layer transfer electrodes, and one of the plurality of first dummy area first layer transfer electrodes, which correspond to each other are supplied with a transfer control signal at the same timing; one of the plurality of second dummy area second layer transfer electrodes, and one of the plurality of first dummy area second layer transfer electrodes, which correspond to each other are supplied with a transfer control signal at different timings; and the plurality of second dummy area first layer transfer electrodes and the plurality of second dummy area second layer transfer electrodes transfer the charges, transferred by the pixel area vertical transfer register section, by n-phase driving in the vertical direction, with n number of transfer electrodes being treated as one set.

In one embodiment of the invention, the number of the plurality of first dummy area first layer transfer electrodes is equal to the number of the plurality of second dummy area first layer transfer electrodes. The number of the plurality of first dummy area second layer transfer electrodes is equal to the number of the plurality of second dummy area second layer transfer electrodes.

In one embodiment of the invention, patterns of the plurality of first layer transfer electrodes of the dummy area transfer electrode are the same. Patterns of the plurality of second layer transfer electrodes of the dummy area transfer electrode are different in units of a plurality of second layer transfer electrodes.

In one embodiment of the invention, the dummy area further includes a third dummy area provided between the first dummy area and the second dummy area. The first dummy area includes a first dummy section and a second dummy section provided in the vertical direction; and in each of the first dummy section and the second dummy section, a plurality of first dummy area first layer transfer electrodes among the plurality of first layer transfer electrodes and a plurality of first dummy area second layer transfer electrodes among the plurality of second layer transfer electrode are alternately provided, wherein the plurality of first dummy area first layer transfer electrodes and the plurality of first dummy area second layer transfer electrodes total n. The second dummy area includes a first dummy section and a second dummy section provided in the vertical direction; and in each of the first dummy section and the second dummy section, a plurality of second dummy area first layer transfer electrodes among the plurality of first layer transfer electrodes and a plurality of second dummy area second layer transfer electrodes among the plurality of second layer transfer electrode are alternately provided, wherein the plurality of second dummy area first layer transfer electrodes and the plurality of second dummy area second layer transfer electrodes total n. The third dummy area includes a first dummy section and a second dummy section provided in the vertical direction; and in each of the first dummy section and the second dummy section, a plurality of third dummy area first layer transfer electrodes among the plurality of first layer transfer electrodes and a plurality of third dummy area second layer transfer electrodes among the plurality of second layer transfer electrode are alternately provided, wherein the plurality of third dummy area first layer transfer electrodes and the plurality of third dummy area second layer transfer electrodes total n. One of the plurality of third dummy area first layer transfer electrodes, one of the plurality of first dummy area first layer transfer electrodes, and one of the plurality of second dummy area first layer transfer electrodes, which correspond to each other are supplied with a transfer control signal at the same timing. One of the plurality of third dummy area second layer transfer electrodes in the first dummy section, and one of the plurality of first dummy area second layer transfer electrodes, which correspond to each other are provided with a transfer control signal at different timings. One of the plurality of third dummy area second layer transfer electrodes in the second dummy section, and one of the plurality of second dummy area second layer transfer electrodes, which correspond to each other are provided with a transfer control signal at different timings. The plurality of third any area first layer transfer electrodes and the plurality of third dummy area second layer transfer electrodes transfers the charges, transferred from the pixel area vertical transfer register section, by n-phase driving in the vertical direction.

In one embodiment of the invention, one of n-phase transfer electrodes in the first dummy area, and one of n-phase transfer electrodes in the pixel area, which correspond to each other are commonly connected.

In one embodiment of the invention, in the pixel area, the plurality of first layer transfer electrodes and the plurality of second layer transfer electrodes are provided alternately in the vertical direction; and the plurality of first layer transfer electrodes and the plurality of second layer transfer electrodes transfer the charges generated by the plurality of light receiving sections in the vertical direction, by m-phase driving, with m number of transfer electrodes being treated as one set (m=2j, j is an integer of 3 or greater). The dummy area includes a first dummy area and a second dummy area; the first dummy area includes a first dummy section and a second dummy section; and the second dummy area includes a first dummy section and a second dummy section. In the first dummy section in the first dummy area, a plurality of first dummy area first layer transfer electrodes among the plurality of first layer transfer electrodes and a plurality of first dummy area second layer transfer electrodes among the plurality of second layer transfer electrodes are alternately provided in the vertical direction, wherein the plurality of first dummy area first layer transfer electrodes and the plurality of first dummy area second layer transfer electrodes total m/2; and the plurality of first dummy area first layer transfer electrodes and the plurality of first dummy area second layer transfer electrodes transfer the charges, transferred by the pixel area vertical transfer register section, by m/2-phase driving in the vertical direction. In the second dummy section in the first dummy area, two first dummy area transfer electrodes are provided, and are supplied with a transfer control signal at a different timing from the pixel area transfer electrodes corresponding to the pixel area. In the first dummy section in the second dummy area, a plurality of second dummy area first layer transfer electrodes among the plurality of first layer transfer electrodes and a plurality of second dummy area second layer transfer electrodes among the plurality of second layer transfer electrodes are alternately provided in the vertical direction, wherein the plurality of second dummy area first layer transfer electrodes and the plurality of second dummy area second layer transfer electrodes total m/2; one of the plurality of second dummy area first layer transfer electrodes, and one of the plurality of first dummy area first layer transfer electrodes, which correspond to each other are supplied with a transfer control signal at the same timing; one of the second dummy area second layer transfer electrodes, and one of the first dummy area second layer transfer electrodes, which correspond to each other are supplied with a transfer control signal at different timings; and the first dummy section in the second dummy area transfers, by m/2-phase driving in the vertical direction, the charges transferred by the pixel area vertical transfer register section, with m/2 number of transfer electrodes being treated as one set. In the second dummy section in the second dummy area, two second dummy area transfer electrodes are provided, and are supplied with a transfer control signal at a different timing from the pixel area vertical transfer electrodes corresponding to the pixel area; the second dummy area first layer transfer electrode among the two transfer electrodes, and one of the first dummy area first layer transfer electrodes, which correspond to each other are supplied with a transfer control signal at the same timing; and the second dummy area second layer transfer electrode among the two transfer electrodes, and one of the first dummy area second layer transfer electrodes, which correspond to each other are supplied with a transfer control signal at different timings.

In one embodiment of the invention, patterns of the plurality of first layer transfer electrodes of the dummy area transfer electrode are the same. Patterns of the plurality of second layer transfer electrodes of the dummy area transfer electrode are different in units of a plurality of second layer transfer electrodes.

In one embodiment of the invention, the solid-state imaging device is produced using a multiple layer gate process using three or more layers.

According to another aspect of the invention, a method for driving a solid-state imaging device includes a generation step of generating a charge by a plurality of light receiving sections, provided in a matrix in a plurality of rows and a plurality of columns, in accordance with the amount of light received by the plurality of light receiving sections; a first transfer step of transferring, by a pixel area vertical transfer register section, the charges generated by the plurality of light receiving sections, column by column in a vertical direction; a second transfer step of transferring, by a dummy area vertical transfer register section, the charges transferred by the pixel area vertical transfer register section, column by column in the vertical direction, the dummy area vertical transfer register section providing a control such that the transfer of the charges of at least one of the plurality of columns is performed in the same manner as the charges in the other columns in one case, and in a different manner from the transfer of the charges in the other columns in another case; and a third transfer step of transferring, by a horizontal transfer register section, the charges transferred by the dummy area vertical transfer register section, in a horizontal direction.

In one embodiment of the invention, the pixel area vertical transfer register section and the dummy area vertical transfer register section each transfer the charges in the vertical direction by n-phase driving, with n number of transfer electrodes being treated as one set (wherein n=2k; k is an integer of 2 or greater). A dummy area includes a first dummy area and a second dummy area. In the first dummy area, a plurality of first dummy area first layer transfer electrodes among a plurality of first layer transfer electrodes and a plurality of first dummy area second layer transfer electrodes among a plurality of second layer transfer electrodes are provided alternately in the vertical direction. The plurality of first dummy area first layer transfer electrodes and the plurality of first dummy area second layer transfer electrodes transfer the charges, transferred by the pixel area vertical transfer register section, by n-phase driving in the vertical direction, with n number of transfer electrodes being treated as one set. In the second dummy area, a plurality of second dummy area first layer transfer electrodes among the plurality of first layer transfer electrodes and a plurality of second dummy area second layer transfer electrodes among the plurality of second layer transfer electrodes are provided alternately in the vertical direction; one of the plurality of second dummy area first layer transfer electrodes and one of the plurality of first dummy area first layer transfer electrodes, which correspond to each other are supplied with a transfer control signal at the same timing; one of the plurality of second dummy area second layer transfer electrodes, and one of the plurality of first dummy area second layer transfer electrodes, which correspond to each other are supplied with a transfer control signal at different timings; and the plurality of second dummy area first layer transfer electrodes and the plurality of second dummy area second layer transfer electrodes transfer the charges, transferred by the pixel area vertical transfer register section, by n-phase driving in the vertical direction, with n number of transfer electrodes being treated as one set. The second transfer step comprising the step of, while one of the first dummy area and the second dummy area is driven by n-phase driving to transfer the charges, setting a second layer transfer electrode which is closest to the horizontal transfer register section among the plurality of second layer transfer electrodes in the other of the first dummy area and the second dummy area to a low level, and setting the remaining second layer transfer electrodes to a high level, such that the other of the first dummy area and the second dummy area holds the charges.

In one embodiment of the invention, the pixel area vertical transfer register section and the dummy area vertical transfer register section each transfer the charges in the vertical direction by n-phase driving, with n number of transfer electrodes being treated as one set (wherein n=2k ; k is an integer of 2 or greater). A dummy area includes a first dummy area and a second dummy area. In the first dummy area, a plurality of first dummy area first layer transfer electrodes among a plurality of first layer transfer electrodes and a plurality of first dummy area second layer transfer electrodes among a plurality of second layer transfer electrodes are provided alternately in the vertical direction. The plurality of first dummy area first layer transfer electrodes and the plurality of first dummy area second layer transfer electrodes transfer the charges, transferred by the pixel area vertical transfer register section, by n-phase driving in the vertical direction, with n number of transfer electrodes being treated as one set. In the second dummy area, a plurality of second dummy area first layer transfer electrodes among the plurality of first layer transfer electrodes and a plurality of second dummy area second layer transfer electrodes among the plurality of second layer transfer electrodes are provided alternately in the vertical direction; one of the plurality of second dummy area first layer transfer electrodes, and one of the plurality of first dummy area first layer transfer electrodes, which correspond to each other are supplied with a transfer control signal at the same timing; one of the plurality of second dummy area second layer transfer electrodes, and one of the plurality of first dummy area second layer transfer electrodes, which correspond to each other are supplied with a transfer control signal at different timings; and the plurality of second dummy area first layer transfer electrodes and the plurality of second dummy area second layer transfer electrodes transfer the charges, transferred by the pixel area vertical transfer register section, by n-phase driving in the vertical direction, with n number of transfer electrodes being treated as one set. The dummy area further includes a third dummy provided between the first dummy area and the second dummy area. The first dummy area includes a first dummy section and a second dummy section provided in the vertical direction; and in each of the first dummy section and the second dummy section, a plurality of first dummy area first layer transfer electrodes among the plurality of first layer transfer electrodes and a plurality of first dummy area second layer transfer electrodes among the plurality of second layer transfer electrode are alternately provided, wherein the plurality of first dummy area first layer transfer electrodes and the plurality of first dummy area second layer transfer electrodes total n. The second dummy area includes a first dummy section and a second dummy section provided in the vertical direction; and in each of the first dummy section and the second dummy section, a plurality of second dummy area first layer transfer electrodes among the plurality of first layer transfer electrodes and a plurality of second dummy area second layer transfer electrodes among the plurality of second layer transfer electrode are alternately provided, wherein the plurality of second dummy area first layer transfer electrodes and the plurality of second dummy area second layer transfer electrodes total n. The third dummy area includes a first dummy section and a second dummy section provided in the vertical direction; and in each of the first dummy section and the second dummy section, a plurality of third dummy area first layer transfer electrodes among the plurality of first layer transfer electrodes and a plurality of third dummy area second layer transfer electrodes among the plurality of second layer transfer electrode are alternately provided, wherein the plurality of third dummy area first layer transfer electrodes and the plurality of third dummy area second layer transfer electrodes total n. One of the plurality of third dummy area first layer transfer electrodes, one of the plurality of first dummy area first layer transfer electrodes, and one of the plurality of second dummy area first layer transfer electrodes, which correspond to each other are supplied with a transfer control signal at the same timing. One of the plurality of third dummy area second layer transfer electrodes in the first dummy section, and one of the plurality of first dummy area second layer transfer electrodes, which correspond to each other are provided with a transfer control signal at different timings. One of the plurality of third dummy area second layer transfer electrodes in the second dummy section, and one of the plurality of second dummy area second layer transfer electrodes, which correspond to each other are provided with a transfer control signal at different timings. The plurality of third dummy area first layer transfer electrodes and the plurality of third dummy area second layer transfer electrodes transfers the charges, transferred from the pixel area vertical transfer register section, by n-phase driving in the vertical direction. The second transfer step comprising the stop of, while one of the first dummy area, the second dummy area and the third dummy area is driven by n-phase driving to transfer the charges, setting a second layer transfer electrode which is closest to the horizontal transfer register section among the plurality of second layer transfer electrodes in the first dummy section and the second dummy section in the remaining areas of the first dummy area, the second dummy area and the third dummy area to a low level, and setting the remaining second layer transfer electrodes to a high level, such that the remaining areas of the first dummy area, the second dummy area and the third dummy area hold the charges.

In one embodiment of the invention, one of a plurality of first layer transfer electrodes in the pixel area vertical transfer register section, and one of the plurality of first layer transfer electrodes in the dummy area vertical transfer register section, which correspond to each other are commonly connected. The second transfer step includes the step of supplying the one of the plurality of first layer transfer electrodes in the dummy area vertical transfer register section with a transfer control signal at the same timing as supplying the one of the plurality of first layer transfer electrodes in the pixel area vertical transfer register section in the first transfer step.

In one embodiment of the invention, in a pixel area, a plurality of first layer transfer electrodes and a plurality of second layer transfer electrodes are provided alternately in the vertical direction; and the plurality of first layer transfer electrodes and the plurality of second layer transfer electrodes transfer the charges generated by the plurality of light receiving sections in the vertical direction, by m-phase driving, with m number of transfer electrodes being treated as one set (m=2j, j is an integer of 3 or greater). A dummy area includes a first dummy area and a second dummy area; the first dummy area includes a first dummy section and a second dummy section; and the second dummy area includes a first dummy section and a second dummy section. In the first dummy section in the first dummy area, a plurality of first dummy area first layer transfer electrodes among a plurality of first layer transfer electrodes and a plurality of first dummy area second layer transfer electrodes among a plurality of second layer transfer electrodes are alternately provided in the vertical direction, wherein the plurality of first dummy area first layer transfer electrodes and the plurality of first dummy area second layer transfer electrodes total m/2; and the plurality of first dummy area first layer transfer electrodes and the plurality of first dummy area second layer transfer electrodes transfer the charges, transferred by the pixel area vertical transfer register section, by m/2-phase driving in the vertical direction. In the second dummy section in the first dummy area, two first dummy area transfer electrodes are provided, and are supplied with a transfer control signal at a different timing from pixel area transfer electrodes corresponding to the pixel area. In the first dummy section in the second dummy area, a plurality of second dummy area first layer transfer electrodes among the plurality of first layer transfer electrodes and a plurality of second dummy area second layer transfer electrodes among the plurality of second layer transfer electrodes are alternately provided in the vertical direction, wherein the plurality of second dummy area first layer transfer electrodes and the plurality of second dummy area second layer transfer electrodes total m/2; one of the plurality of second dummy area first layer transfer electrodes, and one of the plurality of first dummy area first layer transfer electrodes, which correspond to each other are supplied with a transfer control signal at the same timing; one of the second dummy area second layer transfer electrodes, and one of the first dummy area second layer transfer electrodes, which correspond to each other are supplied with a transfer control signal at different timings; and the first dummy section in the second dummy area transfers, by m/2-phase driving in the vertical direction, the charges transferred by the pixel area vertical transfer register section, with m/2 number of transfer electrodes being treated as one set. In the second dummy section in the second dummy area, two second dummy area transfer electrodes are provided, and are supplied with a transfer control signal at a different timing from the pixel area vertical transfer electrodes corresponding to the pixel area; the second dummy area first layer transfer electrode among the two transfer electrodes, and one of the first dummy area first layer transfer electrodes, which correspond to each other are supplied with a transfer control signal at the same timing; and the second dummy area second layer transfer electrode among the two transfer electrodes, and one of the first dummy area second layer transfer electrode, which correspond to each other are supplied with a transfer control signal at different timings. The second transfer step comprising the step of, while the first dummy section in one of the first dummy area and the second dummy area is driven by m/2-phase driving to transfer the charges, setting a second layer transfer electrode which is closest to the horizontal transfer register section among the plurality of second layer transfer electrodes in the other of the first dummy area and the second dummy area to a low level, setting the remaining second layer transfer electrodes to a high level, and setting at least one transfer electrode in the second dummy section in each of the first dummy area and the second dummy area to a low level, such that the other of the first dummy area and the second dummy area holds the charges.

According to the present invention, a dummy area vertical transfer register section is provided between the pixel area vertical transfer register section and the horizontal transfer register. In the dummy area vertical transfer register section, two layers of transfer electrodes are provided alternately in the vertical direction. The signal charges are transferred in the vertical direction by n-phase driving, with n number of transfer electrodes (n=2k, k is an integer of 2 or greater) being treated as one set.

In the dummy area vertical transfer register section, corresponding second layer transfer electrodes in different areas can be supplied with a clock signal as a control signal at different timings, with n number of transfer electrodes being treated as one set.

For example, in each of the first dummy area and the second dummy area, n number of transfer electrodes are provided. Corresponding first layer transfer electrodes in the first dummy area and the second dummy area are provided so as to be supplied with a control signal at the same timing, and corresponding second layer transfer electrodes in the first dummy area and the second dummy area are provided so as to be supplied with a control signal at different timings.

The first dummy areas, the second dummy area and the third dummy area each have a first dummy section and a second dummy section. In each of the first dummy section and the second dummy section, n number of transfer electrodes are provided. A first layer transfer electrode in the third dummy area may be supplied with a control signal at the same timing as the corresponding first layer transfer electrode in each of the first dummy and the second dummy area. A second layer transfer electrode in the first dummy section in the third dummy area may be supplied with a control signal at a different timing from the corresponding second layer transfer electrode in the first dummy area. A second layer transfer electrode in the second dummy section in the third dummy area may be supplied with a control signal at a different timing from the corresponding second layer transfer electrode in the second dummy area.

By controlling the timing of the clock signal used as a control signal applied to the second layer transfer electrode, the transfer of the signal charges from the vertical transfer registers to the horizontal transfer register can be controlled register by register. For example, while a dummy area from which the signal charges are to be transferred is operated by n-phase driving, a second layer transfer electrode which is closest to the horizontal transfer register among the second layer transfer electrodes in the dummy area holding the signal charges is fixed to a low level. The remaining second layer transfer electrodes are fixed to a high level. Thus, the signal charges are held in an area between the transfer electrodes set to the low level. Accordingly, there can be made a time difference between times at which data is read from different vertical transfer registers. Thus, the signals can be read in a divided manner, i.e. in a plurality of stages.

Moreover, a first layer transfer electrode in the dummy area and a first layer transfer electrode in the pixel area may be supplied with a control signal at the same timing. Alternatively, one of the n-phase transfer electrodes in the dummy area, and one of the n-phase transfer electrodes in the pixel area, which correspond to each other can be commonly connected. In this manner, the number of terminals can be reduced.

In another aspect of the invention, a dummy area vertical transfer register section is provided between the pixel area vertical transfer register section and the horizontal transfer register. The dummy area includes a first dummy section and a second dummy section. In the first dummy section, two layers of transfer electrodes are provided alternately in the vertical direction. The signal charges are transferred in the vertical direction by m/2-phase driving, with m/2 number of transfer electrodes (m=2j, j is an integer of 3 or greater) being treated as one sot. In the second dummy section, two transfer electrodes are provided.

In the dummy area vertical transfer register section, corresponding second layer transfer electrodes can be supplied with a clock signal as a control signal at different timings, with (m/2)+2 number of transfer electrodes being treated as one set.

For example, in the first dummy section in which m/2 transfer electrode are provided, corresponding first layer transfer electrodes in the first dummy area and the second dummy area are provided so as to be supplied with a control signal at the same timing, and corresponding second layer transfer electrodes in the first dummy area and the second dummy area are provided so as to be supplied with a control signal at different timings. In the second dummy section in which two transfer electrode are provided, the two transfer electrodes are provided so as to be supplied with a control signal at a different timing from the pixel area transfer electrodes corresponding to the pixel area. Corresponding first layer transfer electrodes in the first dummy area and the second dummy area are provided so as to be supplied with a control signal at the same timing. Corresponding second layer transfer electrodes in the first dummy area and the second dummy area are provided so as to be supplied with a control signal at different timings.

In order to provide the structure in which corresponding first layer transfer electrodes are supplied with a control signal at the same timing and corresponding second layer transfer electrodes are supplied with a control signal at different timings, the patterns of the first layer transfer electrodes in the dummy area vertical transfer register section are the same, and the patterns of the second layer transfer electrodes in the dummy area vertical transfer register section are different.

By controlling the timing of the clock signal used as a control signal applied to the second layer transfer electrode, the transfer of the signal charges from the vertical transfer registers to the horizontal transfer register can be controlled register by register. For example, while a first dummy section in a dummy area from which the signal charges are to be transferred is operated by m/2-phase driving, a second layer transfer electrode which is closest to the horizontal transfer register among the second layer transfer electrodes in the dummy area holding the signal charges is fixed to a low level. Among the remaining second layer transfer electrodes, at least a second layer transfer electrode closest to the horizontal transfer electrode is fixed to a high level. In the dummy section, at least one transfer register is fixed to a low level. Thus, the signal charges are held in an area between the transfer electrodes set to the low level. Accordingly, a time difference can be made between the times at which data is read from different vertical transfer registers. Thus, the signals can be read in a divided manner, i.e., in a plurality of stages.

According to the present invention, a dummy area in which only second layer transfer electrodes are supplied with a control signal at different timings is provided between the pixel area vertical transfer register section and the horizontal transfer register, using transfer electrodes with a simple structure. Thus, the driving timing is controlled. Owing to such a structure, the signal charges can be transferred from the vertical transfer registers to the horizontal transfer register with a time difference being made between times at which data is read from different vertical transfer registers. As a result, the signal charges which have been already read can be discharged from the sweep-out drain provided adjacent to the horizontal transfer register, and the subsequent signal charges are output. Thus, unnecessary data can be removed in the horizontal direction. With the same structure, signal charges can be transferred from the vertical transfer registers to the horizontal transfer register with no time difference being made.

After transferring, in the horizontal direction, the signal charges which have already been read, the subsequent signal charges are read. Thus, signals of the same color in the same row are added together. In this manner, unnecessary data in the horizontal direction can be removed. An a result, the data amount in the horizontal direction is removed, so as to improve the frame rate.

Thus the invention described herein makes possible the advantages of providing a solid-state imaging device for controlling signals read from vertical transfer registers to a horizontal transfer register column by column with a simple structure, and a method for driving the same.

These and other advantages of the present invention will become apparent to those skilled in the art upon reading and understanding the following detailed description with reference to the accompanying figures.

BRIEF DESCRIPTION OF THE DRAWINGS

FIG. 5A is a potential diagram illustrating the transfer states of signals corresponding to the A–A' registers for reading signals from the pixel area vertical transfer registers to the horizontal transfer register in a plurality of stages in the CCD image sensor shown in FIG. 1C;

FIG. 8B is a potential diagram illustrating the transfer states of signals corresponding to B–B' registers for collectively reading signals from the pixel area vertical transfer registers to the horizontal transfer register in the CCD image sensor shown in FIG. 6;

FIG. 9 in a waveform diagram illustrating the driving timing for reading signals from the pixel area vertical transfer registers to the horizontal transfer register in a plurality of stages in the CCD image sensor shown in FIG. 6;

FIG. 15A is a potential diagram illustrating the transfer states of signals corresponding to the A–A' registers for reading signals from the pixel area vertical transfer registers to the horizontal transfer register in a plurality of stages in the CCD image sensor shown in FIG. 11;

FIG. 15B is a potential diagram illustrating the transfer states of signals corresponding to the B–B' registers for reading signals from the pixel area vertical transfer registers to the horizontal transfer register in a plurality of stages in the CCD image sensor shown in FIG. 11;

FIG. 18B is a potential diagram illustrating the transfer states of signals corresponding to B–B' registers for collectively reading signals from the pixel area vertical transfer registers to the horizontal transfer register in the CCD image sensor shown in FIG. 16;

FIG. 20A is a potential diagram illustrating the transfer states of signals corresponding to the A–A' registers for reading signals from the pixel area vertical transfer registers to the horizontal transfer register in a plurality of stages in the CCD image sensor shown in FIG. 16;

FIG. 20B is a potential diagram illustrating the transfer states of signals corresponding to the B–B' registers for reading signals from the pixel area vertical transfer registers to the horizontal transfer register in a plurality of stages in the CCD image sensor shown in FIG. 16;

FIG. 22 is a schematic plan view illustrating a structure of another conventional CCD image sensor; and FIG. 23 illustrates a method for driving a conventional CCD image sensor.

DESCRIPTION OF THE PREFERRED EMBODIMENTS

Hereinafter, the present invention will be described by way of illustrative examples with reference to the accompanying drawings.

In the following examples, a solid-state imaging device according to the present invention will be applied to a CCD image sensor.

Figure 1A:
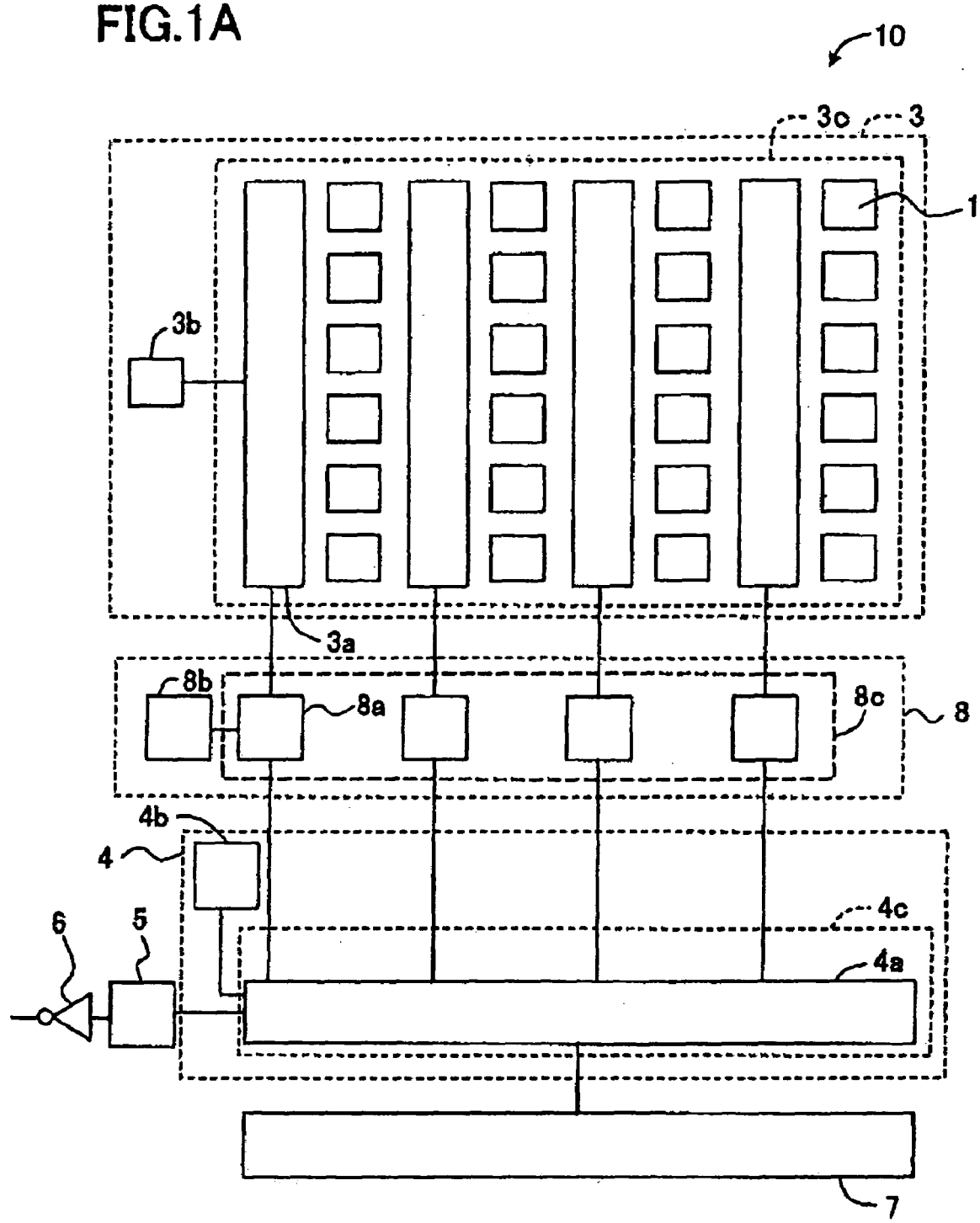
FIG. 1A is a plan view of a CCD image sensor according to an example of the present inventions.

FIG. 1A is a plan view of a CCD image sensor 10 according to an example of the present invention.

The CCD image sensor 10 includes a plurality of photodiodes 1 each acting as a light receiving section, a pixel area vertical transfer register section 3, a dummy area vertical transfer register section 8, and a horizontal transfer register section 4.

The CCD image sensor 10 further includes a charge detection section 5, an output amplifier 6, and a sweep-out drain 7.

The plurality of photodiodes 1 are arranged in a matrix, i.e., in a plurality of rows and a plurality of columns. One photodiode 1 corresponds to one pixel. Each of the photodiodes 1 generates an electric charge in correspondence with the amount of light received. In this specification, the electric charge is also referred to as the "signal charges". The signal charge represents data.

The pixel area vertical transfer register section 3 includes a plurality of pixel area vertical transfer registers 3a, a pixel area transfer electrode 3c, and a pixel area transfer control section 3b for outputting a vertical transfer control signal to the pixel area transfer electrode 3c so as to control the pixel area vertical transfer registers 3a.

The dummy area vertical transfer register section 8 includes a plurality of dummy area vertical transfer registers 8a, a dummy area transfer electrode 8c, and a dummy area transfer control section 8b for outputting a vertical transfer control signal to the dummy area transfer electrode 8c so as to control the dummy area vertical transfer registers 8a.

The horizontal transfer register section 4 includes a horizontal transfer register 4a, a horizontal transfer electrode 4c, and a horizontal transfer control section 4b for outputting a horizontal transfer control signal to the horizontal transfer electrode 4c so as to control the horizontal transfer register 4a.

The pixel area vertical transfer register section 3 transfers charges generated by each column of photodiodes 1 in a vertical direction.

The dummy area vertical transfer register section 8 can be controlled to either transfer charges generated by at least one column of photodiodes 1 which have been transferred by the pixel area vertical transfer register section 3 in the same manner as, or in a different manner from, the charges generated by the other columns of photodiodes 1.

The horizontal transfer register section 4 transfers the charges which have been transferred by the dummy area vertical transfer register section 8 in a horizontal direction.

The CCD image sensor 10 has three different control sections, i.e., the pixel area transfer control section 3b, the dummy area transfer control section 8b, and the horizontal transfer control section 4b. This is merely an example. Alternatively, the pixel area vertical transfer registers 3a, the dummy area vertical transfer registers 8a, and the horizontal transfer register 4a may be controlled by one control section having the functions of the above-mentioned three control sections.

Figure 1B:
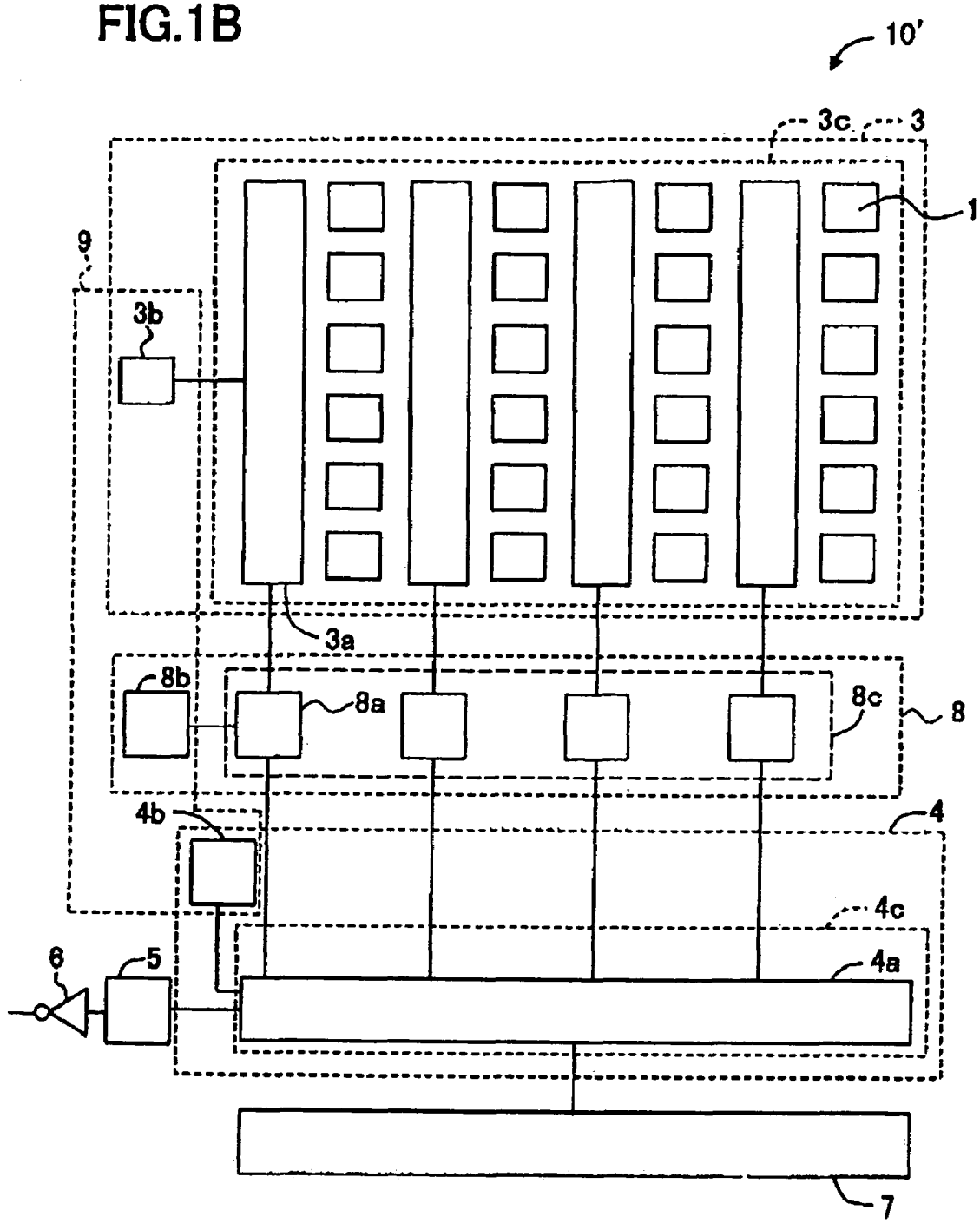
FIG. 1B in a plan view of a CCD image sensor as a modification of the CCD image sensor according to the present invention.

FIG. 1B is a plan view of a CCD image sensor 10' as a modification of the CCD image sensor 10 according to the present invention.

The CCD image sensor 10' has the same structure as that of the CCD image sensor 10 except that the control section 9 has the functions of the pixel area transfer control section 3b, the dummy area transfer control section 8b, and the horizontal transfer control section 4b.

As with the CCD image sensor 10', one control section 9 may control the pixel area vertical transfer registers 3a, the dummy area vertical transfer registers 8a, and the horizontal transfer register 4a.

EXAMPLE 1

Figure 1C:
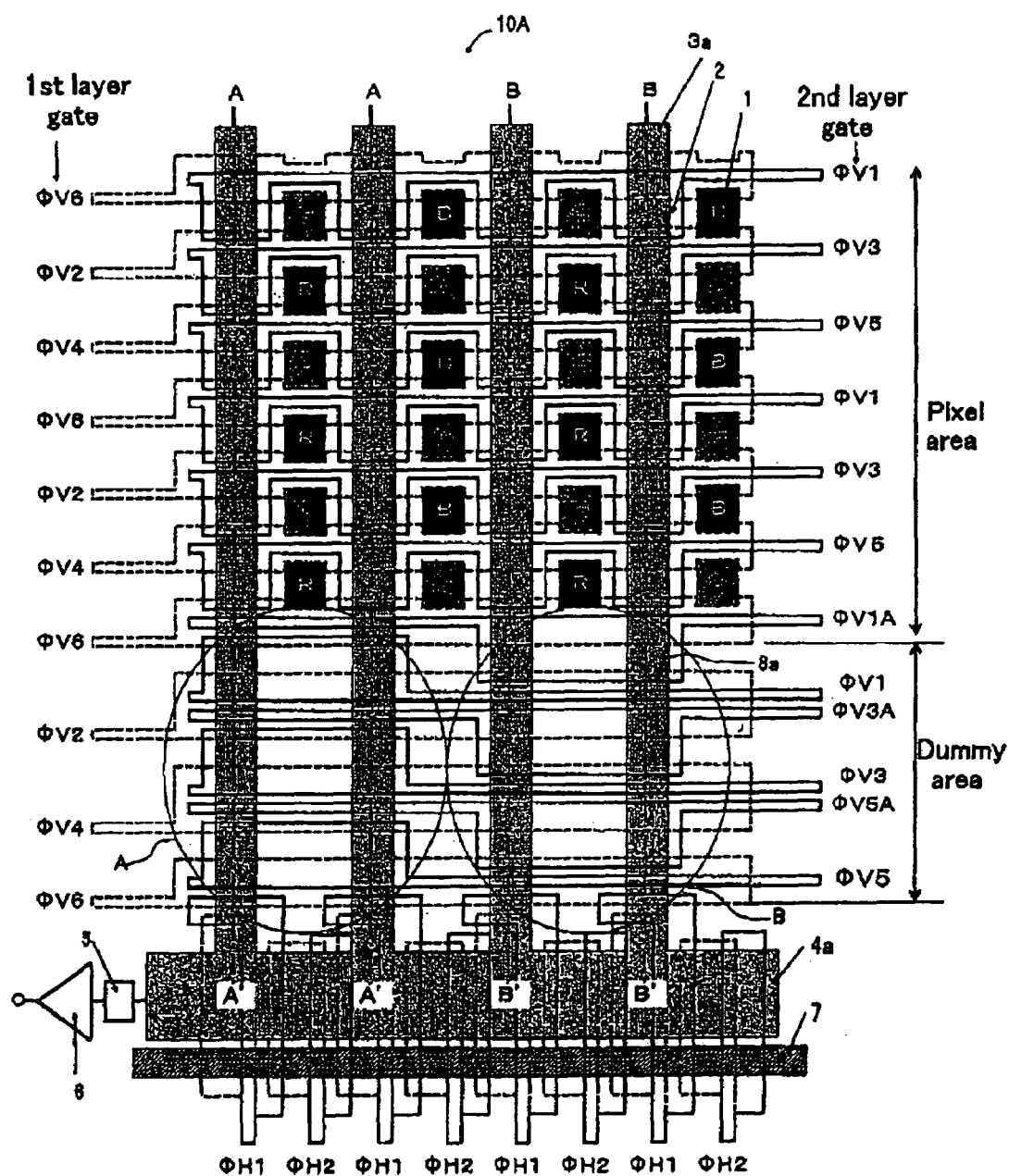
FIG. 1C is a schematic plan view illustrating a structure of a CCD image sensor according to a first example of the present invention.

FIG. 1C is a schematic plan view illustrating a structure of a CCD image sensor 10A according to a first example of the present invention. For the sake of simplicity, FIG. 1C omits the pixel area transfer control section 3b, the dummy area transfer control section 8b, and the horizontal transfer control section 4b (FIG. 1A). FIG. 1C also omits the control section 9 (FIG. 1B).

As Shown in FIG. 1C, the CCD image sensor 10A includes a plurality of photodiodes 1 (pixels) arranged in six rows and four columns.

As shown in FIG. 1C, the CCD image sensor 10A is an interline transfer type CCD image sensor having six-phase driving vertical transfer registers which are produced by a simple two-layer gate process.

The plurality of photodiodes 1 are arranged in a matrix (i.e., a plurality of rows and a plurality of columns, as described above), in the pixel area on a semiconductor substrate. A top view of each photodiode 1 is covered with a color filter of R, G or B. The R, G, and B color filters are arranged in the Bayer pattern.

One pixel area vertical transfer register 3a is provided in the vicinity of the corresponding column of photodiodes 1, and is connected to the corresponding photodiodes 1 via a corresponding transfer gate 2.

The CCD image sensor 10A has a pixel area and a dummy area as shown in FIG. 1C. The pixel area transfer electrode 3c (FIGS. 1A and 1B) is provided in the pixel area. The pixel area transfer electrode 3c includes first layer transfer electrodes $\phi V2$, $\phi V4$ and $\phi V6$, and second layer transfer electrodes $\phi V1$, $\phi V3$ and $\phi V5$. The first layer transfer electrodes $\phi V2$, $\phi V4$ and $\phi V6$, and second layer transfer electrodes $\phi V1$, $\phi V3$ and $\phi V5$, cross the plurality of pixel area vertical transfer registers 3a and are arranged alternately in the vertical direction. The first layer transfer electrodes $\phi V2$, $\phi V4$ and $\phi V6$ are also referred to as "first layer gates", and the second layer transfer electrodes $\phi V1$, $\phi V3$ and $\phi V5$ are also referred to as "second layer gates". These transfer electrodes are also referred to as "gates".

In the pixel area, n number of transfer electrodes are treated as one set (n=2k, k is an integer of 2 or greater; in this example, n=6, k=3). Signal charges which have been read from the photodiodes 1 are transferred in the vertical direction by n-phase driving. The gates $\phi V1$ through $\phi V6$ are supplied with a vertical transfer control signal from the pixel area transfer control section 3b (FIGS. 1A and 1B) at a general 6-phase driving timing. The signal charges are held by an accumulation section formed of four continuous gates and a barrier section formed of two gates provided so as to interpose the accumulation section therebetween.

In the monitoring mode, a read pulse is applied to the transfer gates 2, and the R, G and B color components are read from the photodiodes 1 to the vertical transfer registers 3a. Then, the vertical transfer control signals applied to the gates $\phi V1$ through $\phi V6$ are controlled, so that the signal charges are transferred in the vertical direction by the six-phase driving of the gates $\phi V1$ through $\phi V6$.

The dummy area is provided between the pixel area and the horizontal transfer register 4a. The dummy area transfer electrode 8c (FIGS. 1A and 1B) is provided in the dummy area. The dummy area transfer electrode 8c includes first layer transfer electrodes $\phi V2$, $\phi V4$ and $\phi V6$, and second layer transfer electrodes $\phi V1$, $\phi V1A$, $\phi V3$, $\phi V3A$, $\phi V5$ and $\phi V5A$. The first layer transfer electrodes $\phi V2$, $\phi V4$ and $\phi V6$, and second layer transfer electrodes $\phi V1$, $\phi V1A$, $\phi V3$, $\phi V3A$, $\phi V5$ and $\phi V5A$, cross the plurality of dummy area vertical transfer registers 8a. The first layer transfer electrodes φV2, φV4 and φV6 are also referred to as "first layer gates", and the second layer transfer electrodes φV1, φV1A, φV3, φV3A, φV5 and φV5A are also referred to as "second layer gates". These transfer electrodes are also referred to as "gates".

The gates φV1 and φV1A correspond to each other, gates φV3 and φV3A correspond to each other, and gates φV5 and φV5A correspond to each other.

The dummy area includes a first dummy area A and a second dummy area B. The first dummy area A corresponds to two A–A' registers (dummy area vertical transfer registers 8a), and the second dummy area B corresponds to two B–B' registers (dummy area vertical transfer registers 8a).

The first layer transfer electrodes φV2, φV4 and φV6 provided in the first dummy area A are also referred to as "first dummy area first layer transfer electrodes". The second layer transfer electrodes φV1, φV3 and φV5 provided in the first dummy area A are also referred to as "first dummy area second layer transfer electrodes".

The first layer transfer electrodes φV2, φV4 and φV6 provided in the second dummy area B are also referred to as "second dummy area first layer transfer electrodes". The second layer transfer electrodes φV1A, φV3A and φV5A provided in the second dummy area B are also referred to as "second dummy area second layer transfer electrodes".

In the first dummy area A, the gates are arranged in substantially the same manner as in the pixel area. The first layer transfer electrodes φV2, φV4 and φV6 and the second layer transfer electrodes φV1, φV3 and φV5 are alternately arranged in the vertical direction.

In the first dummy area A, n number of transfer electrodes are treated as one set (n=2k, k is an integer of 2 or greater, in this example, n=6, k=3). The signal charges from the pixel area are transferred in the vertical direction by n-phase driving. Corresponding gates of the gates φV1 through φV6 in the first dummy area A and the gates φV1 through φV6 in the pixel area are commonly connected, so as to receive the same clock signal as a vertical transfer control signal.

In the second dummy area B, the gates are arranged in a different manner from in the pixel area. The first layer transfer electrodes φV2, φV4 and φV6 and the second layer transfer electrodes φV1A, φV3A and φV5A are alternately arranged in the vertical direction.

In the second dummy area B, n number of transfer electrodes are treated as one set (n=2k, k is an integer of 2 or greater; in this example, n=6, k=3). The signal charges from the pixel area are transferred in the vertical direction by n-phase driving.

In the second dummy area B, the first layer transfer electrodes φV2, φV4 and φV6 have the same patterns an those of the first layer transfer electrodes φV2, φV4 and φV6 in the first dummy area A. Corresponding gates of the gates φV2, φV4 and φV6 in the second dummy area B and the gates φV2, φV4 and φV6 in the pixel area are commonly connected, so as to receive the same clock signal as a vertical transfer control signal, like in the first dummy area A.

In the second dummy area B, the second layer transfer electrodes φV1A, φV3A and φV5A have different patterns from those of the second layer transfer electrodes φV1, φV3 and φV5 in the first dummy area A.

Corresponding gates of the gates φV1A, φV3A and φV5A in the second dummy area B and the gates φV1, φV3 and φV5 in the pixel area are arranged so as to receive a different clock signal as a vertical transfer control signal.

The horizontal transfer register 4a is provided in a direction perpendicular to the pixel area vertical transfer registers 3a. First layer transfer electrodes φH1 and second layer transfer electrodes φH2 are provided alternately in the horizontal direction. The first layer transfer electrodes φH1 and the second layer transfer electrodes φH2 cross the horizontal transfer register 4a.

Two-phase horizontal transfer control signals given to the first layer transfer electrodes φH1 and the second layer transfer electrodes φH2 are controlled, so that the signal charges are transferred to the charge detection section 5 in the horizontal direction. The signal charges which have been transferred by the horizontal transfer register 4a are detected by the charge detection section 5 and then output from the output amplifier 6.

The sweep-out drain 7 is provided adjacent to the horizontal transfer register 4a. Unnecessary charges are swept out row by row and discharged by the sweep-out drain 7, so that unnecessary data in the column direction can be removed in addition to line data in the row direction.

An operation of the CCD image sensor 10A will be described, hereinafter. For the sake of simplicity, an operation of transferring the signal charges by the A–A' registers and the B–B' registers will be described.

First, an operation in the case where signals are collectively read from the pixel area vertical transfer registers 3a and the dummy area vertical transfer registers 8a to the horizontal transfer register 4a will be described. In this operation, the dummy area transfer control section 8b (FIG. 1A) or the control section 9 (FIG. 1B) controls the vertical transfer registers such that at least one of the registers transfers the signal charges in the same manner as the other registers in a certain case.

Figure 2:
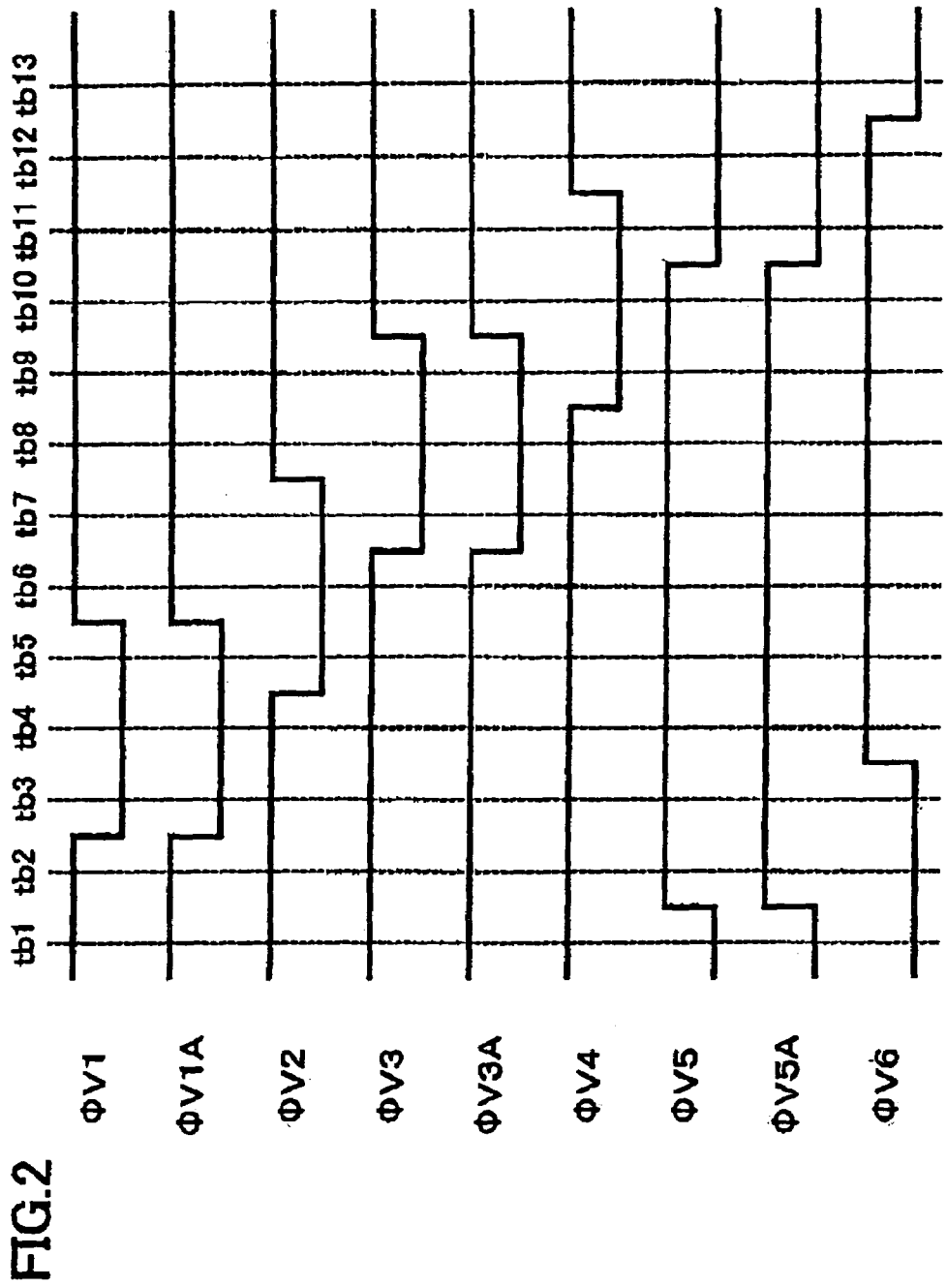
FIG. 2 is a waveform diagram illustrating the driving timing for collectively reading signals from pixel area vertical transfer registers to a horizontal transfer register in the CCD image sensor shown in FIG. 1C.

FIG. 2 is a waveform diagram illustrating the driving timing of the gates φV1 through φV6, φV1A, φV3A and φV5A in the case where signals are collectively read from the pixel area vertical transfer registers 3a and the dummy area vertical transfer registers 8a to the horizontal transfer register 4a.

Figure 3A:
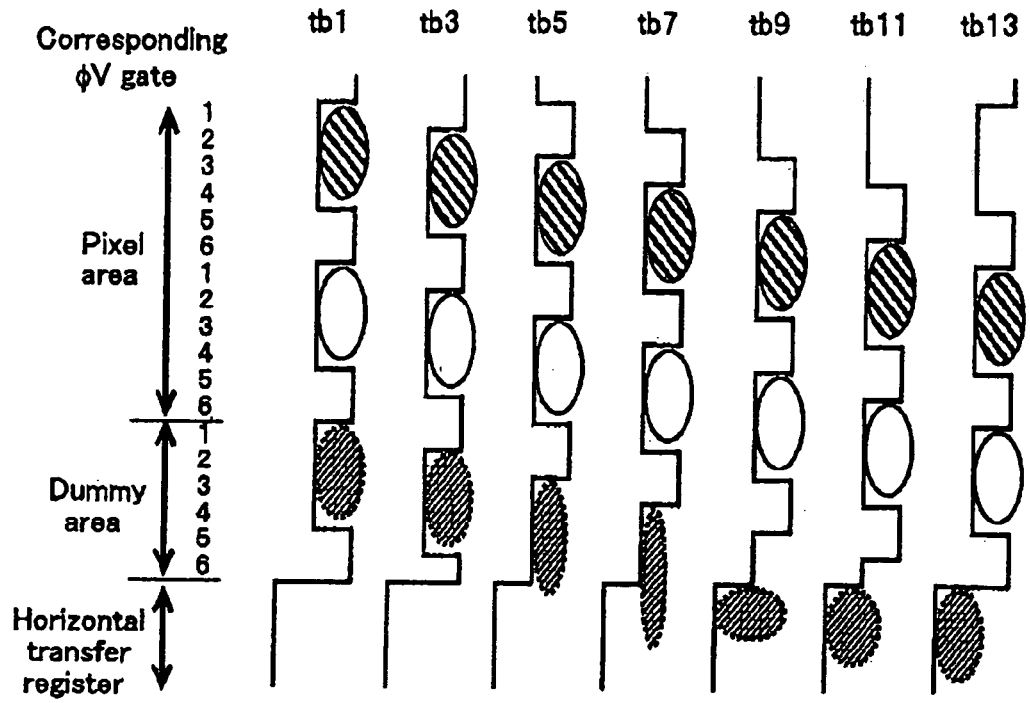
FIG. 3A is a potential diagram illustrating the transfer states of signals corresponding to A–A' registers for collectively reading signals from the pixel area vertical transfer registers to the horizontal transfer register in the CCD image sensor shown in FIG. 1C.
Figure 3B:
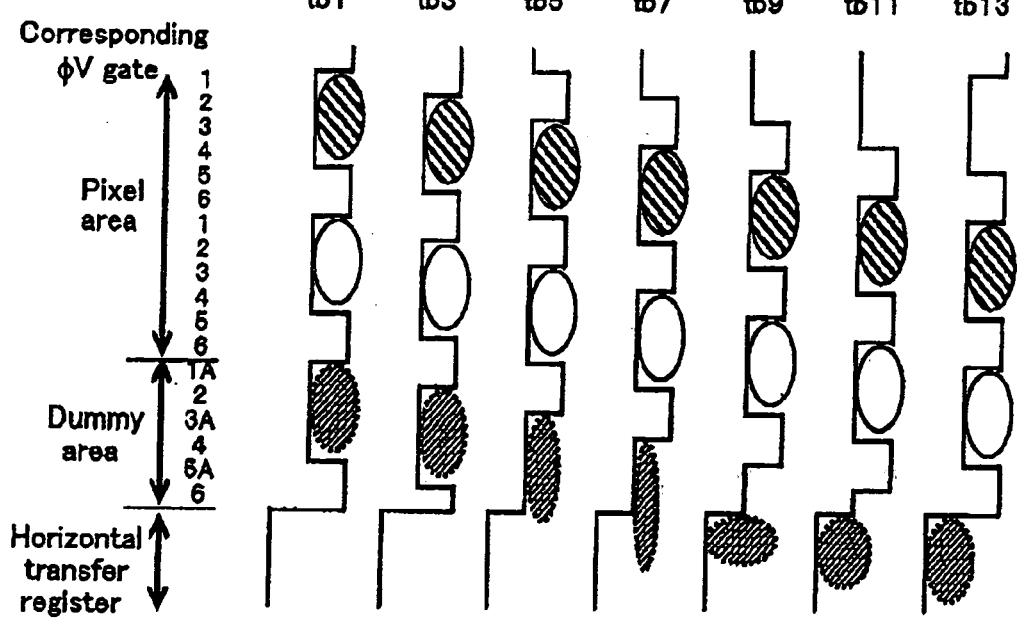
FIG. 3B is a potential diagram illustrating the transfer states of signals corresponding to B–B' registers for collectively reading signals from the pixel area vertical transfer registers to the horizontal transfer register in the CCD image sensor shown in FIG. 1C.

FIG. 3A is a potential diagram illustrating the transfer states of signals corresponding to time tb1 through time tb13 by the A–A' registers. FIG. 3B is a potential diagram illustrating the transfer states of signals corresponding to time tb1 through time tb13 by the B–B' registers. One transfer cycle of one step of vertical transfer register is from time tb1 to time tb13.

For collectively reading signals from the pixel area vertical transfer registers 3a and the dummy area vertical transfer registers 8a to the horizontal transfer register 4a, as shown in FIG. 2, the gates φV1A, φV3A and φV5A provided in the second dummy area B (the B–B' registers) are supplied with a clock signal at the same timing as the gates φV1, φV3 and φV5 provided in the pixel area and the first dummy area A (the A–A' registers), respectively. Thus, the signal charges are transferred at six-phase driving timing.

As shown in FIG. 3A, the A–A' registers sequentially transfer the signal charges in the pixel area at the six-phase driving timing by the gates φV1 through φV6 as shown in FIG. 2. In the first dummy area A also, the A–A' registers sequentially transfer the signal charges (as shown in FIG. 3A) at the six-phase driving timing by the gates φV1 through φV6 as shown in FIG. 2.

As shown in FIG. 3B, the B–B' registers sequentially transfer the signal charges in the pixel area at the six-phase driving timing by the gates φV1 through φV6 (FIG. 2). In the second dummy area B, the B–B' registers sequentially transfer the signal charges (FIG. 3B) at the six-phase driving timing by the gates φV1A, φV2, φV3A, φV4, φV5A and φV6 (FIG. 2).

Thus, as shown in FIGS. 3A and 3B, the A–A' registers and the B–B' registers operate at the same potential transition. The transfer of the signal charges from the pixel area vertical transfer registers 3a and the dummy area vertical transfer registers 8a to the horizontal transfer register 4a by the A–A' registers and the B–B' registers starts at time tb1 and completes at time tb13. If data of one row of photodiodes 1 is unnecessary, the unnecessary data is swept out and discharged by the sweep-out drain 7. Thus, unnecessary data can be removed.

Next, an operation in the case where signals are read from the pixel area vertical transfer registers 3a and the dummy area vertical transfer registers 8a to the horizontal transfer register 4a in two stages will be described. In this operation, the dummy area transfer control section 8b (FIG. 1A) or the control section 9 (FIG. 1B) controls the vertical transfer registers such that at least one of the registers transfers the signal charges in a different manner from the other registers in a certain case.

Figure 4:
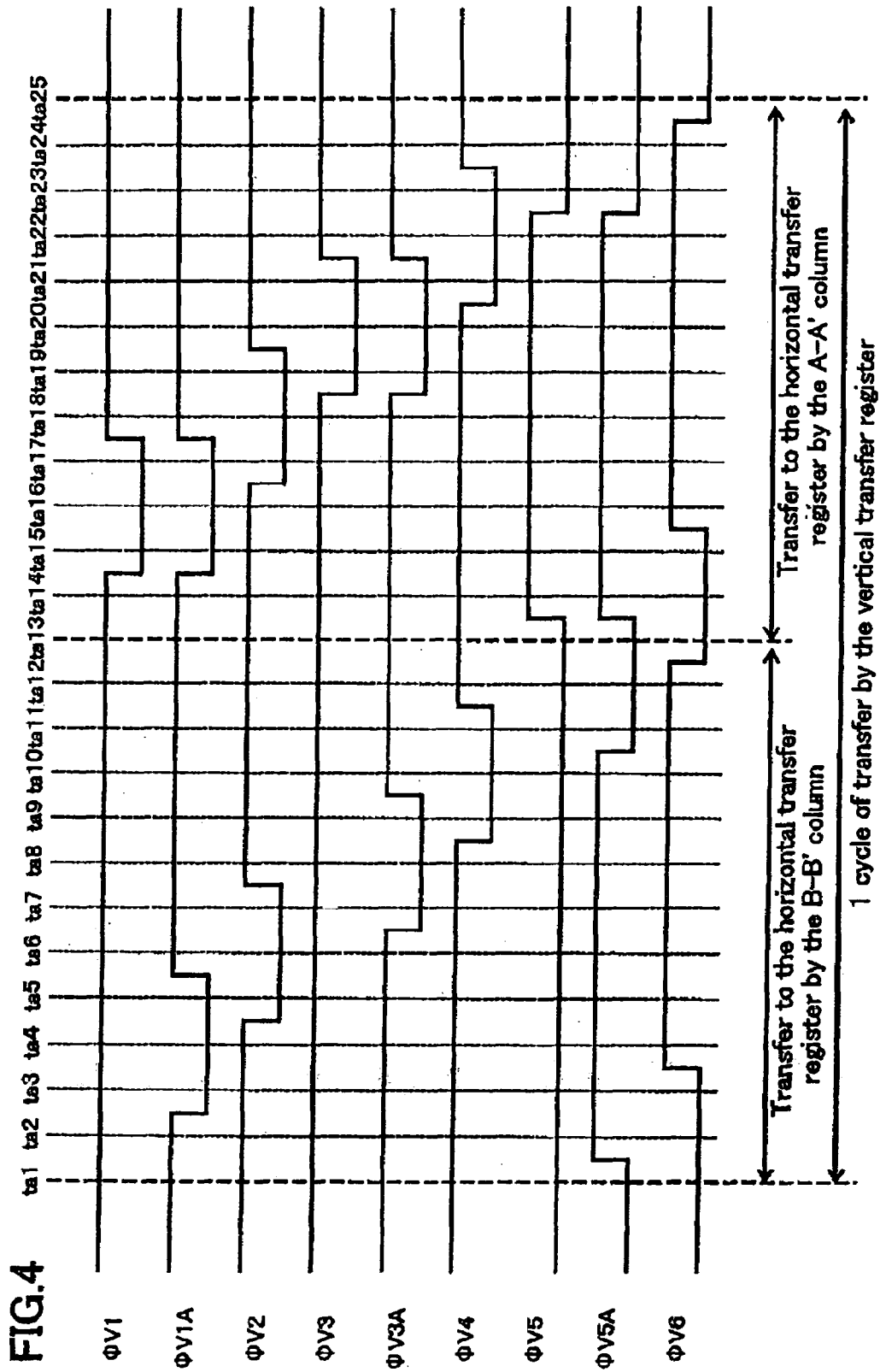
FIG. 4 is a waveform diagram illustrating the driving timing for reading signals from the pixel area vertical transfer registers to the horizontal transfer register in a plurality of stages in the CCD image sensor shown in FIG. 1C.

FIG. 4 is a waveform diagram illustrating the driving timing of the gates φV1 through φV6, φV1A, φV3A and φV5A in the case where signals are read from the pixel area vertical transfer registers 3a and the dummy area vertical transfer registers 8a to the horizontal transfer register 4a in two stages.

Figure 5B:
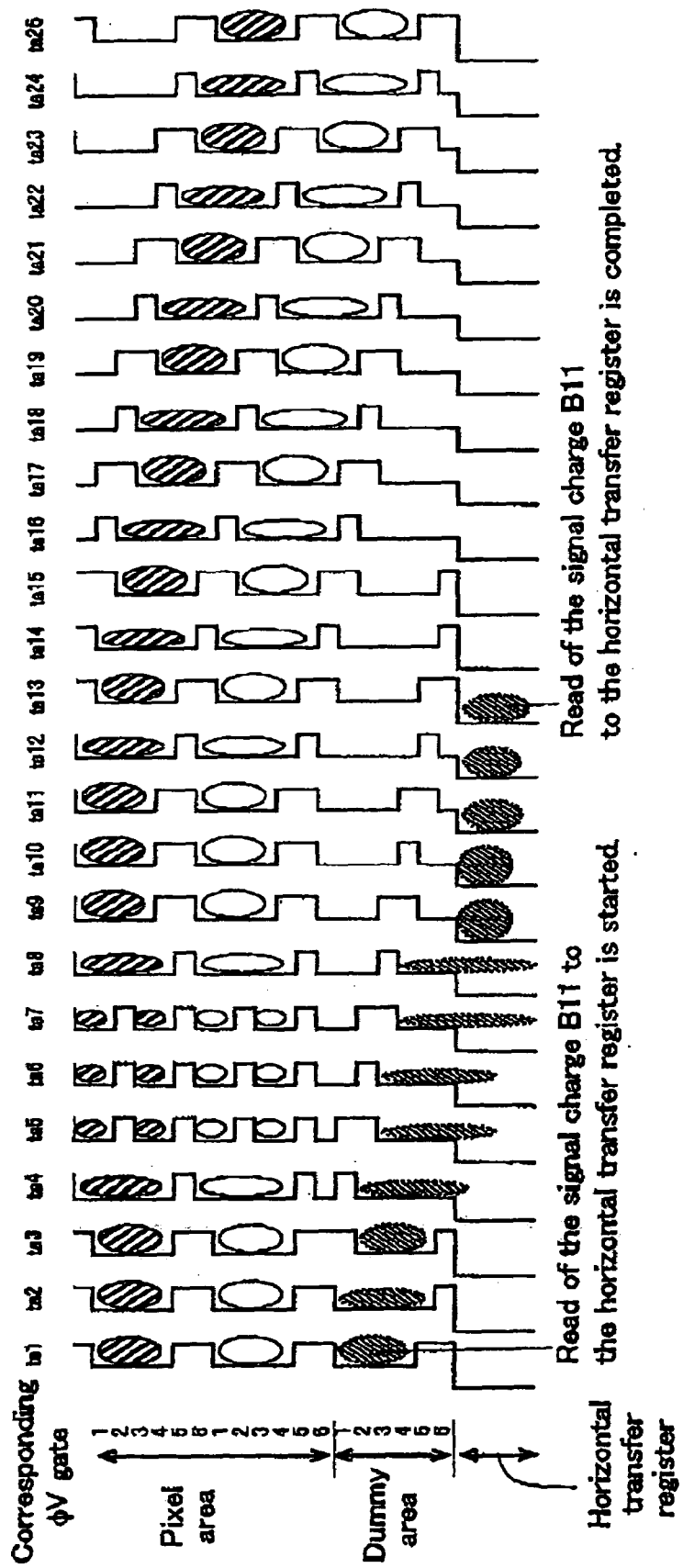
FIG. 5B is a potential diagram illustrating the transfer states of signals corresponding to the B–B' registers for reading signals from the pixel area vertical transfer registers to the horizontal transfer register in a plurality of stages in the CCD image sensor shown in FIG. 1C.

FIG. 5A is a potential diagram illustrating the transfer states of signals corresponding to a period from time ta1 through ta25 by the A–A' registers. FIG. 5B is a potential diagram illustrating the transfer states of signals corresponding to a period from time ta1 through ta25 by the B–B' registers.

One transfer cycle of one step of vertical transfer register is from time ta1 to time ta25. This transfer cycle includes a period from time ta1 to time ta13 in which the signal charges are transferred to the horizontal transfer register 4a by the B–B' registers and a period from time ta13 to time ta25 in which the signal charges are transferred to the horizontal transfer register 4a by the A–A' registers.

First, an operation of the CCD image sensor 10A in the period from time ta1 to time ta13 will be described.

The second dummy area B (the B–B' registers) includes the gates φV1A, φV2, φV3A, φV4, φV5A and φV6. As shown in FIG. 5B, a signal charge B11 which is accumulated in a packet in the second dummy area B which is closest to the horizontal transfer register 4a is transferred toward the horizontal transfer register 4a during the period from time ta1 to time ta13 at the six-phase driving timing as shown in FIG. 4. In this specification, a "packet" is formed using at least one gate.

During this transfer, with the other packets which are transferred by the B–B' registers (FIG. 5B) and all the packets which are transferred by the A–A' registers (FIG. 5A), the first layer gates φV2, φV4 and φV6 are supplied with a clock signal at the same timing as the usual six-phase driving timing.

However, the second layer gate φV5 in the pixel area which is closest to the horizontal transfer register 4a, and the second layer gate φV5 in the first dummy area A which is closest to the horizontal transfer register 4a, are fixed to a low level. The other second layer gates φV1 and φV3 are fixed to a high level. Therefore, the signal charges accumulated in the other packets which are transferred by the B–B' registers, and all the packets which are transferred by the A–A' registers, do not exceed packets formed using the gate φV5. Therefore, in the period from time ta1 to time ta13, no signal charge is transferred from the pixel area vertical transfer registers 3a and the dummy area vertical transfer registers 8a to the horizontal transfer register 4a.

In a period from time ta5 to time ta7, there occurs a state in which the signal charges in one packet is divided into two packets temporarily, but the two packets are returned into one packet at time ta8. Thus, no problem occurs.

Next, an operation of the CCD image sensor 10A in the period from time ta13 to time ta25 will be described.

As shown in FIG. 4, in the period from time ta13 to time ta25, the gates φV1 through φV6, φV1A, φV3A and φV5A are supplied with a clock signal at the same timing as the usual six-phase driving timing. Thus, all the signal charges by one packet (one step of vertical transfer register).

However, the signal charge B11 in the packet which is closest to the horizontal transfer register 4a among the signal charges corresponding to the B–B' registers has already been transferred to the horizontal transfer register 4a in the period from time ta1 to time ta13. At time ta13, the packet is empty. Therefore, what is transferred to the horizontal transfer register 4a in the period from time ta13 to time ta25 is only a signal charge A11 in the packet which is closest to the horizontal transfer register 4a among the signal charges corresponding to the A–A' registers (FIG. 5A).

As described above, the signal charges are transferred from the B–B' registers (pixel area vertical transfer registers 3a and the dummy vertical transfer registers 8a) to the horizontal transfer register 4a in the period from time ta1 to time ta13. Then, the signal charges are transferred from the A–A' registers (pixel area vertical transfer registers 3a and the dummy vertical transfer registers 8a) to the horizontal transfer register 4a in the period from time ta13 to time ta25. By time ta25, one transfer cycle of all the other signal charges by one step of vertical transfer register has been completed. As a result, the time period between the time at which the transfer of the signal charges from the A–A' registers is completed, and the time at which the transfer of the signal charges from the B–B' registers is completed, equals the time period between time ta13 and time ta25. The actual effective time period is between time ta13, at which the transfer of the signal charges from the B–B' registers is completed, and time ta15, at which the signal charges from the A–A' registers arrive at the horizontal transfer register 4a.

In the first example, in order to minimize the number of terminals, the second layer gates φV1, φV3 and φV5 in the first dummy area A corresponding to the gates φV1A, φV3A and φV5A in the second dummy area B are commonly connected to the second layer gates φV1, φV3 and φV5 in the pixel area. The first layer gates φV2, φV4 and φV6 in the pixel area are commonly connected to the first layer gates φV2, φV4 and φV6 in the dummy area.

It is clear that different terminals may be used in the pixel area and the dummy area, such that the signal charges are transferred at different timings. The effects are the same.

In the first example, the interline transfer type CCD image sensor 10A having six-phase driving vertical transfer registers is used as an example of a solid-state imaging device. Alternatively, a CCD image sensor having a different number of phases of vertical driving registers (i.e. n number of phases of vertical driving registers where n=2k, k is an integer of 2 or greater) or a non-interline transfer type CCD image sensor may be used.

In the first example, the gates are of two layers. Alternatively, the gates are of three or more layers with the same electrode structure. The same effects are provided.

The CCD image sensor 10A may be driven by various other methods.

EXAMPLE 2

Figure 6:
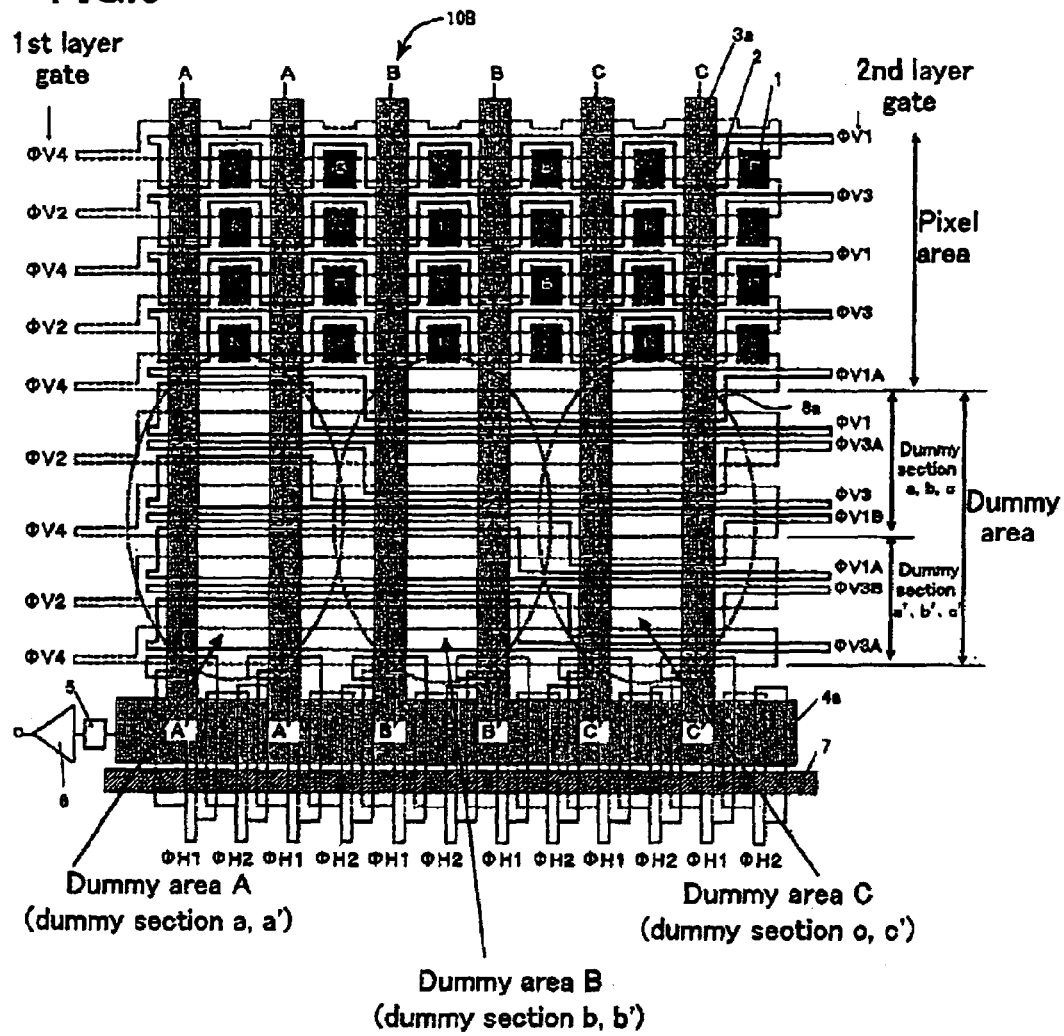
FIG. 6 is a schematic plan view illustrating a structure of a CCD image sensor according to a second example of the present invention.

FIG. 6 in a schematic plan view illustrating a structure of a CCD image sensor 10B according to a second example of the present invention. The CCD image sensor 10B includes a plurality of photodiodes 1 each acting as a light receiving section, transfer gates 2, pixel area vertical transfer registers 3a, a horizontal transfer register 4a, dummy area vertical transfer registers 8a, a charge detection section 5, an output amplifier 6, and a sweep-out drain 7. These elements have the same structure and function in the same manner as those described in the first example, and will not be described in detail here.

For the sake of simplicity, FIG. 6 omits the pixel area transfer control section 3b, the dummy area transfer control section 8b, and the horizontal transfer control section 4b (FIG. 1A). FIG. 6 also omits the control section 9 (FIG. 1B).

As shown in FIG. 6, the CCD image sensor 10B includes a plurality of photodiodes 1 (pixels) arranged in four rows and six columns.

As shown in FIG. 6 the CCD image sensor 10B is an interline transfer type CCD image sensor having four-phase driving vertical transfer registers, which are produced by a two-layer gate process.

The CCD image sensor 10B has a pixel area and a dummy area as shown in FIG. 6. The pixel area transfer electrode 3c (FIGS. 1A and 1B) is provided in the pixel area. The pixel area transfer electrode 3c includes first layer transfer electrodes φV2 and φV4, and second layer transfer electrodes φV1 and φV3. The first layer transfer electrodes φV2 and φV4, and second layer transfer electrodes φV1 and φV3, cross the plurality of pixel area vertical transfer registers 3a and are arranged alternately in the vertical direction. The first layer transfer electrodes φV2 and φV4 are also referred to as "first layer gates", and the second layer transfer electrodes φV1 and φV3 are also referred to as "second layer gates". These transfer electrodes are also referred to as "gates".

In the pixel area, n number of transfer electrodes are treated as one set (n=2k, k is an integer of 2 or greater; in this example, n=4, k=2). Signal charges which have been read from the photodiodes 1 are transferred in the vertical direction by n-phase driving. The gates φV1 through φV4 are supplied with a vertical transfer control signal from the pixel area transfer control section 3b (FIGS. 1A and 1B) at a general 4-phase driving timing. The signal charges are held by an accumulation section formed of two continuous gates and a barrier section formed of two gates provided so as to interpose the accumulation section therebetween.

The dummy area is provided between the pixel area and the horizontal transfer register 4a. The dummy area transfer electrode 8c (FIGS. 1A and 1B) is provided in the dummy area. The dummy area transfer electrode 8c includes first layer transfer electrodes φV2 and φV4, and second layer transfer electrodes φV1, φV1A, φV1B, φV3, φV3A and φV3B. The first layer transfer electrodes φV2 and φV4, and second layer transfer electrodes φV1, φV1A, φV1B, φV3, φV3A, and φV3B, cross the plurality of dummy area vertical transfer registers 8a. The first layer transfer electrodes φV2 and φV4 are also referred to as "first layer gates", and the second layer transfer electrodes φV1, φV1A, φV1B, φV3, φV3A and φV3B are also referred to as "second layer gates". These transfer electrodes are also referred to as "gates".

In the dummy sections a, b and c, the gates φV1A and φV1 correspond to each other, and the gates φV3A and φV3 correspond to each other. In the dummy section a', b' and c', the gates φV1B and φV1A correspond to each other, and the gates φV3B and φV3A correspond to each other.

The dummy area includes a first dummy area A, a third dummy area B and a second dummy area C. The first dummy area A corresponds to two A–A' registers (dummy area vertical transfer registers 8a), the third dummy area B corresponds to two B–B' registers (dummy area vertical transfer registers 8a), and the second dummy area C corresponds to two C–C' registers (dummy area vertical transfer registers 8a).

The first layer transfer electrodes φV2 and φV4 provided in the first dummy area A are also referred to as "first dummy area first layer transfer electrodes". The second layer transfer electrodes φV1, φV1A, φV3 and φV3A provided in the first dummy area A are also referred to as "first dummy area second layer transfer electrodes".

The first layer transfer electrodes φV2 and φV4 provided in the third dummy area B are also referred to as "third dummy area first layer transfer electrodes". The second layer transfer electrodes φV1A and φV3A provided in the third dummy area B are also referred to as "third dummy area second layer transfer electrodes".

The first layer transfer electrodes φV2 and φV4 provided in the second dummy area C are also referred to as "second dummy area first layer transfer electrodes". The second layer transfer electrodes φV1A, φV1B, φV3A and φV3B provided in the second dummy area C are also referred to as "second dummy area second layer transfer electrodes".

The first dummy area A includes a first dummy section a and a second dummy section a'. The third dummy area B includes a first dummy section b and a second dummy section b'. The second dummy area C includes a first dummy section c and a second dummy section c'.

In the dummy section a of the first dummy area A, the gates are arranged in substantially the same manner as in the pixel area. The first layer transfer electrodes φV2 and φV4 and the second layer transfer electrodes φV1 and φV3 are alternately arranged in the vertical direction.

In dummy section a, n number of transfer electrodes are treated as one set (n=2k, k is an integer of 2 or greater; in this example, n=4, k=2). The signal charges from the pixel area are transferred in the vertical direction by n-phase driving. Corresponding gates of the gates φV1 through φV4 in the first dummy section a and the gates φV1 through φV4 in the pixel area are commonly connected, so as to receive the same clock signal as a vertical transfer control signal.

In the dummy sections a', b, b' and c, the gates are arranged in a different manner from in the pixel area. The first layer transfer electrodes φV2 and φV4 and the second layer transfer electrodes φV1A and φV3A are alternately arranged in the vertical direction.

In the dummy sections a', b, b' and c, n number of transfer electrodes are treated as one set (n=2k, k is an integer of 2 or greater in this example, n=4, k=2). The signal charges from the pixel area are transferred in the vertical direction by n-phase driving.

In the dummy sections a', b, b' and c, the first layer transfer electrodes φV2 and φV4 have the same patterns as those of the first layer transfer electrodes φV2 and φV4 in the dummy sections a and c'. Corresponding gates of the gates φV2 and φV4 in the dummy sections a', b, b' and c and the gates φV2 and φV4 in the pixel area are commonly connected, so as to receive the same clock signal as a vertical transfer control signal, like in the dummy section a.

In the dummy sections a' and b', the second layer transfer electrodes φV1A and φV3A have different patterns from those of the second layer transfer electrodes φV1B and φV3B in the dummy section c'.

In the dummy sections b and c, the second layer transfer electrodes φV1A and φV3A have different patterns from those of the second layer transfer electrodes φV1 and φV3 in the dummy section a.

Corresponding gates of the gates φV1A and φV3A in the dummy sections a', b, b' and c, and the gates φV1 and φV3 in the pixel area are arranged so as to receive a different clock signal as a vertical transfer control signal.

In the dummy section c', the gates are arranged in a different manner from in the pixel area. The first layer transfer electrodes φV2 and φV4 and the second layer transfer electrodes φV1B and φV3B are alternately arranged in the vertical direction.

In the dummy section c', n number of transfer electrodes are treated as one set (n=2k, k is an integer of 2 or greater in this example, n=4, k=2). The signal charges from the pixel area are transferred in the vertical direction by n-phase driving.

In the dummy section c', the first layer transfer electrodes φV2 and φV4 have the same patterns as those of the first layer transfer electrodes φV2 and φV4 in the dummy sections a' and b'.

Corresponding gates of the gates φV2 and φV4 in the dummy section c' and the gates φV2 and φV4 in the pixel area are commonly connected, so as to receive the same clock signal as a vertical transfer control signal, like in the dummy section a.

In the dummy section c', the second layer transfer electrodes φV1B and φV3B have different patterns from those of the second layer transfer electrodes φV1A and φV3A in the dummy sections a' and b'.

Corresponding gates of the gates φV1B and φV3B in the dummy section c' and the gates φV1 and φV3 in the pixel area are arranged so as to receive a different clock signal as a vertical transfer control signal.

Corresponding gates of the gates φV1B and φV3B in the dummy section c' and the gates φV1A and φV3A in the dummy sections a', b, b' and c are arranged so as to receive a different clock signal as a vertical transfer control signal.

An operation of the CCD image sensor 10B will be described, hereinafter. For the sake of simplicity, an operation of transferring the signal charges by the A–A' registers, the B–B' registers and the C–C' registers will be described.

First, an operation in the case where signals are collectively read from the pixel area vertical transfer registers 3a and the dummy area vertical transfer registers 8a to the horizontal transfer register 4a will be described. In this operation, the dummy area transfer control section 8b (FIG. 1A) or the control section 9 (FIG. 1B) controls the vertical transfer registers such that at least one of the registers transfers the signal charges in the some manner as the other registers in a certain case.

Figure 7:
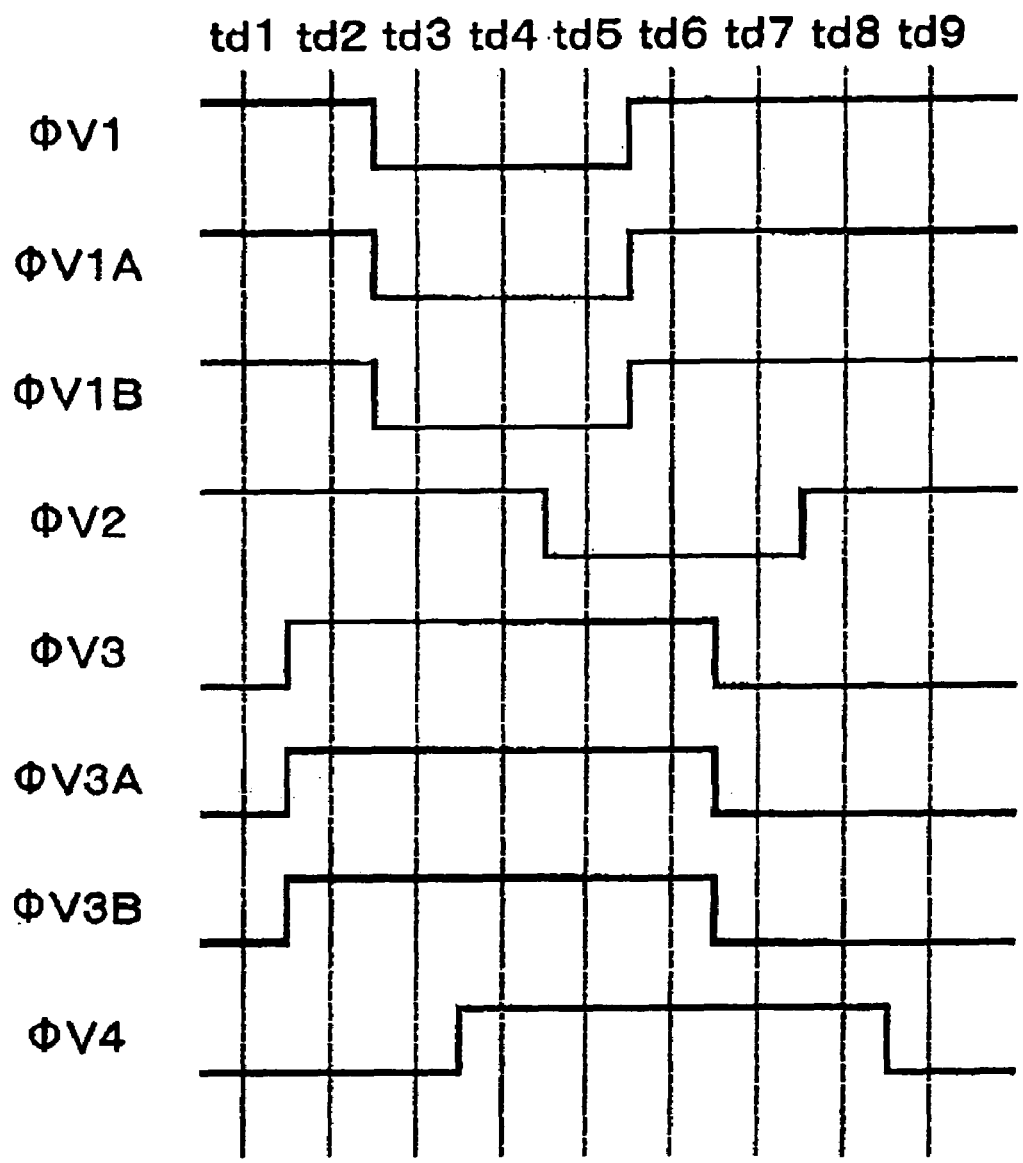
FIG. 7 is a wave for diagram illustrating the driving timing for collectively reading signals from pixel area vertical transfer registers to a horizontal transfer register in the CCD image sensor shown in FIG. 6.

FIG. 7 is a waveform diagram illustrating the driving timing of the gates φV1 through φV4, φV1A, φV1B, φV3A and φV3B in the case where signals are collectively read from the pixel area vertical transfer registers 3a and the dummy area vertical transfer registers 8a to the horizontal transfer register 4a.

Figure 8A:
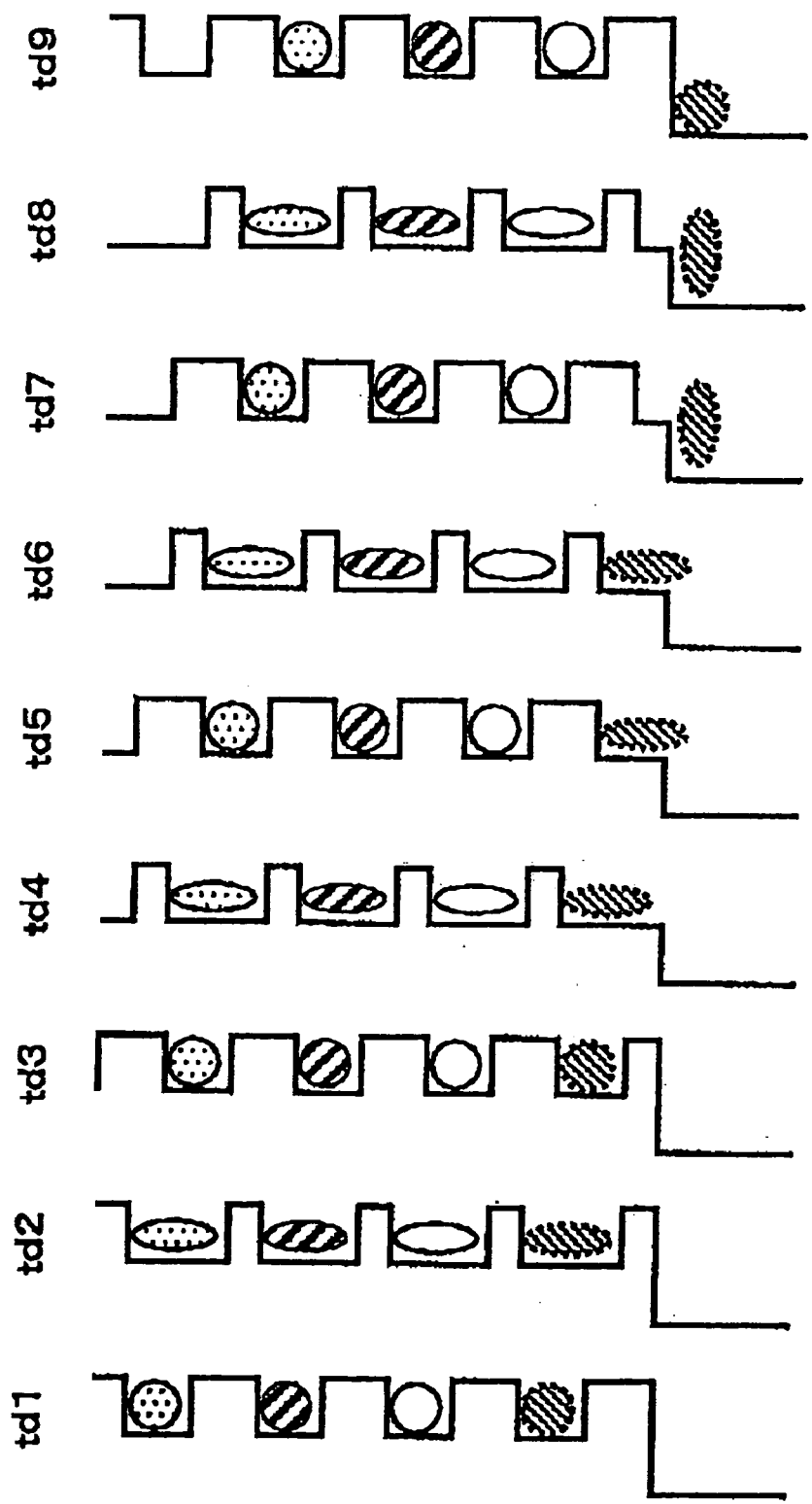
FIG. 8A is a potential diagram illustrating the transfer states of signal corresponding to A–A' registers for collectively reading signals from the pixel area vertical transfer registers to the horizontal transfer register in the CCD image sensor shown in FIG. 6.
Figure 8C:
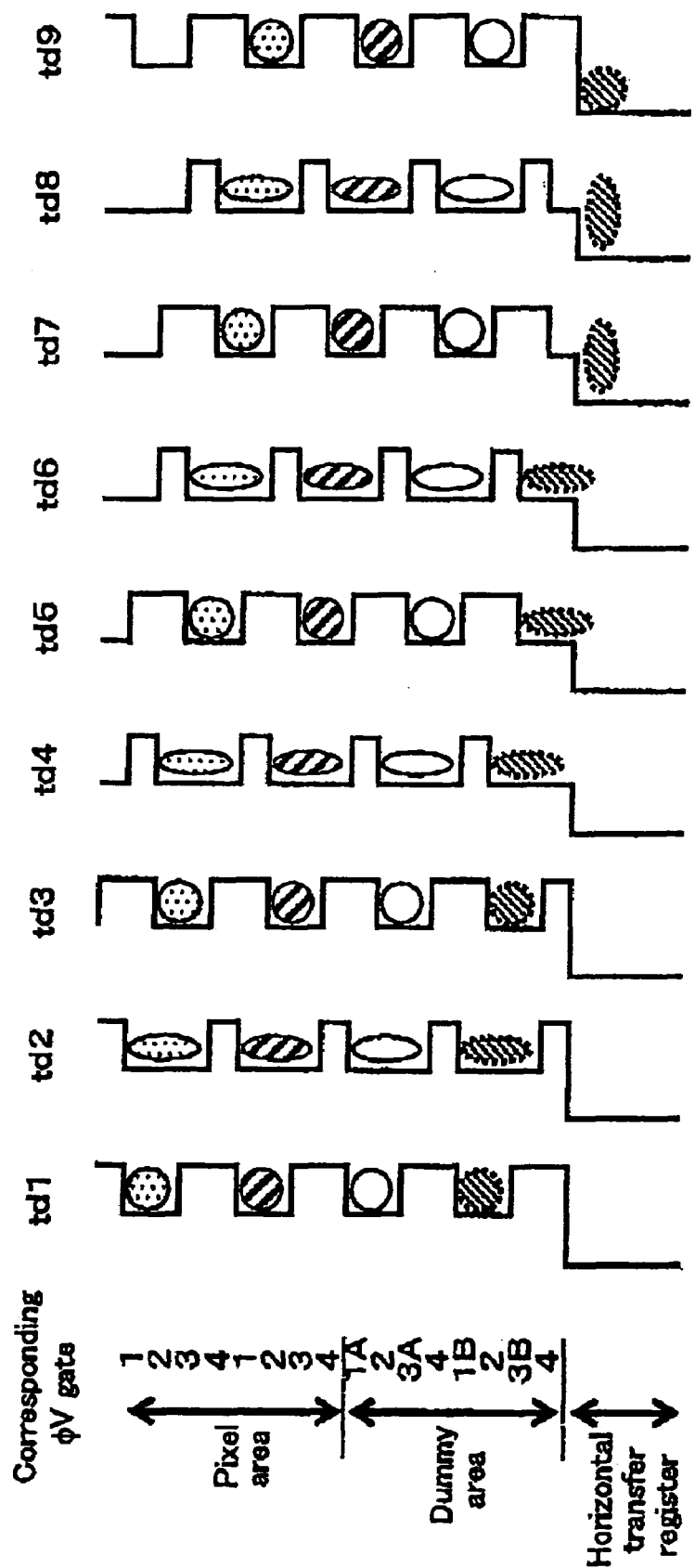
FIG. 8C is a potential diagram illustrating the transfer states of signals corresponding to C–C' registers for collectively reading signals from the pixel area vertical transfer registers to the horizontal transfer register in the CCD image sensor shown in FIG. 6.

FIG. 8A is a potential diagram illustrating the transfer states of signals corresponding to time td1 through time td9 by the A–A' registers. FIG. 8B is a potential diagram illustrating the transfer states of signals corresponding to time td1 through time td9 by the B–B' registers. FIG. 8C is a potential diagram illustrating the transfer states of signals corresponding to time td1 through time td9 by the C–C' registers. One transfer cycle of one step of vertical transfer register is from time td1 to time td9.

For collectively reading signals from the pixel area vertical transfer registers 3a and the dummy area vertical transfer registers 8a to the horizontal transfer register 4a, as shown in FIG. 7, the gates φV1A and φV1B are supplied with a clock signal at the same timing as the gate φV1. Thus, the signal charges are transferred at four-phase driving timing. The gates φV3A and φV3B are supplied with a clock signal at the same timing as the gate φV3. Thus, the signal charges are transferred at four-phase driving timing.

As shown in FIG. 8A, the A–A' registers sequentially transfer the signal charges in the pixel area at the four-phase driving timing by the gates φV1 through φV4 as shown in FIG. 7. In the dummy section a, the A–A' registers sequentially transfer the signal charges (as shown in FIG. 8A) at the four-phase driving timing by the gates φV1 through φV4 as shown in FIG. 7. In the dummy section a', the A–A' registers sequentially transfer the signal charges (as shown in FIG. 8A) at the four-phase driving timing by the gates φV1A, φV2, φV3A and φV4 as shown in FIG. 7.

As shown in FIG. 8B, the B–B' registers sequentially transfer the signal charges in the pixel area at the four-phase driving timing by the gates φV1 through φV4 (FIG. 7). In the second dummy area B, the B–B' registers sequentially transfer the signal charges (FIG. 8B) at the four-phase driving timing by the gates φV1A, φV2, φV3A and φV4 (FIG. 7).

As shown in FIG. 8C, the C–C' registers sequentially transfer the signal charges in the pixel area at the four-phase driving timing by the gates φV1 through φV4 as shown in FIG. 7. In the dummy section c, the C–C' registers sequentially transfer the signal charges (as shown in FIG. 8C) at the four-phase driving timing by the gates φV1A, φV2, φV3A and φV4 as shown in FIG. 7. In the dummy section c', the C–C' registers sequentially transfer the signal charges (as shown in FIG. 8C) at the four-phase driving timing by the gates φV1B, φV2, φV3B and φV4 as shown in FIG. 7.

Thus, as shown in FIGS. 8A through 8C, the A–A' registers, the B–B' registers and the C–C' registers operate at the same potential transition. The transfer of the signal charges from the pixel area vertical transfer registers 3a and the dummy area vertical transfer registers 8a to the horizontal transfer register 4a by the A–A' register, the B–B' registers and the C–C' registers starts at time td1 and completes at time td9.

Next, an operation in the case where signals are read from the pixel area vertical transfer registers 3a and the dummy area vertical transfer registers 8a to the horizontal transfer register 4a in three stages will be described. In this operation, the dummy area transfer control section 8b (FIG. 1A) or the control section 9 (FIG. 1B) controls the vertical transfer registers such that at least one of the registers transfers the signal charges in a different manner from the other registers in a certain case.

FIG. 9 is a waveform diagram illustrating the driving timing of the gates φV1 through φV4, φV1A, φV1B, φV3A and φV3B in the case where signals are read from the pixel area vertical transfer registers 3a and the dummy area vertical transfer registers 8a to the horizontal transfer register 4a in three stages.

Figure 10A:
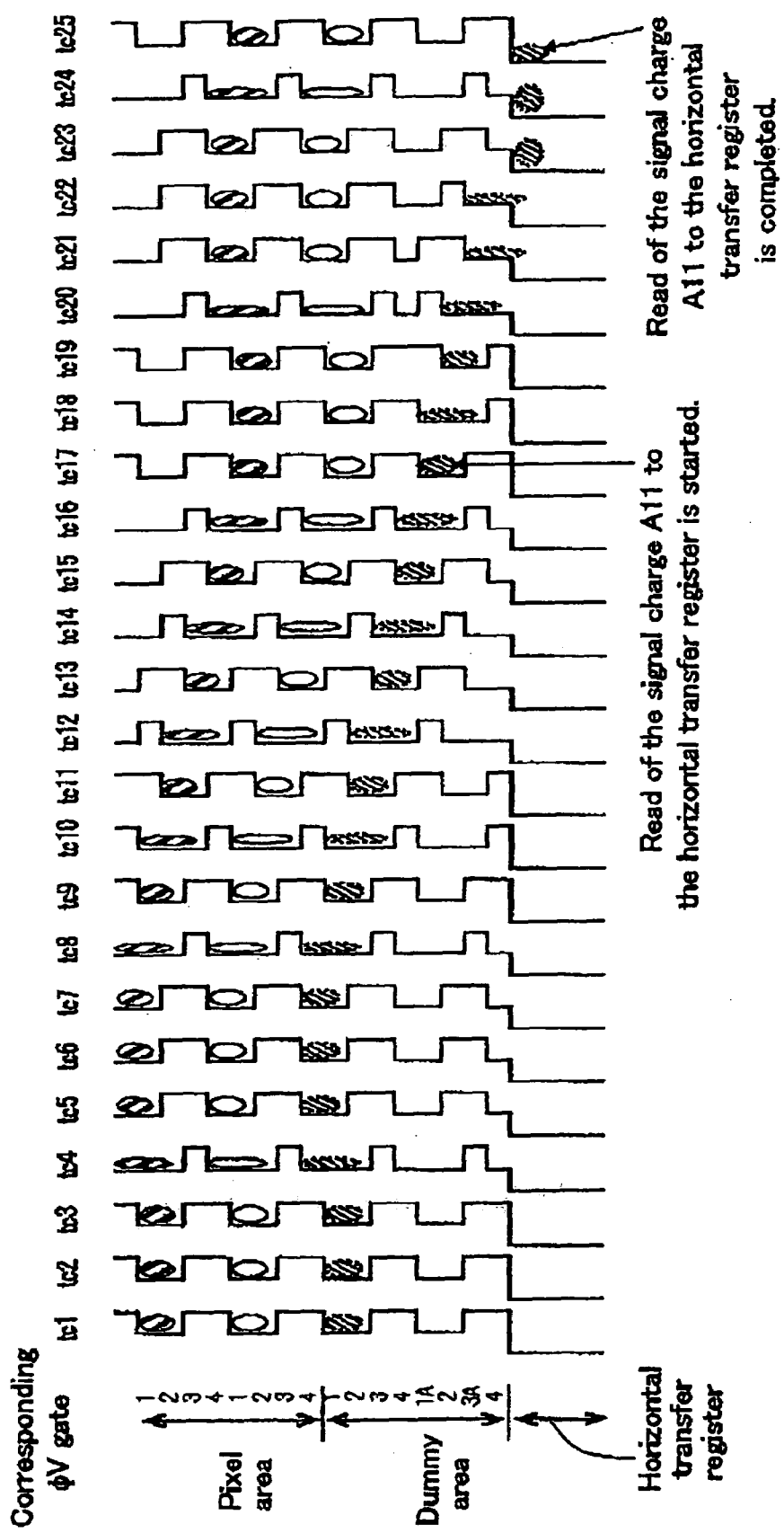
FIG. 10A is a potential diagram illustrating the transfer states of signals corresponding to the A–A' registers for reading signals from the pixel area vertical transfer registers to the horizontal transfer register in a plurality of stages in the CCD image sensor shown in FIG. 6.
Figure 10B:
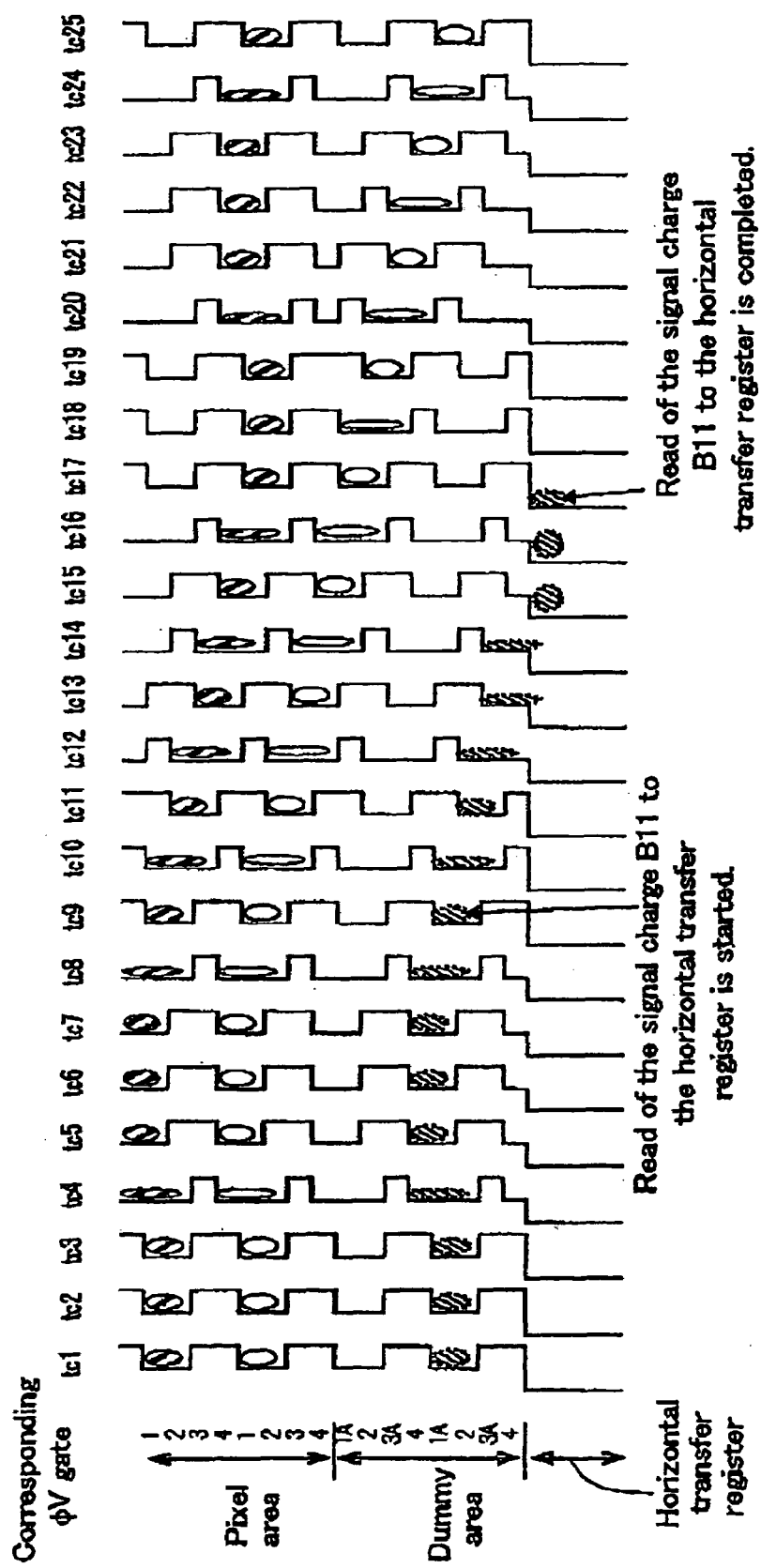
FIG. 10B is a potential diagram illustrating the transfer states of signals corresponding to the B–B' registers for reading signals from the pixel area vertical transfer registers to the horizontal transfer register in a plurality of stages in the CCD image sensor shown in FIG. 6.
Figure 10C:
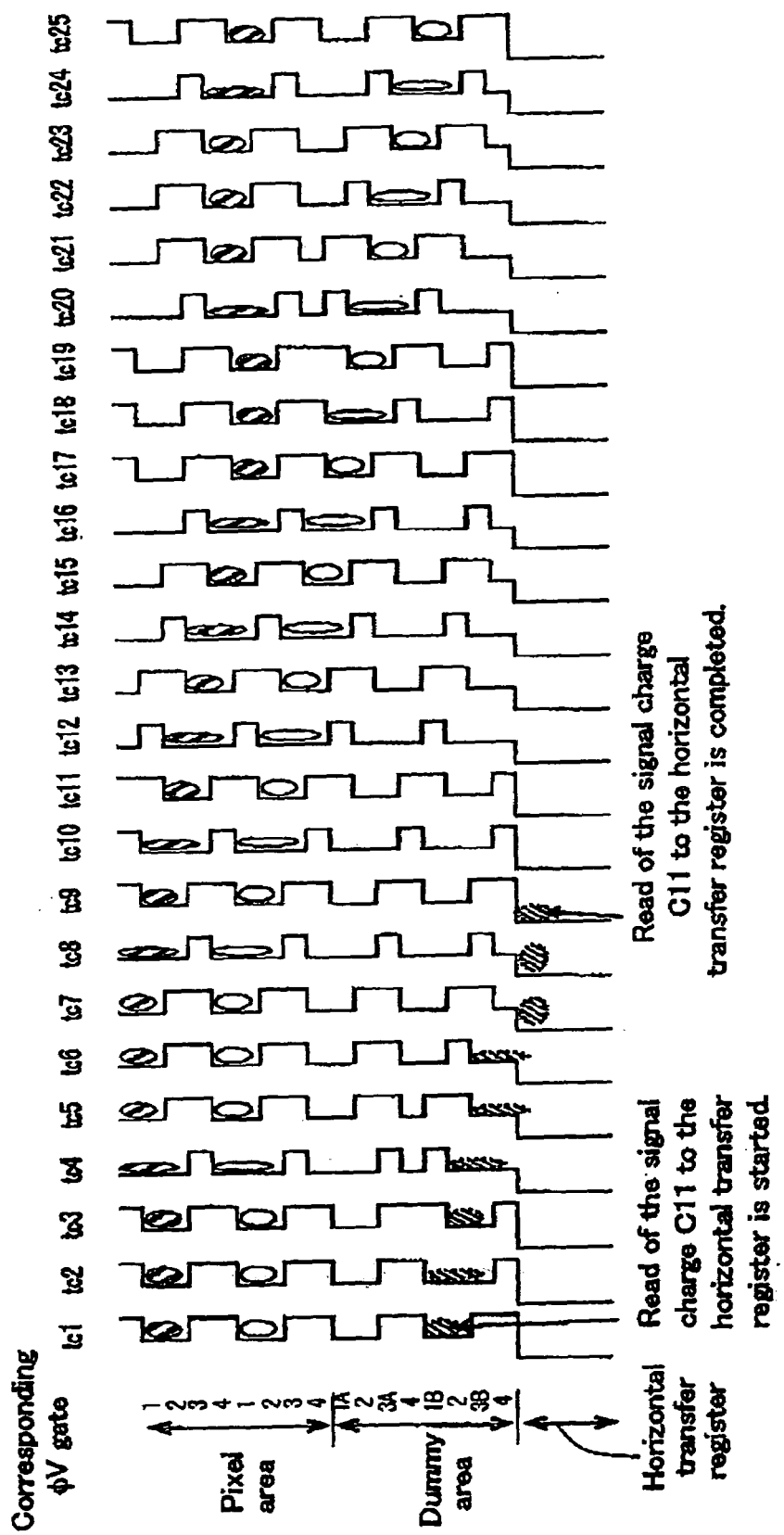
FIG. 10C is a potential diagram illustrating the transfer states of signals corresponding to the C–C' registers for reading signals from the pixel area vertical transfer registers to the horizontal transfer register in a plurality of stages in the CCD image sensor shown in FIG. 6.

FIG. 10A is a potential diagram illustrating the transfer states of signals corresponding to a period from time tc1 through tc25 by the A–A' registers. FIG. 10B in a potential diagram illustrating the transfer states of signals corresponding to a period from time tc1 through tc25 by the B–B' registers. FIG. 10C in a potential diagram illustrating the transfer states of signals corresponding to a period from time tc1 through tc25 by the C–C' registers.

One transfer cycle of one step of vertical transfer register is from time tc1 to time tc25. This transfer cycle includes a period from time tc1 to time tc9 in which the signal charges are transferred to the horizontal transfer register 4a by the C–C' registers, a period from time tc9 to time tc17 in which the signal charges are transferred to the horizontal transfer register 4a by the B–B' registers, and a period from time tc17 to time tc25 in which the signal charges are transferred to the horizontal transfer register 4a by the A–A' registers.

First, an operation of the CCD image sensor 10B in the period from time tc1 to time tc9 will be described.

Signal charges C11 accumulated in the packets, which correspond to the C–C' registers, which are closest to the horizontal transfer register 4a, and which are in the dummy section c' which are formed using the gates φV1B, φV2, φV3B and φV4, are transferred to the horizontal transfer register 4a during the period from time tc1 to time tc9 at the four-phase driving timing shown in FIG. 9.

During this transfer, with the packets in the other dummy sections a, a', b, b' and c and the pixel area, which are formed using the gates φV1 through φV4, φV1A and φV3A, the first layer gates φV2 and φV4 are supplied with a low-level clock signal at the same timing as the usual four-phase driving timing shown in FIG. 9.

However, the gates φV3 and φV3A, which are closest to the horizontal transfer register 4a among the second layer gates, are fixed to a low level, and the other second layer gates φV1 and φV1A are fixed to a high level. Therefore, the signal charges accumulated in the packets in the other dummy sections a, a', b, b' and c and the pixel area, which are formed using the gates φV1 through φV4, φV1A and φV3A, do not exceed packets formed using the gates φV3 and φV3A. Thus, in the period from time tc1 to time tc9, no signal charge is transferred from the pixel area vertical transfer registers 3a and the dummy area vertical transfer registers 8a corresponding to the A–A' registers and the B–B' registers to the horizontal transfer register 4a.

Next, an operation of the CCD image sensor 10B in the period from time tc9 to time tc17 will be described.

As shown in FIG. 9, in the period from time tc9 to time tc17, the gates φV1 through φV4, φV1A, φV1B, φV3A and φV3B are supplied with a clock signal at the same timing as the usual four-phase driving timing. Thus, as shown in FIGS. 10A through 10C, all the signal charges corresponding to the A–A' registers, the B–B' registers and the C–C' registers are transferred toward the horizontal transfer register 4a by one packet (one step of vertical transfer register).

However, the signal charge C11 in the packet which is closest to the horizontal transfer register 4a among the signal charges corresponding to the C–C' registers has already been transferred to the horizontal transfer register 4a in the period from time tc1 to time tc9. At time tc9, the packet is empty. Therefore, what is transferred to the horizontal transfer register 4a in the period from time tc9 to time tc17 is only a signal charge B11 in the packet which is closest to the horizontal transfer register 4a among the signal charges corresponding to the B–B' registers (FIG. 10B).

As described above, during a time period between (a) the time at which the transfer of the signal charges from the dummy section a' (closest to the horizontal transfer register 4a among the areas and sections corresponding to the A–A' registers) is completed, and (b) the time at which the transfer of the signal charges from the dummy section b' is completed, signal charges are transferred by one step of vertical transfer register. Therefore, the packet which is closest to the horizontal transfer register 4a among the packets transferred by the A–A' register is already empty at time tc9, and thus no signal is transferred to the horizontal transfer register 4a.

Next, an operation of the CCD image sensor 10B in the period from time tc17 to time tc25 will be described.

As shown in FIGS. 10A through 10C, the signal charges accumulated in the packets in the dummy sections a', b, b', c and c' formed by gates φV1A, φV1B, φV2, φV3A φV3B and φV4 are transferred toward the horizontal transfer register 4a in the period from time tc17 to time tc25 at the four-phase driving timing as shown in FIG. 9. Thus, the signal charges accumulated in the packets in the dummy section a' are transferred to the horizontal transfer register 4a, the signal charges accumulated in the packets in the dummy section b are transferred to the dummy section b', and the signal charges accumulated in the packets in the dummy section c are transferred to the dummy section c'.

Since the packets in the dummy sections b' and c' are empty at time tc17, what is newly transferred to the horizontal transfer register 4a in the period from time tc17 to time tc25 is only a signal charge A11 in the packet in the dummy section a' which is closest to the horizontal transfer register 4a among the areas and sections corresponding to the A–A' registers.

The gate φV1 is fixed to a high level, and the gate φV3 is fixed to a low level. Therefore, the signal charges accumulated in the packets in the dummy section a and the pixel area and formed by gates φV1 through φV4 do not exceed packets formed using the gate φV3. Therefore, in the period from time tc17 to time tc25, no signal charge is transferred by the A–A' registers from the dummy section a to the dummy section a'. No signal charge is transferred from the pixel area to the dummy section b by the B–B' registers or from the pixel area to the dummy section c by the C–C' registers.

As described above, in the period from time tc1 to time tc9, the signal charges are transferred by the C–C' registers from the pixel area vertical transfer registers 3a and dummy area vertical transfer registers 8a to the horizontal transfer register 4a.

Next, in the period from time tc9 to time tc17, the signal charges are transferred by the B–B' registers from the pixel area vertical transfer registers 3a and dummy area vertical transfer registers 8a to the horizontal transfer register 4a.

Then, in the period from time tc17 to time tc25, the signal charges are transferred by the A–A' registers from the pixel area vertical transfer registers 3a and dummy area vertical transfer registers 8a to the horizontal transfer register 4a. By time tc25, one transfer cycle of all the other signal charges by one step of vertical transfer register has been completed. As a result, a time period between the time at which the transfer of the signal charges from the A–A' registers is completed, and the time at which the transfer of the signal charges from the B–B' registers is completed, equals the time period between time tc17 and time tc25. The actual effective time period is between time tc17, at which the transfer of the signal charges from the B–B' registers is completed, and time tc19, at which the signal charges from the A–A' registers arrive at the horizontal transfer register 4a.

A time period between the time at which the transfer of the signal charges from the B–B' registers is completed, and the time at which the transfer of the signal charges from the C–C' registers is completed, equals the time period between time tc9 and time tc17. The actual effective time period is between time tc9, at which the transfer of the signal charges from the C–C' registers is completed, and time tc11, at which the signal charges from the B–B' registers arrive at the horizontal transfer register 4a.

EXAMPLE 3

Figure 11:
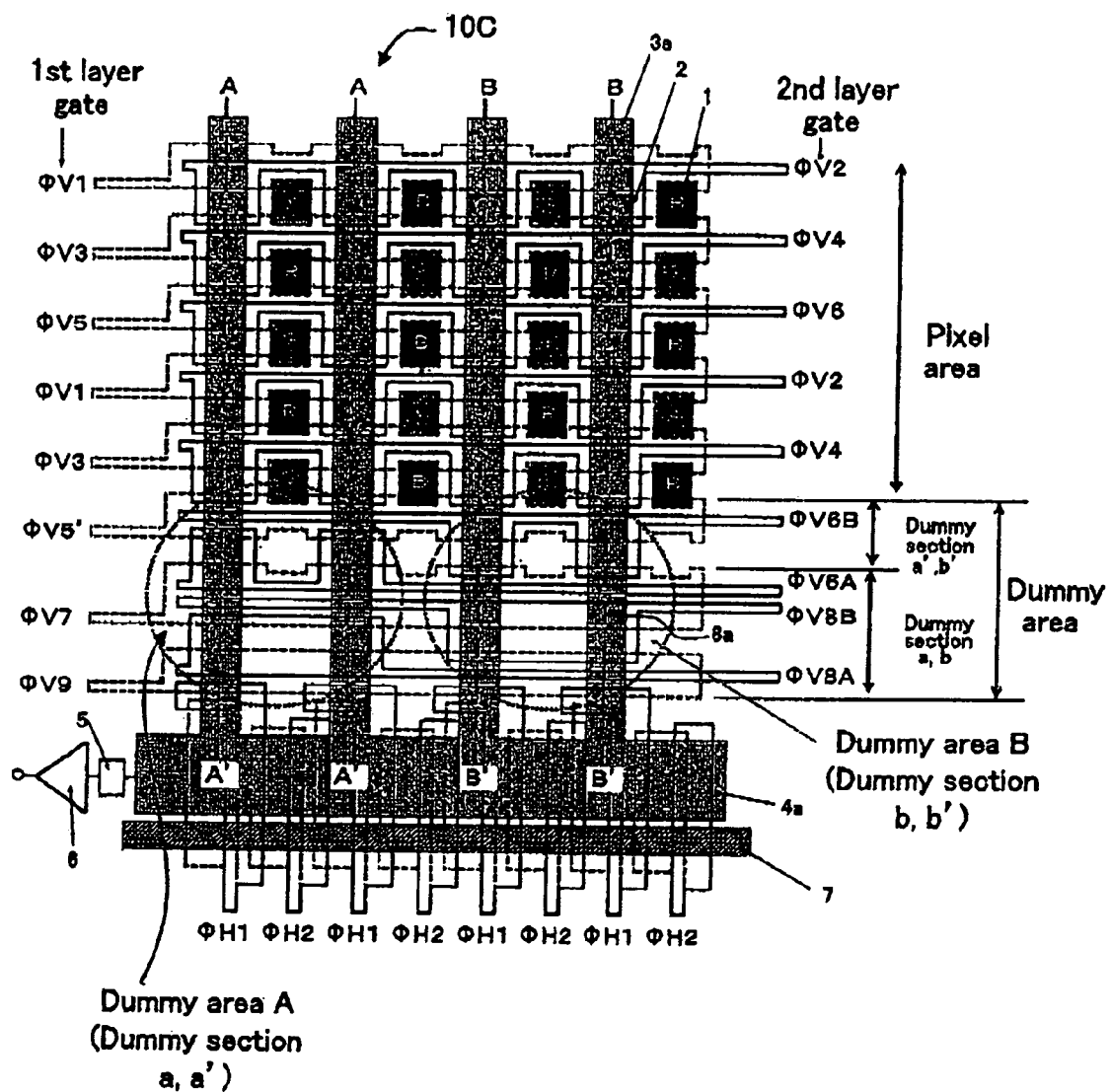
FIG. 11 is a schematic plan view illustrating a structure of a CCD image sensor according to a third example of the present invention.

FIG. 11 is a schematic plan view illustrating a structure of a CCD image sensor 10C according to a third example of the present invention. The CCD image sensor 10C includes a plurality of photodiodes 1 each acting as a light receiving section, transfer gates 2, pixel area vertical transfer registers 3a, a horizontal transfer register 4a, dummy area vertical transfer registers 8a, a charge detection section 5, an output amplifier 6, and a sweep-out drain 7. These elements have the same structure and function in the same manner as those described in the first example, and will not be described in detail here.

For the sake of simplicity, FIG. 11 omits the pixel area transfer control section 3b, the dummy area transfer control section 8b, and the horizontal transfer control section 4b (FIG. 1A). FIG. 11 also omits the control section 9 (FIG. 1B).

As shown in FIG. 11, the CCD image sensor 10C includes a plurality of photodiodes 1 (pixels) arranged in five rows and four columns.

An shown in FIG. 11, the CCD image sensor 10C is an interline transfer type CCD image sensor having six-phase driving vertical transfer registers, which are produced by a two-layer gate process.

The CCD image sensor 10C has a pixel area and a dummy area as shown in FIG. 11. The pixel area transfer electrode 3c (FIGS. 1A and 1B) is provided in the pixel area. The pixel area transfer electrode 3c includes first layer transfer electrodes φV1, φV3 and φV5, and second layer transfer electrodes φV2, φV4 and φV6. The first layer transfer electrodes φV1, φV3 and φV5, and second layer transfer electrodes φV2, φV4 and φV6, cross the plurality of pixel area vertical transfer registers 3a and are arranged alternately in the vertical direction. The first layer transfer electrodes φV1, φV3 and φV5 are also referred to as "first layer gates", and the second layer transfer electrodes φV2, φV4 and φV6 are also referred to as "second layer gates". These transfer electrodes are also referred to as "gates".

In the pixel area, m number of transfer electrodes are treated as one set (m=2j, j is an integer of 3 or greater; in this example, m=6, j=3). Signal charges which have been read from the photodiodes 1 are transferred in the vertical direction by m-phase driving. The gates φV1 through φV6 are supplied with a vertical transfer control signal from the pixel area transfer control section 3b (FIGS. 1A and 1B) at a general 6-phase driving timing. The signal charges are held by an accumulation section formed of four continuous gates and a barrier section formed of two gates provided so as to interpose the accumulation section therebetween.

The dummy area is provided between the pixel area and the horizontal transfer register 4a. The dummy area transfer electrode 8c (FIGS. 1A and 1B) is provided in the dummy area. The dummy area transfer electrode 8c includes first layer transfer electrodes φV5', φV7 and φV9, and second layer transfer electrodes φV6A, φV6B, φV8A and φV8B. The first layer transfer electrodes φV5', φV7 and φV9, and second layer transfer electrodes φV6A, φV6B, φV8A and φV8B, across the plurality of dummy area vertical transfer registers 8a. The first layer transfer electrodes φV5', φV7 and φV9 are also referred to as "first layer gates", and the second layer transfer electrodes φV6A, φV6B, φV8A and φV8B are also referred to as "second layer gates". These transfer electrodes are also referred to as "gates".

The gates φV6B and φV6A correspond to each other, and the gates φV8B and φV8A correspond to each other.

The dummy area includes a first dummy area A and a second dummy area B. The first dummy area A corresponds to two A–A' registers (dummy area vertical transfer registers 8a), and the second dummy area B corresponds to two B–B' registers (dummy area vertical transfer registers 8a).

The first layer transfer electrodes φV5', φV7 and φV9 provided in the first dummy area A are also referred to as "first dummy area first layer transfer electrodes". The second layer transfer electrodes φV6A and φV8A provided in the first dummy area A are also referred to as "first dummy area second layer transfer electrodes".

The first layer transfer electrodes φV5', φV7 and φV9 provided in the second dummy area B are also referred to as "second dummy area first layer transfer electrodes". The second layer transfer electrodes φV6B and φV8B provided in the second dummy area B are also referred to as "second dummy area second layer transfer electrodes".

The first dummy area A includes a first dummy section a and a second dummy section a'. The second dummy area B includes a first dummy section b and a second dummy section b'.

In the dummy area a the first layer transfer electrodes φV7 and φV9 and the second layer transfer electrode φV8A are alternately arranged in the vertical direction.

In dummy section a, m/2 number of transfer electrodes are treated as one set (m=2j, j is an integer of 3 or greater; in this example, m/2=3, j=3). The signal charges from the pixel area are transferred in the vertical direction by m/2-phase driving.

In the pixel area, the gates φV1 through φV6 are continuously arranged in the vertical direction. In the pixel area and the dummy section a' corresponding to the A–A' registers, the gates φV1, φV2, φV3, φV4, φV5' and φV6A are continuously arranged. The gates φV5' and φV6A are arranged so as to receive a clock signal as a vertical transfer control signal at a different timing from the gates φV5 and φV6 in the pixel area.

In the dummy section b, the first layer transfer electrodes φV7 and φV9 and the second layer transfer electrode φV8B are alternately arranged in the vertical direction.

In the dummy section b, m/2 number of transfer electrodes are treated as one set (m=2j, j is an integer of 3 or greater; in this example, m/2=3, j=3). The signal charges from the pixel area are transferred in the vertical direction by m/2-phase driving.

In the dummy section b, the first layer transfer electrodes φV7 and φV9 have the same patterns as those of the first layer transfer electrodes φV7 and φV9 in the dummy section a. The gates φV7 and φV9 in the dummy sections a and b are arranged so as to receive the same clock signal as a vertical transfer control signal.

In the dummy section a, the second layer transfer electrode φV8A has a different pattern from that of the second layer transfer electrode φV8B in the dummy section b. The gate φV8A in the dummy section a and the gate φV8B in the dummy section b are arranged so as to receive a different clock signal as a vertical transfer control signal.

In the pixel area, the gates φV1 through φV6 are continuously arranged in the vertical direction. In the pixel area and the dummy section b' corresponding to the B–B' registers, the gates φV1, φV2, φV3, φV4, φV5' and φV6B are continuously arranged. The gates φV5' and φV6B are arranged so as to receive a clock signal as a vertical transfer control signal at a different timing from the gates φV5 and φV6 in the pixel area.

In the dummy section b', the first layer transfer electrode φV5' has the same pattern as that of the first layer transfer electrode φV5' in the dummy section a'. The gate φV5' in the dummy sections a' and b' are arranged so as to receive the same clock signal as a vertical transfer control signal.

In the dummy section a', the second layer transfer electrode φV6A has a different pattern from that of the second layer transfer electrode φV6B in the dummy section b'. The gate φV6A in the dummy section a' and the gate φV6B in the dummy section b' are arranged so as to receive a different clock signal as a vertical transfer control signal.

An operation of the CCD image sensor 10C will be described, hereinafter. For the sake of simplicity, an operation of transferring the signal charges by the A–A' registers and the B–B' registers will be described.

First, an operation in the case where signals are collectively read from the pixel area vertical transfer registers 3a and the dummy area vertical transfer registers 8a to the horizontal transfer register 4a will be described. In this operation, the dummy area transfer control section 8b (FIG. 1A) or the control section 9 (FIG. 1B) controls the vertical transfer registers such that at least one of the registers transfers the signal charges in the same manner as the other registers in a certain case.

Figure 12:
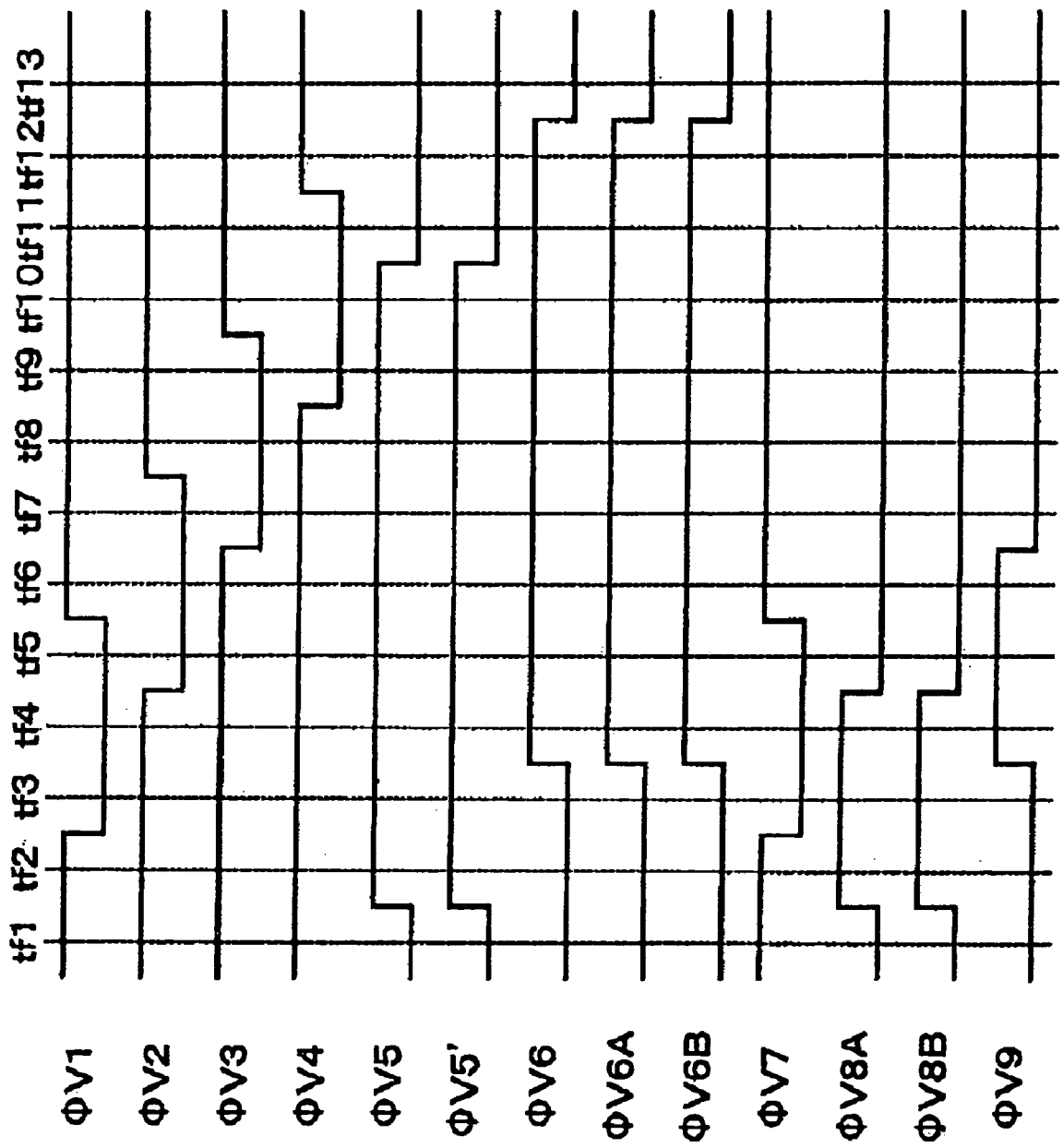
FIG. 12 is a waveform diagram illustrating the driving timing for collectively reading signals from pixel area vertical transfer registers to a horizontal transfer register in the CCD image sensor shown in FIG. 11.

FIG. 12 is a waveform diagram illustrating the driving timing of the gates φV1 through φV6, φV5', φV6A, φV6B, φV7, φV8A, φV8B and φV9 in the case where signals are collectively read from the pixel area vertical transfer registers 3a and the dummy area vertical transfer registers 8a to the horizontal transfer register 4a.

Figure 13A:
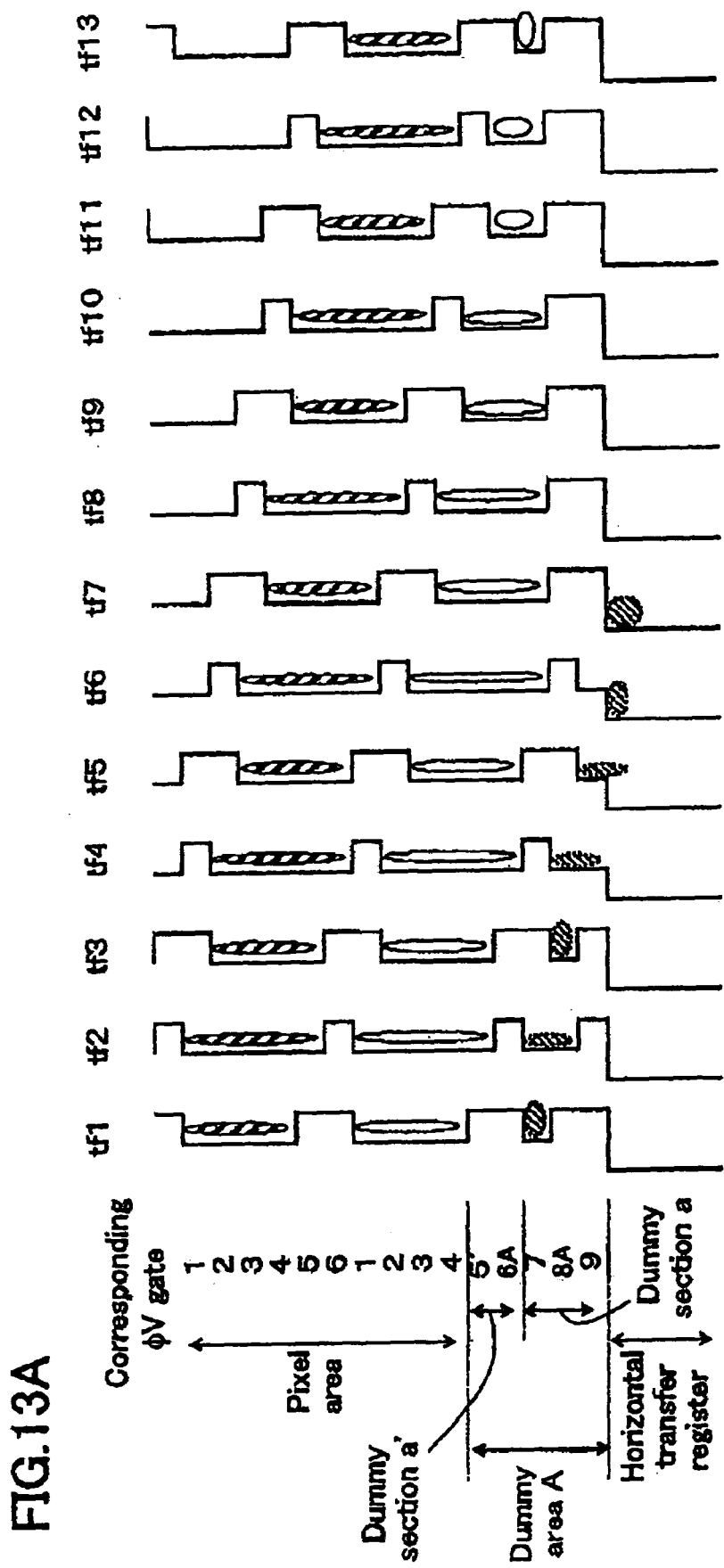
FIG. 13A is a potential diagram illustrating the transfer states of signals corresponding to A–A' registers for collectively reading signals from the pixel area vertical transfer registers to the horizontal transfer register in the CCD image sensor shown in FIG. 11.
Figure 13B:
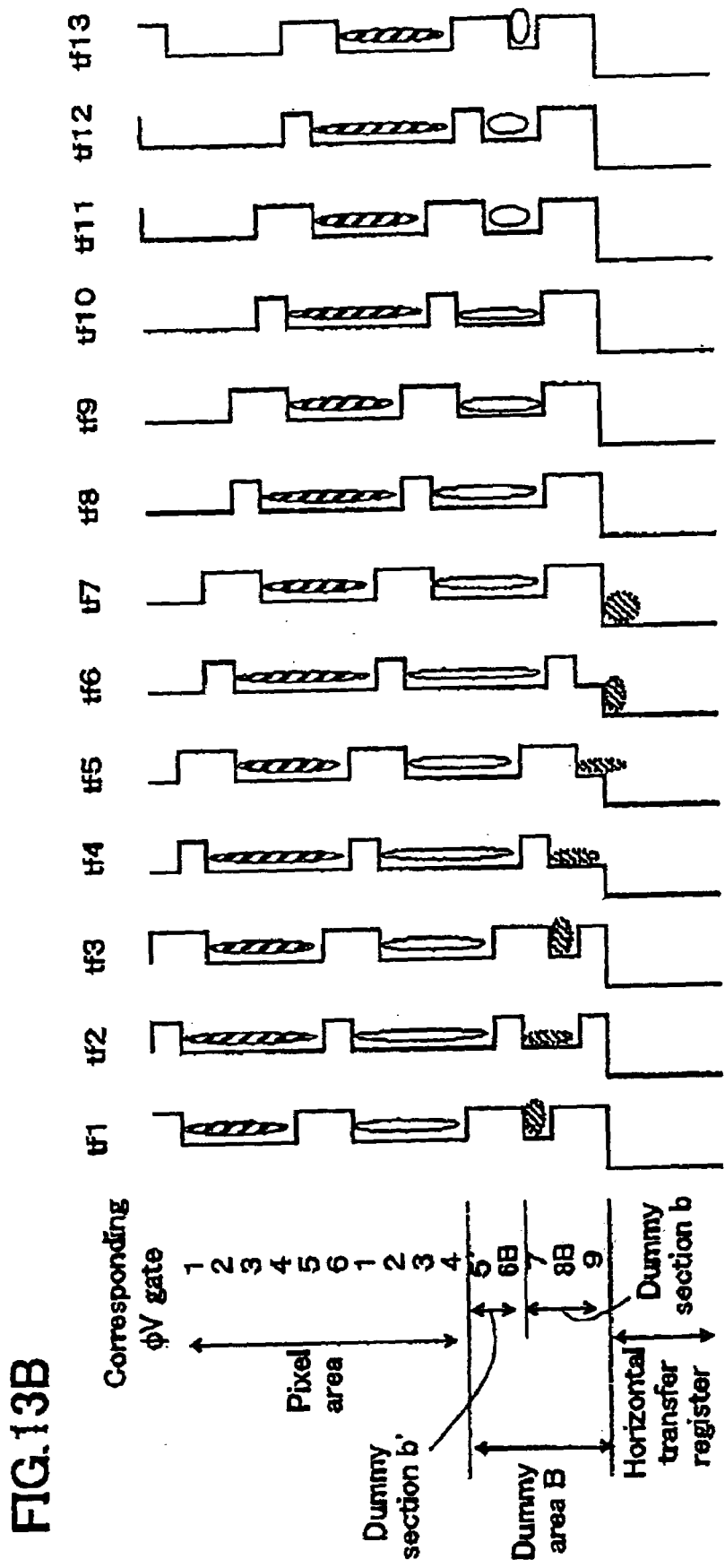
FIG. 13B is a potential diagram illustrating the transfer states of signals corresponding to B–B' registers for collectively reading signals from the pixel area vertical transfer registers to the horizontal transfer register in the CCD image sensor shown in FIG. 11.

FIG. 13A is a potential diagram illustrating the transfer states of signals corresponding to time tf1 through time tf13 by the A–A' registers. FIG. 13B in a potential diagram illustrating the transfer states of signals corresponding to time tf1 through time tf13 by the B–B' registers. One transfer cycle of one step of vertical transfer register is from time tf1 to time tf13.

For collectively reading signals from the pixel area vertical transfer registers 3a and the dummy area vertical transfer registers 8a to the horizontal transfer register 4a, as shown in FIG. 12, the gate φV5' is supplied with a low-level clock signal at the same timing as the gate φV5. The gates φV6A and φV6B are supplied with a clock signal at the same timing an the gate φV6. Thus, the signal charges are transferred at six-phase driving timing. The gate φV8B is supplied with a low-level clock signal at the same timing as the gate φV8A. Thus, the signal charges are transferred at three-phase driving timing.

As shown in FIG. 13A, the A–A' registers sequentially transfer the signal charges in the pixel area at the six-phase driving timing by the gates φV1 through φV6 as shown in FIG. 12. In the dummy section a', the A–A' registers sequentially transfer the signal charges (as shown in FIG. 13A) at the six-phase driving timing by the gates φV5' and φV6 as shown in FIG. 12. In the dummy section a, the A–A' registers sequentially transfer the signal charges (as shown in FIG. 13A) at the three-phase driving timing by the gates φV7, φV8A and φV9 as shown in FIG. 12.

As shown in FIG. 13B, the B–B' registers sequentially transfer the signal charges in the pixel area at the six-phase driving timing by the gates φV1 through φV6 (FIG. 12). In the dummy section b', the B–B' registers sequentially transfer tho signal charges (FIG. 13B) at the six-phase driving timing by the gates φV5' and φV6B (FIG. 12). In the dummy section b, the B–B' registers sequentially transfer the signal charges (FIG. 13B) at the three-phase driving timing by the gates φV7, φV8B and φV9 (FIG. 12).

Thus, as shown in FIGS. 13A and 13B, the A–A' registers and the B–B' registers operate at the same potential transition. The transfer of the signal charges from the pixel area vertical transfer registers 3a and the dummy area vertical transfer registers 8a to the horizontal transfer register 4a by the A–A' registers and the B–B' registers starts at time tf1 and completes at time tf13.

Next, an operation in the case where signals are read from the pixel area vertical transfer registers 3a and the dummy area vertical transfer registers 8a to the horizontal transfer register 4a in two stages will be described. In this operation, the dummy area transfer control section 8b (FIG. 1A) or the control section 9 (FIG. 1B) controls the vertical transfer registers such that at least one of the registers transfers the signal charges in a different manner from the other registers in a certain case.

Figure 14:
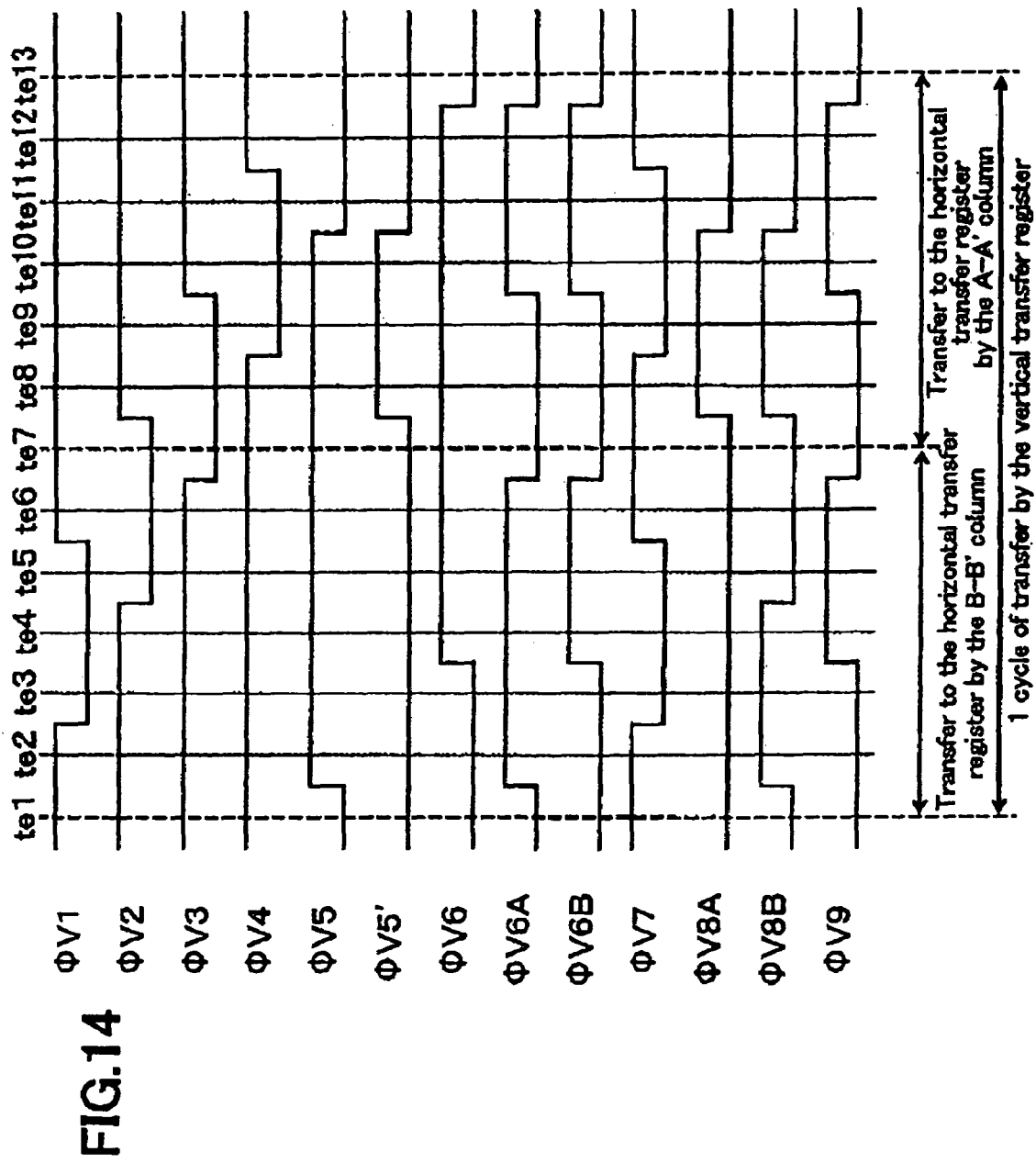
FIG. 14 is a waveform diagram illustrating the driving timing for reading signals from the pixel area vertical transfer registers to the horizontal transfer register in a plurality of stages in the CCD image sensor shown in FIG. 11.

FIG. 14 is a waveform diagram illustrating the driving timing of the gates φV1 through φV6, φV5', φV6A, φV6B, φV7, φV8A, φV8B and φV9 in the case where signals are read from the pixel area vertical transfer registers 3a and the dummy area vertical transfer registers 8a to the horizontal transfer register 4a in two stages.

FIG. 15A is a potential diagram illustrating the transfer states of signals corresponding to a period from time te1 through te13 by the A–A' registers. FIG. 15B is a potential diagram illustrating the transfer states of signals corresponding to a period from time te1 through te13 by the B–B' registers.

One transfer cycle of one step of vertical transfer register is from time te1 to time te13. This transfer cycle includes a period from time te1 to time te7 in which the signal charges are transferred to the horizontal transfer register 4a by the B–B' registers, and a period from time te7 to time te13 in which the signal charges are transferred to the horizontal transfer register 4a by the A–A' registers.

First, an operation of the CCD image sensor 10C in the period from time te1 to time te7 will be described.

Signal charges B11 accumulated in the packets, which correspond to the B–B' registers, which are closest to the horizontal transfer register 4a, and which are in the dummy section b which are formed using the gates φV7, φV8B and φV9, are transferred to the horizontal transfer register 4a during the period from time te1 to time te7 at the three-phase driving timing shown in FIG. 14.

During this transfer, with the packets in the pixel area, which are formed using the gates φV1 through φV6, the signal charges are sequentially transferred in the vertical transfer registers by the usual six-phase driving shown in FIG. 14, and the signal charges in the packets closest to the dummy area are transferred to the packets corresponding to the gate φV4, which in between the gates φV3 and φV5'.

The gate φV8A, which is closest to the horizontal transfer register 4a among the second layer gates corresponding to the A–A' registers, is fixed to a low level, and at least the gate φV6A, which is closest to the horizontal transfer register 4a among the remaining second layer gates corresponding to the A–A' registers, is fixed to a high level. At least one gate φV5' in the dummy section a' and b' is fixed to a low level. Therefore, as shown in FIG. 15A, the signal charges accumulated in the dummy section a are maintained in the packets formed using the gates φV5' and φV8A. Thus, in the period from time te1 to time te7, no signal charge is transferred from the pixel area vertical transfer registers 3a and the dummy area vertical transfer registers 8a corresponding to the A–A' registers to the horizontal transfer register 4a.

In a period from time te2 to time te5, there occurs a state in which the signal charges are temporarily transferred in the opposite direction in the vertical transfer registers, but the direction of transfer is recovered to the forward direction in the period from time te6 to time te7. Thus, no problem occurs.

Next, an operation of the CCD image sensor 10C in the period from time te7 to time te13 will be described.

As shown in FIG. 14, in the period from time te7 to time te13, the gates φV4, φV5', φV6A, φV6B, φV7, φV8A, φV8B and φV9 are supplied with a low-level clock signal at the same timing as the usual three-phase driving timing. Thus, as shown in FIGS. 15A and 15D, the signal charges accumulated in the packets in the dummy sections a and b corresponding to the A–A' registers and the B–B' registers are transferred toward the horizontal transfer register 4a.

However, the signal charge B11 in the packet which is closest to the horizontal transfer register 4a among the signal charges corresponding to the B–B' registers has already been transferred to the horizontal transfer register 4a in the period from time te1 to time te7. At time te7, the packet is empty. Therefore, what is transferred to the horizontal transfer register 4a in the period from time te7 to time te13 is only a signal charge A11 accumulated in the dummy section a.

The signal charges accumulated in the packet corresponding to the gate φV4, which is between the gates φV3 and φV5' and closest to the dummy area, are transferred to a packet corresponding to the gate φV7 in the dummy sections a and b.

As described above, in the period from time te1 to time te7, the signal charges are transferred by the B—B columns from the pixel area vertical transfer registers 3a and dummy area vertical transfer registers 8a to the horizontal transfer register 4a.

Next, in the period from time te7 to time te13, the signal charges are transferred by the A–A' registers from the pixel area vertical transfers registers 3a and dummy area vertical transfer registers 8a to the horizontal transfer register 4a. One transfer cycle of all the other signal charges by one step of vertical transfer register is then completed. As a result, a time period between the time at which the transfer of the signal charges from the A–A' registers is completed, and the time at which the transfer of the signal charges from the B–B' registers is completed, equals the time period between time te7 and time te13. The actual effective time period is between time te7, at which the transfer of the signal charges from the B–B' registers is completed, and time te9, at which the signal charges from the A–A' registers arrive at the horizontal transfer register 4a.

In the third example, the interline transfer type CCD image sensor 10C having six-phase driving vertical transfer registers is used as an example of a solid-state imaging device. Alternatively, a CCD image sensor having a different number of phases of vertical driving registers (i.e., m/2 number of phases of vertical driving registers where m=2j, j is an integer of 3 or greater) or a non-interline transfer type CCD image sensor may be used.

In the third example, the gates are of two layers. Alternatively the gates are of three or more layers with the same electrode structure. The same effects are provided.

The CCD image sensor 10C may be driven by various other methods.

EXAMPLE 4

Figure 16:
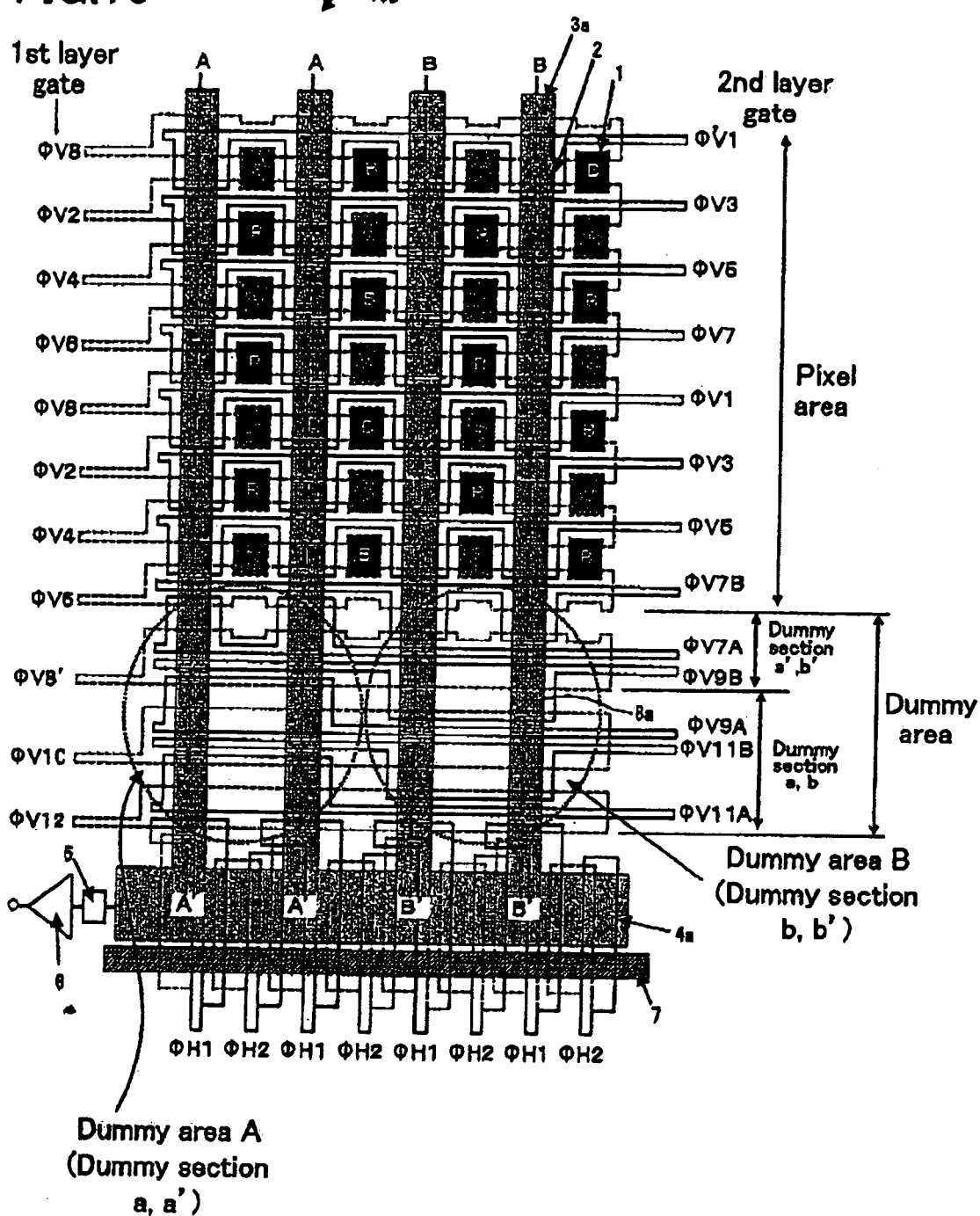
FIG. 16 is a schematic plan view illustrating a structure of a CCD image sensor according to a fourth example of the present invention.

FIG. 16 is a schematic plan view illustrating a structure of a CCD image sensor 10D according to a fourth example of the present invention. The CCD image sensor 10D includes a plurality of photodiodes 1 each acting as a light receiving section, transfer gates 2, pixel area vertical transfer registers 3a, a horizontal transfer register 4a, dummy area vertical transfer registers 8a, a charge detection section 5, an output amplifier 6, and a sweep-out drain 7. These elements have the same structure and function in the same manner as those described in the first example, and will not be described in detail here.

For the sake of simplicity, FIG. 16 omits the pixel area transfer control section 3b, the dummy area transfer control section 8b, and the horizontal transfer control section 4b (FIG. 1A). FIG. 16 also omits the control section 9 (FIG. 1B).

As shown in FIG. 16, the CCD image sensor 10D includes a plurality of photodiodes 1 (pixels) arranged in seven rows and four columns.

As shown in FIG. 16, the CCD image sensor 10D is an interline transfer type CCD image sensor having eight-phase driving vertical transfer registers, which are produced by a two-layer gate process.

The CCD image sensor 10D has a pixel area and a dummy area as shown in FIG. 16. The pixel area transfer electrode 3c (FIGS. 1A and 1B) is provided in the pixel area. The pixel area transfer electrode 3c includes first layer transfer electrodes φV2, φV4, φV6 and φV8, and second layer transfer electrodes φV1, φV3, φV5 and φV7. The first layer transfer electrodes φV2, φV4, φV6 and φV8, and second layer transfer electrodes φV1, φV3, φV5 and φV7, cross the plurality of pixel area vertical transfer registers 3a and are arranged alternately in the vertical direction. The first layer transfer electrodes φV2, φV4, φV6 and φV8 are also referred to as "first layer gates", and the second layer transfer electrodes φV1, φV3, φV5 and φV7 are also referred to as "second layer gates". These transfer electrodes are also referred to as "gates".

In the pixel area, m number of transfer electrodes are treated as one set (m=2j, j is an integer of 3 or greater; in this example, m=8, j=4). Signal charges which have been read from the photodiodes 1 are transferred in the vertical direction by m-phase driving. The gates φV1 through φV8 are supplied with a vertical transfer control signal from the pixel area transfer control section 3b (FIGS. 1A and 1B) at a general 8-phase driving timing. The signal charges are hold by an accumulation section formed of six continuous gates and a barrier section formed of two gates provided so as to interpose the accumulation section therebetween.

The dummy area is provided between the pixel area and the horizontal transfer register 4a. The dummy area transfer electrode 8c (FIGS. 1A and 1B) is provided in the dummy area. The dummy area transfer electrode 8c includes first layer transfer electrodes φV8', φV10 and φV12, and second layer transfer electrodes φV7A, φV7B, φV9A, φV9B, φV11A and φV11B. The first layer transfer electrodes φV8', φV10 and φV12, and second layer transfer electrodes φV7A, φV7B, φV9A, φV9B, φV11A and φV11B, cross the plurality of dummy area vertical transfer registers 8a. The first layer transfer electrodes φV8', φV10 and φV12, are also referred to as "first layer gates", and the second layer transfer electrodes φV7A, φV7B, φV9A, φV9B, φV11A and φV11B are also referred to as "second layer gates". These transfer electrodes are also referred to as "gates".

The gates φV7B and φV7A correspond to each other, the gates φV9B and φV9A correspond to each other, and the gates φV11B and φV11A correspond to each other.

The dummy area includes a first dummy area A and a second dummy area B. The first dummy area A corresponds to two A–A' registers (dummy area vertical transfer registers 8a), and the second dummy area B corresponds to two B–B' registers (dummy area vertical transfer registers 8a).

The first layer transfer electrodes φV8', φV10 and φV12 provided in the first dummy area A are also referred to as "first dummy area first layer transfer electrodes". The second layer transfer electrodes φV7A, φV9A and φV11A provided in the first dummy area A are also referred to as "first dummy area second layer transfer electrodes".

The first layer transfer electrodes φV8', φV10 and φV12 provided in the second dummy area B are also referred to as "second dummy area first layer transfer electrodes". The second layer transfer electrodes φV7B, φV9B and φV11B provided in the second dummy area B are also referred to as "second dummy area second layer transfer electrodes".

The first dummy area A includes a first dummy section a and a second dummy section a'. The second dummy area B includes a first dummy section b and a second dummy section b'.

In the dummy area a, the first layer transfer electrodes φV10 and φV12 and the second layer transfer electrodes φV9A and φV11A are alternately arranged in the vertical direction.

In dummy section a, m/2 number of transfer electrodes are treated as one set (m=2j, j is an integer of 3 or greater; in this example, m/2=4, j=4). The signal charges from the pixel area are transferred in the vertical direction by m/2-phase driving.

In the pixel area, the gates φV1 through φV8 are continuously arranged in the vertical direction. In the pixel area and the dummy section a' corresponding to the A–A' registers, the gates φV1, φV2, φV3, φV4, φV5, φV6, φV7A and φV8' are continuously arranged. The gates φV7A and φV8' are arranged so as to receive a clock signal as a vertical transfer control signal at a different timing from the gates φV7 and φV8 in the pixel area.

In the dummy section b, the first layer transfer electrodes φV10 and φV12 and the second layer transfer electrodes φV9B and φV11B are alternately arranged in the vertical direction.

In the dummy section b, m/2 number of transfer electrodes are treated as one set (m=2j, j is an integer of 3 or greater; in this example, m/2=4, j=4). The signal charges from the pixel area are transferred in the vertical direction by m/2-phase driving.

In the dummy section b, the first layer transfer electrodes φV10 and φV12 have the same patterns as those of the first layer transfer electrodes φV10 and φV12 in the dummy section a. The gates φV10 and φV12 in the dummy sections a and b are arranged so as to receive the same clock signal as a vertical transfer control signal.

In the dummy section a, the second layer transfer electrodes φV9A and φV11A have different patterns from those of the second layer transfer electrodes φV9B and φV11B in the dummy section b. The gates φV9A and φV11A in the dummy section a and the gates φV9B and φV11B in the dummy section b are arranged so as to receive a different clock signal as a vertical transfer control signal.

In the pixel area, the gates φV1 through φV8 are continuously arranged in the vertical direction. In the pixel area and the dummy section b' corresponding to the B–B' registers, the gates φV1, φV2, φV3, φV4, φV5, φV6, φV7B and φV8' are arranged continuously. The gates φV7B and φV8' are arranged so as to receive a clock signal as a vertical transfer control signal at a different timing from the gates φV7 and φV8 in the pixel area.

In the dummy section b', the first layer transfer electrode φV8' has the same pattern as that of the first layer transfer electrode φV8' in the dummy section a'. The gate φV8' in the dummy sections a' and b' are arranged so as to receive the same clock signal as a vertical transfer control signal.

In the dummy section a', the second layer transfer electrode φV7A has a different pattern from that of the second layer transfer electrode φV7B in the dummy section b'. The gate φV7A in the dummy section a' and the gate φV7B in the dummy section b' are arranged so as to receive a different clock signal as a vertical transfer control signal.

An operation of the CCD image sensor 10D will be described, hereinafter. For the sake of simplicity, an operation of transferring the signal charges by the A–A' registers and the B–B' registers will be described.

First, an operation in the case where signals are collectively read from the pixel area vertical transfer registers 3a and the dummy area vertical transfer registers 8a to the horizontal transfer register 4a will be described. In this operation, the dummy area transfer control section 8b (FIG. 1A) or the control section 9 (FIG. 1B) controls the vertical transfer registers such that at least one of the registers transfers the signal charges in the same manner as the other registers in a certain case.

Figure 17:
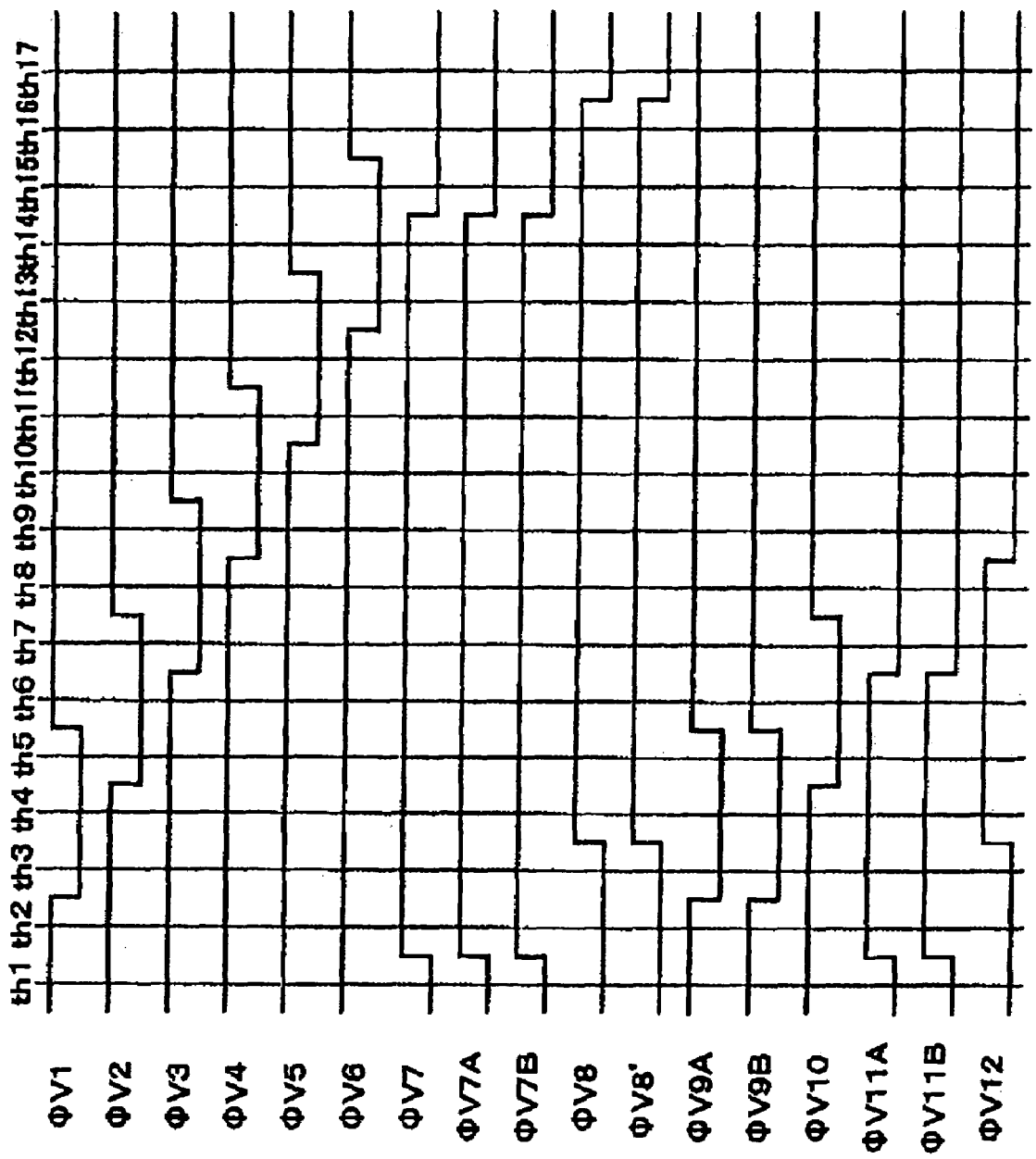
FIG. 17 is a waveform diagram illustrating the driving timing for collectively reading signals from pixel area vertical transfer registers to a horizontal transfer register in the CCD image sensor shown in FIG. 16.

FIG. 17 is a waveform diagram illustrating the driving timing of the gates φV1 through φV8, φV7A, φV7B, φV8', φV9A, φV9B, φV10, φV11A, φV11B and φV12 in the case where signals are collectively read from the pixel area vertical transfer registers 3a and the dummy area vertical transfer registers 8a to the horizontal transfer register 4a.

Figure 18A:
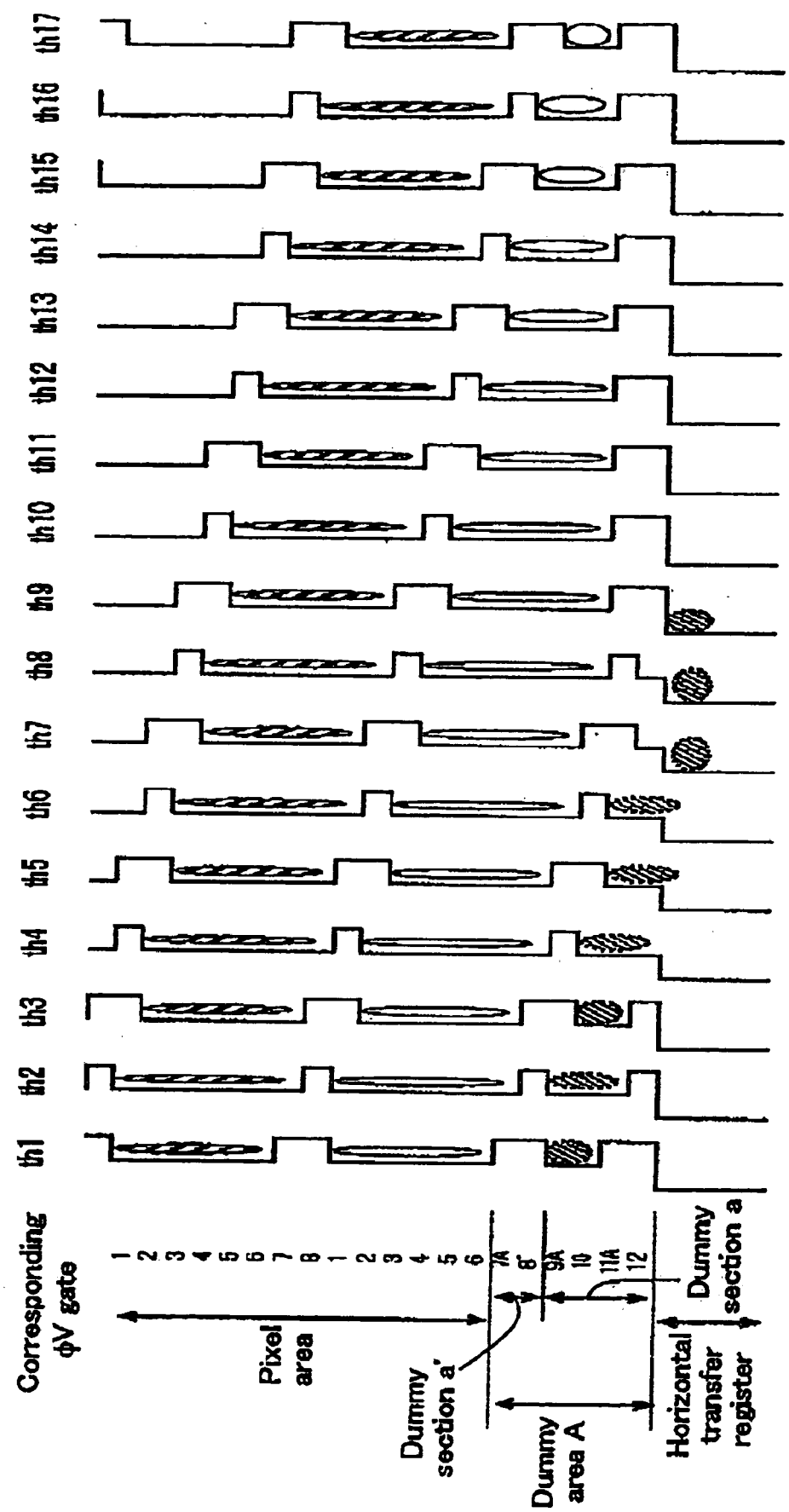
FIG. 18A is a potential diagram illustrating the transfer states of signals corresponding to A–A' registers for collectively reading signals from the pixel area vertical transfer registers to the horizontal transfer register in the CCD image sensor shown in FIG. 16.

FIG. 18A is a potential diagram illustrating the transfer states of signals corresponding to time th1 through time th17 by the A–A' registers. FIG. 18B is a potential diagram illustrating the transfer states of signals corresponding to time th1 through time th17 by the B–B' registers. One transfer cycle of one step of vertical transfer register is from time th1 to time th17.

For collectively reading signals from the pixel area vertical transfer registers 3a and the dummy area vertical transfer registers 8a to the horizontal transfer register 4a, an shown in FIG. 17, the gates φV7A and φV7B are supplied with a clock signal at the same timing as the gate φV7. The gate φV8' is supplied with a clock signal at the same timing as the gate φV8. Thus, the signal charges are transferred at eight-phase driving timing. The gates φV9B and φV11B are supplied with a clock signal at the same timing as the gates φV9A and φV11A, respectively. Thus, the signal charges are transferred at four-phase driving timing.

As shown in FIG. 18A, the A–A' registers sequentially transfer the signal charges in the pixel area at the eight-phase driving timing by the gates φV1 through φV8 as shown in FIG. 17. In the dummy section a', the A–A' registers sequentially transfer the signal charges (as shown in FIG. 18A) at the eight-phase driving timing by the gates φV7A and φV8' as shown in FIG. 17. In the dummy section a, the A–A' registers sequentially transfer the signal charges (as shown in FIG. 18A) at the four-phase driving timing by the gates φV9A, φV10, φV11A and φV12 as shown in FIG. 17.

As shown in FIG. 18B, the B–B' registers sequentially transfer the signal charges in the pixel area at the eight-phase driving timing by the gates φV1 through φV8 (FIG. 17). In the dummy section b', the B–B' registers sequentially transfer the signal charges (FIG. 18B) at the eight-phase driving timing by the gates φV7B and φV8' (FIG. 17). In the dummy section b, the B–B' registers sequentially transfer the signal charges (FIG. 18B) at the four-phase driving timing by the gates φV9B, φV10, φV11B and φV12 (FIG. 17).

Thus, as shown in FIGS. 18A and 18B, the A–A' register and the B–B' registers operate at the same potential transition. The transfer of the signal charges from the pixel area vertical transfer registers 3a and the dummy area vertical transfer registers 8a to the horizontal transfer register 4a by the A–A' registers and the B–B' registers starts at time th1 and completes at time th17.

Next, an operation in the case where signals are read from the pixel area vertical transfer registers 3a and the dummy area vertical transfer registers 8a to the horizontal transfer register 4a in four stages will be described. In this operation, the dummy area transfer control section 8b (FIG. 1A) or the control section 9 (FIG. 1B) controls the vertical transfer registers such that at least one of the registers transfers the signal charges in a different manner from the other registers in a certain case.

Figure 19:
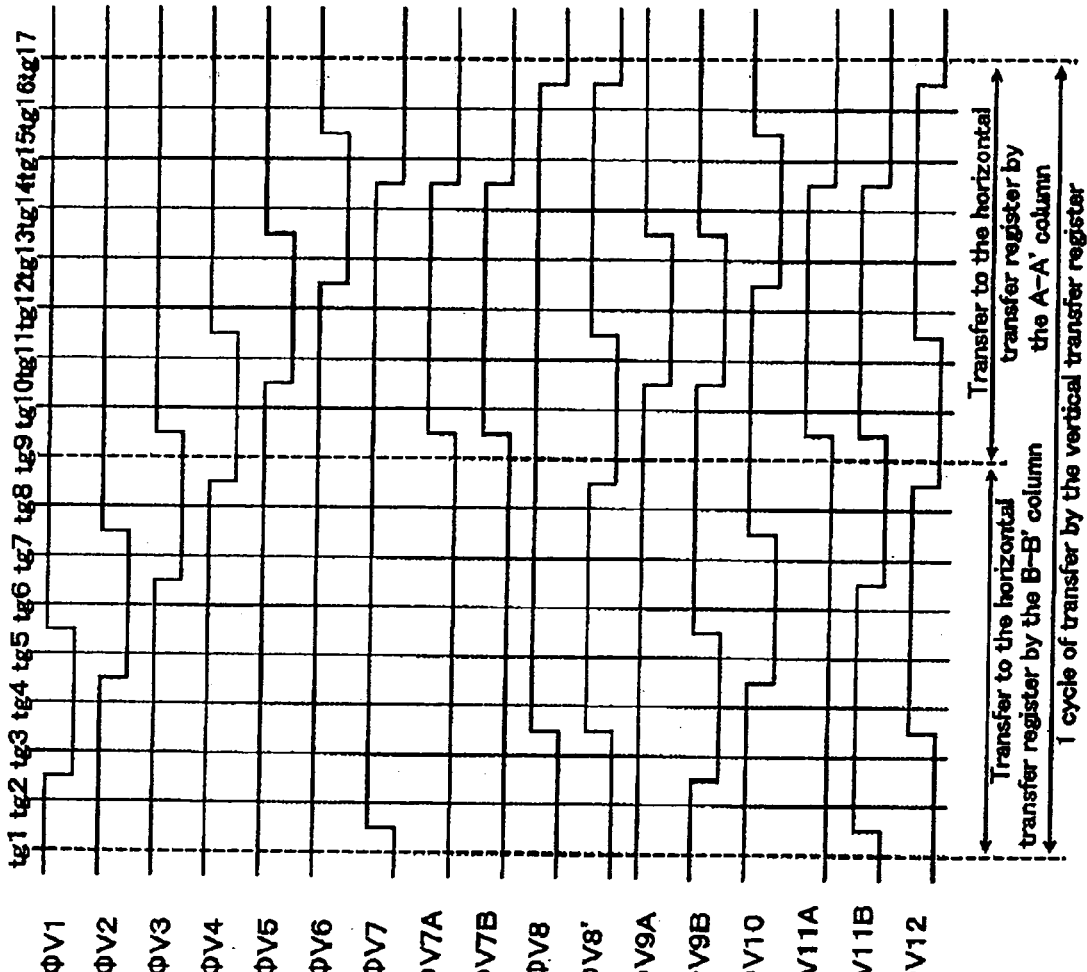
FIG. 19 is a waveform diagram illustrating the driving timing for reading signals from the pixel area vertical transfer registers to the horizontal transfer register in a plurality of stages in the CCD image sensor shown in FIG. 16.
Figure 21:
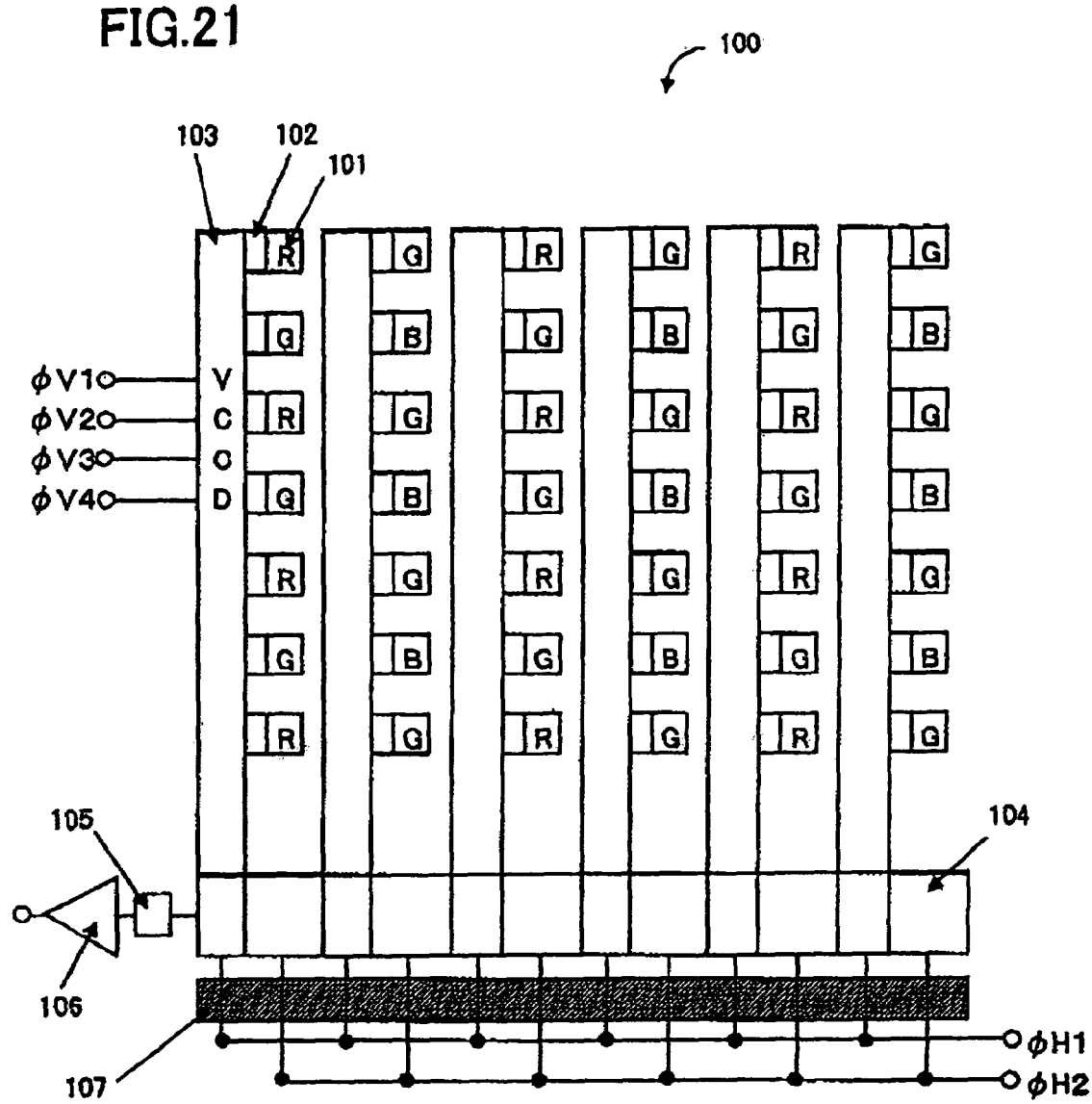
FIG. 21 is a schematic plan view illustrating a structure of a conventional CCD image sensor.

FIG. 19 is a waveform diagram illustrating the driving timing of the gates φV1 through φV8, φV7A, φV7B, φV8', φV9A, φV9B, φV10, φV11A, φV11B and φV12 in the case where signals are read from the pixel area vertical transfer registers 3a and the dummy area vertical transfer registers 8a to the horizontal transfer register 4a in two stages.

FIG. 20A is a potential diagram illustrating the transfer states of signals corresponding to a period from time tg1 through tg17 by the A–A' registers. FIG. 20B is a potential diagram illustrating the transfer states of signals corresponding to a period from time tg1 through tg17 by the B–B' registers.

One transfer cycle of one step of vertical transfer register is from time tg1 to time tg17. This transfer cycle includes a period from time tg1 to time tg9 in which the signal charges are transferred to the horizontal transfer register 4a by the B–B' registers, and a period from time tg9 to time tg17 in which the signal charges are transferred to the horizontal transfer register 4a by the A–A' registers.

First, an operation of the CCD image sensor 10D in the period from time tg1 to time tg9 will be described.

Signal charges B11 accumulated in the packets, which correspond to the B–B' registers, which are closest to the horizontal transfer register 4a, and which are in the dummy section b which are formed using the gates φV9B, φV10, φV11B and φV12 are transferred to the horizontal transfer register 4a during the period from time tg1 to time tg9 at the four-phase driving timing shown in FIG. 19.

During this transfer, with the packets in the pixel area, which are formed using the gates φV1 through φV8, the signal charges are sequentially transferred in the vertical transfer registers by the usual eight-phase driving shown in FIG. 19, and the signal charges in the packets closest to the dummy area are transferred to the packets corresponding to the gates φV5 and φV6, which is between the gates φV4 and φV7A/φV7B.

The gate φV11A, which is closest to the horizontal transfer register 4a among the second layer gates corresponding to the A–A' registers, is fixed to a low level, and at least the gate φV9A, which is closest to the horizontal transfer register 4a among the remaining second layer gates corresponding to the A–A' registers, is fixed to a high level. At least one gate φV7A/φV7B in the dummy sections a' and b' is fixed to a low level. Therefore, as shown in FIG. 20A, the signal charges accumulated in the dummy section a are maintained in the packets formed using the gates φV7A and φV11A. Thus, in the period from time tg1 to time tg9, no signal charge is transferred from the pixel area vertical transfer registers 3a and the dummy area vertical transfer registers 8a corresponding to the A–A' registers to the horizontal transfer register 4a.

In a period from time tg4 to time tg7, there occurs a state in which the signal charges are temporarily transferred in the opposite direction in the vertical transfer registers, but the direction of transfer is recovered to the forward direction in the period from time tg8 to time tg9. Thus, no problem occurs.

Next, an operation of the CCD image sensor 10D in the period from time tg9 to time tg17 will be described.

As shown in FIG. 19, in the period from time tg9 to time tg17, the gates φV5, φV6, φV7A, φV7B, φV8', φV9A, φV9B, φV10, φV11A, φV11B and φV12 are supplied with a low-level clock signal at the same timing as the usual four-phase driving timing. Thus, as shown in FIGS. 20A and 20B, the signal charges accumulated in the packets in the dummy sections a and b corresponding to the A–A' registers and the B–B' registers are transferred toward the horizontal transfer register 4a.

However, the signal charge B11 in the packet which is closest to the horizontal transfer register 4a among the signal charges corresponding to the B–B' registers has already been transferred to the horizontal transfer register 4a in the period from time tg1 to time tg9. At time tg9, the packet is empty. Therefore, what is transferred to the horizontal transfer register 4a in the period from time tg9 to time tg17 is only a signal charge A11 accumulated in the dummy section a.

The signal charges accumulated in the packets corresponding to the gates φV5 and φV6, which are between the grate φV4 and φV7A/φV7B, the packets being in pixel area and being closest to the dummy area, are transferred to the packets corresponding to the gates φV9A, φV9B and φV10 in the dummy sections a and b.

As described above, in the period from time tg1 to time tg9, the signal charges are transferred by the B—B columns from the pixel area vertical transfer registers 3a and dummy area vertical transfer registers 8a to the horizontal transfer register 4a.

Next, in the period from time tg9 to time tg17, the signal charges are transferred by the A–A' registers from the pixel area vertical transfer registers 3a and dummy area vertical transfer registers 8a to the horizontal transfer register 4a. By time tg17, one transfer cycle of all the other signal charges by one step of vertical transfer register has been completed. As a result, a time period between the time at which the transfer of the signal charges from the A–A' registers is completed, and the time at which the transfer of the signal charges from the B–B' registers is completed, equals the time period between time tg9 and time tg17. The actual effective time period is between time tg9, at which the transfer of the signal charges from the B–B' registers is completed, and time tg11, at which the signal charges from the A–A' registers arrive at the horizontal transfer register 4a.

By way of the first through fourth examples, a solid-state imaging device and a method for driving the same have been described. The present invention is not limited to these examples. Various forms of solid-state imaging devices and methods for driving the same can be realized by combination of the examples.

According to the present invention, a solid-state imaging device for controlling signal read from vertical transfer registers to a horizontal transfer register column by column with a simple structure, and a method for driving the same are provided, which are usable in imaging devices including, for example, digital still cameras and video cameras.

Various other modifications Will be apparent to and can be readily made by those skilled in the art without departing from the scope and spirit of this invention. Accordingly, it in not intended that the scope of the claims appended hereto be limited to the description as set forth herein, but rather that the claims be broadly construed.

What is claimed is:

1. A solid-state imaging device, comprising:
a plurality of light receiving sections provided in a matrix in a plurality of row and a plurality columns, each of the plurality of light receiving sections generating a charge in accordance with the amount of light received;
a pixel area vertical transfer register section for transferring, column by column, the charges generated by the plurality of light receiving sections in a vertical direction;
a dummy area vertical transfer register section for transferring, column by column in the vertical direction, the charges which have been transferred by the pixel area vertical transfer register section, the dummy area vertical transfer register section providing a control such that the transfer of the charges of at least one of the plurality of columns is performed in the same manner as the charges in the other columns in one case, and in a different manner from the transfer of the charges in the other columns in another case; and
a horizontal transfer register section for transferring, in a horizontal direction, the charges which have been transferred from the dummy area vertical transfer register section.

2. A solid-state imaging device according to claim 1, wherein the dummy area vertical transfer register section includes:
a plurality of dummy area vertical transfer registers, each of which transfers, in the vertical direction, the charges in a corresponding column among the plurality of columns, the charges having been transferred by the pixel area vertical transfer register section; and
a dummy area transfer control section for controlling the plurality of dummy area vertical transfer registers, such that the transfer of the charges by at least one of the plurality of dummy area vertical transfer register is performed in the same manner as the transfer of the charges by the other dummy area vertical transfer registers in one case, and in a different manner from the transfer of the charges by the other dummy area vertical transfer registers in another case.

3. A solid-state imaging device according to claim 2, wherein:
the dummy area vertical transfer register section includes a dummy area transfer electrode; and
the dummy area transfer control section supplies the dummy area transfer electrode with a signal for allowing the plurality of dummy area vertical transfer registers to transfer the charges.

4. A solid-state imaging device according to claim 3, wherein the pixel area vertical transfer register section includes:
a plurality of pixel area vertical transfer registers, each of which transfers, in the vertical direction, the charges in a corresponding column among the plurality of columns; and
a pixel area transfer control section for controlling the plurality of pixel area vertical transfer registers.

5. A solid-state imaging device according to claim 4, wherein:
the pixel area vertical transfer register section includes a pixel area transfer electrode; and
the pixel area transfer control section supplies the pixel area transfer electrode with a signal for allowing the plurality of pixel area vertical transfer registers to transfer the charges.

6. A solid-state imaging device according to claim 5, further comprising a control section including the pixel area transfer control section and the dummy area transfer control section.

7. A solid-state imaging device according to claim 1, further comprising a sweep-out drain section for discharging the charges of the horizontal transfer register section.

8. A solid-state imaging device according to claim 5, wherein:
the pixel area transfer electrode includes a plurality of first layer transfer electrodes and a plurality of second layer transfer electrodes in a pixel area; and
the dummy area transfer electrode includes a plurality of first layer transfer electrodes and a plurality of second layer transfer electrodes in a dummy area.

9. A solid-state imaging device according to claim 8, wherein the pixel area vertical transfer register section and the dummy area vertical transfer register section each transfer the charges in the vertical direction by n-phase driving, with n number of transfer electrodes being treated as one set (wherein n=2k; k is an integer of 2 or greater).

10. A solid-state imaging device according to claim 9, wherein:
the dummy area includes a first dummy area and a second dummy area;
in the first dummy area, a plurality of first dummy area first layer transfer electrodes among the plurality of first layer transfer electrodes and a plurality of first dummy area second layer transfer electrodes among the plurality of second layer transfer electrodes are provided alternately in the vertical direction; and
the plurality of first dummy area first layer transfer electrodes and the plurality of first dummy area second layer transfer electrodes transfer the charges, transferred by the pixel area vertical transfer register section, by n-phase driving in the vertical direction, with n number of transfer electrodes being treated as one set; and
in the second dummy area,
a plurality of second dummy area first layer transfer electrodes among the plurality of first layer transfer electrodes and a plurality of second dummy area second layer transfer electrodes among the plurality of second layer transfer electrodes are provided alternately in the vertical direction;
one of the plurality of second dummy area first layer transfer electrodes, and one of the plurality of first dummy area first layer transfer electrodes, which correspond to each other are supplied with a transfer control signal at the same timing;
one of the plurality of second dummy area second layer transfer electrodes, and one of the plurality of first dummy area second layer transfer electrodes, which correspond to each other are supplied with a transfer control signal at different timings; and
the plurality of second dummy area first layer transfer electrodes and the plurality of second dummy area second layer transfer electrodes transfer the charges, transferred by the pixel area vertical transfer register section, by n-phase driving in the vertical direction, with n number of transfer electrodes being treated as one set.

11. A solid-state imaging device according to claim 10, wherein:
the number of the plurality of first dummy area first layer transfer electrodes is equal to the number of the plurality of second dummy area first layer transfer electrodes; and
the number of the plurality of first dummy area second layer transfer electrodes is equal to the number of the plurality of second dummy area second layer transfer electrodes.

12. A solid-state imaging device according to claim 8, wherein:
patterns of the plurality of first layer transfer electrodes of the dummy area transfer electrode are the same; and
patterns of the plurality of second layer transfer electrodes of the dummy area transfer electrode are different in units of a plurality of second layer transfer electrodes.

13. A solid-state imaging device according to claim 10, wherein:
the dummy area further includes a third dummy area provided between the first dummy area and the second dummy area;
the first dummy area includes a first dummy section and a second dummy section provided in the vertical direction; and in each of the first dummy section and the second dummy section, a plurality of first dummy area first layer transfer electrodes among the plurality of first layer transfer electrodes and a plurality of first dummy area second layer transfer electrodes among the plurality of second layer transfer electrode are alternately provided, wherein the plurality of first dummy area first layer transfer electrodes and the plurality of first dummy area second layer transfer electrodes total n;
the second dummy area includes a first dummy section and a second dummy section provided in the vertical direction; and in each of the first dummy section and the second dummy section, a plurality of second dummy area first layer transfer electrodes among the plurality of first layer transfer electrodes and a plurality of second dummy area second layer transfer electrodes among the plurality of second layer transfer electrode are alternately provided, wherein the plurality of second dummy area first layer transfer electrodes and the plurality of second dummy area second layer transfer electrodes total n;
the third dummy area includes a first dummy section and a second dummy section provided in the vertical direction; and in each of the first dummy section and the second dummy section, a plurality of third dummy area first layer transfer electrodes among the plurality of first layer transfer electrodes and a plurality of third dummy area second layer transfer electrodes among the plurality of second layer transfer electrode are alternately provided, wherein the plurality of third dummy area first layer transfer electrodes and the plurality of third dummy area second layer transfer electrodes total n;
one of the plurality of third dummy area first layer transfer electrodes, one of the plurality of first dummy area first layer transfer electrodes, and one of the plurality of second dummy area first layer transfer electrodes, which correspond to each other are supplied with a transfer control signal at the same timing;
one of the plurality of third dummy area second layer transfer electrodes in the first dummy section, and one of the plurality of first dummy area second layer transfer electrodes, which correspond to each other are provided with a transfer control signal at different timings;
one of the plurality of third dummy area second layer transfer electrodes in the second dummy section, and one of the plurality of second dummy area second layer transfer electrodes, which correspond to each other are provided with a transfer control signal at different timings; and
the plurality of third dummy area first layer transfer electrodes and the plurality of third dummy area second layer transfer electrodes transfers the charges, transferred from the pixel area vertical transfer register section, by n-phase driving in the vertical direction.

14. A solid-state imaging device according to claim 10, wherein one of n-phase transfer electrodes in the first dummy area, and one of n-phase transfer electrodes in the pixel area, which correspond to each other are commonly connected.

15. A solid-state imaging device according to claim 8, wherein
in the pixel area, the plurality of first layer transfer electrodes and the plurality of second layer transfer electrodes are provided alternately in the vertical direction; and the plurality of first layer transfer electrodes and the plurality of second layer transfer electrodes transfer the charges generated by the plurality of light receiving sections in the vertical direction, by m-phase driving, with m number of transfer electrodes being treated as one set (m=2j, j is an integer of 3 or greater);
the dummy area includes a first dummy area and a second dummy area; the first dummy area includes a first dummy section and a second dummy section; and the second dummy area includes a first dummy section and a second dummy section;
in the first dummy section in the first dummy area, a plurality of first dummy area first layer transfer electrodes among the plurality of first layer transfer electrodes and a plurality of first dummy area second layer transfer electrodes among the plurality of second layer transfer electrodes are alternately provided in the vertical direction, wherein the plurality of first dummy area first layer transfer electrodes and the plurality of first dummy area second layer transfer electrodes total m/2; and the plurality of first dummy area first layer transfer electrodes and the plurality of first dummy area second layer transfer electrodes transfer the charges, transferred by the pixel area vertical transfer register section, by m/2-phase driving in the vertical direction;
in the second dummy section in the first dummy area, two first dummy area transfer electrodes are provided, and are supplied with a transfer control signal at a different timing from the pixel area transfer electrodes corresponding to the pixel area;
in the first dummy section in the second dummy area,
a plurality of second dummy area first layer transfer electrodes among the plurality of first layer transfer electrodes and a plurality of second dummy area second layer transfer electrodes among the plurality of second layer transfer electrodes are alternately provided in the vertical direction, wherein the plurality of second dummy area first layer transfer electrodes and the plurality of second dummy area second layer transfer electrodes total m/2;
one of the plurality of second dummy area first layer transfer electrodes, and one of the plurality of first dummy area first layer transfer electrodes, which correspond to each other are supplied with a transfer control signal at the same timing;

one of the second dummy area second layer transfer electrodes, and one of the first dummy area second layer transfer electrodes, which correspond to each other are supplied with a transfer control signal at different timings; and the first dummy section in the second dummy area transfers, by m/2-phase driving in the vertical direction, the charges transferred by the pixel area vertical transfer register section, with m/2 number of transfer electrodes being treated as one set; and in the second dummy section in the second dummy area,
two second dummy area transfer electrodes are provided, and are supplied with a transfer control signal at a different timing from the pixel area vertical transfer electrodes corresponding to the pixel area;

the second dummy area first layer transfer electrode among the two transfer electrodes, and one of the first dummy area first layer transfer electrodes, which correspond to each other are supplied with a transfer control signal at the same timing; and the second dummy area second layer transfer electrode among the two transfer electrodes, and one of the first dummy area second layer transfer electrodes, which correspond to each other are supplied with a transfer control signal at different timings.

16. A solid-state imaging device according to claim 15, wherein patterns of the plurality of first layer transfer electrodes of the dummy area transfer electrode are the same; and patterns of the plurality of second layer transfer electrodes of the dummy area transfer electrode are different in units of a plurality of second layer transfer electrodes.

17. A solid-state imaging device according to claim 1, which is produced using a multiple layer gate process using three or more layers.

18. A method for driving a solid-state imaging device, comprising:

a generation step of generating a charge by a plurality of light receiving sections, provided in a matrix in a plurality of rows and a plurality of columns, in accordance with the amount of light received by the plurality of light receiving sections;

a first transfer step of transferring, by a pixel area vertical transfer register section, the charges generated by the plurality of light receiving sections, column by column in a vertical direction;

a second transfer step of transferring, by a dummy area vertical transfer register section, the charges transferred by the pixel area vertical transfer register section, column by column in the vertical direction, the dummy area vertical transfer register section providing a control such that the transfer of the charges of at least one of the plurality of columns is performed in the same manner as the charges in the other columns in one case, and in a different manner from the transfer of the charges in the other columns in another case; and a third transfer step of transferring, by a horizontal transfer register section, the charges transferred by the dummy area vertical transfer register section, in a horizontal direction.

19. A method according to claim 18, wherein:

the pixel area vertical transfer register section and the dummy area vertical transfer register section each transfer the charges in the vertical direction by n-phase driving, with n number of transfer electrodes being treated as one set (wherein n=2k; k is an integer of 2 or greater);

a dummy area includes a first dummy area and a second dummy area;

in the first dummy area, a plurality of first dummy area first layer transfer electrodes among a plurality of first layer transfer electrodes and a plurality of first dummy area second layer transfer electrodes among a plurality of second layer transfer electrodes are provided alternately in the vertical direction;

the plurality of first dummy area first layer transfer electrodes and the plurality of first dummy area second layer transfer electrodes transfer the charges, transferred by the pixel area vertical transfer register section, by n-phase driving in the vertical direction, with n number of transfer electrodes being treated as one set; and in the second dummy area, a plurality of second dummy area first layer transfer electrodes among the plurality of first layer transfer electrodes and a plurality of second dummy area second layer transfer electrodes among the plurality of second layer transfer electrodes are provided alternately in the vertical direction;

one of the plurality of second dummy area first layer transfer electrodes, and one of the plurality of first dummy area first layer transfer electrodes, which correspond to each other are supplied with a transfer control signal at the same timing;

one of the plurality of second dummy area second layer transfer electrodes, and one of the plurality of first dummy area second layer transfer electrodes, which correspond to each other are supplied with a transfer control signal at different timings; and the plurality of second dummy area first layer transfer electrodes and the plurality of second dummy area second layer transfer electrodes transfer the charges, transferred by the pixel area vertical transfer register section, by n-phase driving in the vertical direction, with n number of transfer electrodes being treated as one set;

the second transfer stop comprising the step of, while one of the first dummy area and the second dummy area is driven by n-phase driving to transfer the charges, setting a second layer transfer electrode which is closest to the horizontal transfer register section among the plurality of second layer transfer electrodes in the other of the first dummy area and the second dummy area to a low level, and setting the remaining second layer transfer electrodes to a high level, such that the other of the first dummy area and the second dummy area holds the charges.

20. A method according to claim 18, wherein:

the pixel area vertical transfer register section and the dummy area vertical transfer register section each transfer the charges in the vertical direction by n-phase driving, with n number of transfer electrodes being treated as one set (wherein n=2k ; k is an integer of 2 or greater);

a dummy area includes a first dummy area and a second dummy area;

in the first dummy area, a plurality of first dummy area first layer transfer electrodes among a plurality of first layer transfer electrodes and a plurality of first dummy area second layer transfer electrodes among a plurality of second layer transfer electrodes are provided alternately in the vertical direction;
the plurality of first dummy area first layer transfer electrodes and the plurality of first dummy area second layer transfer electrodes transfer the charges, transferred by the pixel area vertical transfer register section, by n-phase driving in the vertical direction, with n number of transfer electrodes being treated an one set;
in the second dummy area,
a plurality of second dummy area first layer transfer electrodes among the plurality of first layer transfer electrodes and a plurality of second dummy area second layer transfer electrodes among the plurality of second layer transfer electrodes are provided alternately in the vertical direction;
one of the plurality of second dummy area first layer transfer electrodes, and one of the plurality of first dummy area first layer transfer electrodes, which correspond to each other are supplied with a transfer control signal at the same timing;
one of the plurality of second dummy area second layer transfer electrodes, and one of the plurality of first dummy area second layer transfer electrodes, which correspond to each other are supplied with a transfer control signal at different timings; and
the plurality of second dummy area first layer transfer electrodes and the plurality of second dummy area second layer transfer electrodes transfer the charges, transferred by the pixel area vertical transfer register section, by n-phase driving in the vertical direction, with n number of transfer electrodes being treated as one set;
the dummy area further includes a third dummy provided between the first dummy area and the second dummy area;
the first dummy area includes a first dummy section and a second dummy section provided in the vertical direction; and in each of the first dummy section and the second dummy section, a plurality of first dummy area first layer transfer electrodes among the plurality of first layer transfer electrodes and a plurality of first dummy area second layer transfer electrodes among the plurality of second layer transfer electrode are alternately provided, wherein the plurality of first dummy area first layer transfer electrodes and the plurality of first dummy area second layer transfer electrodes total n;
the second dummy area includes a first dummy section and a second dummy section provided in the vertical direction; and in each of the first dummy section and the second dummy section, a plurality of second dummy area first layer transfer electrodes among the plurality of first layer transfer electrodes and a plurality of second dummy area second layer transfer electrodes among the plurality of second layer transfer electrode are alternately provided, wherein the plurality of second dummy area first layer transfer electrodes and the plurality of second dummy area second layer transfer electrodes total n;
the third dummy area includes a first dummy section and a second dummy section provided in the vertical direction; and in each of the first dummy section and the second dummy section, a plurality of third dummy area first layer transfer electrodes among the plurality of first layer transfer electrodes and a plurality of third dummy area second layer transfer electrodes among the plurality of second layer transfer electrode are alternately provided, wherein the plurality of third dummy area first layer transfer electrodes and the plurality of third dummy area second layer transfer electrodes total n;
one of the plurality of third dummy area first layer transfer electrodes, one of the plurality of first dummy area first layer transfer electrodes, and one of the plurality of second dummy area first layer transfer electrodes, which correspond to each other are supplied with a transfer control signal at the same timing;
one of the plurality of third dummy area second layer transfer electrodes in the first dummy section, and one of the plurality of first dummy area second layer transfer electrodes, which correspond to each other are provided with a transfer control signal at different timings;
one of the plurality of third dummy area second layer transfer electrodes in the second dummy section, and one of the plurality of second dummy area second layer transfer electrodes, which correspond to each other are provided with a transfer control signal at different timings; and
the plurality of third dummy area first layer transfer electrodes and the plurality of third dummy area second layer transfer electrodes transfers the charges, transferred from the pixel area vertical transfer register section, by n-phase driving in the vertical direction;
the second transfer step comprising the step of, while one of the first dummy area, the second dummy area and the third dummy area is driven by n-phase driving to transfer the charges, setting a second layer transfer electrode which is closest to the horizontal transfer register section among the plurality of second layer transfer electrodes in the first dummy section and the second dummy section in the remaining areas of the first dummy area, the second dummy area and the third dummy area to a low level, and setting the remaining second layer transfer electrodes to a high level, such that the remaining areas of the first dummy area, the second dummy area and the third dummy area hold the charges.

21. A method according to claim 19, wherein one of a plurality of first layer transfer electrodes in the pixel area vertical transfer register section, and one of the plurality of first layer transfer electrodes in the dummy area vertical transfer register section, which correspond to each other are commonly connected; and
the second transfer step includes the step of supplying the one of the plurality of first layer transfer electrodes in the dummy area vertical transfer register section with a transfer control signal at the same timing as supplying the one of the plurality of first layer transfer electrodes in the pixel area vertical transfer register section in the first transfer step.

22. A method according to claim 18, wherein:
in a pixel area, a plurality of first layer transfer electrodes and a plurality of second layer transfer electrodes are provided alternately in the vertical direction; and the plurality of first layer transfer electrodes and the plurality of second layer transfer electrodes transfer the charges generated by the plurality of light receiving sections in the vertical direction, by m-phase driving, with m number of transfer electrodes being treated as one set (m=2j, j is an integer of 3 or greater);
a dummy area includes a first dummy area and a second dummy area; the first dummy area includes a first dummy section and a second dummy section; and the second dummy area includes a first dummy section and a second dummy section;

in the first dummy section in the first dummy area, a plurality of first dummy area first layer transfer electrodes among a plurality of first layer transfer electrodes and a plurality of first dummy area second layer transfer electrodes among a plurality of second layer transfer electrodes are alternately provided in the vertical direction, wherein the plurality of first dummy area first layer transfer electrodes and the plurality of first dummy area second layer transfer electrodes total m/2; and the plurality of first dummy area first layer transfer electrodes and the plurality of first dummy area second layer transfer electrodes transfer the charges, transferred by the pixel area vertical transfer register section, by m/2-phase driving in the vertical direction;

in the second dummy section in the first dummy area, two first dummy area transfer electrodes are provided, and are supplied with a transfer control signal at a different timing from pixel area transfer electrodes corresponding to the pixel area;

in the first dummy section in the second dummy area,
a plurality of second dummy area first layer transfer electrodes among the plurality of first layer transfer electrodes and a plurality of second dummy area second layer transfer electrodes among the plurality of second layer transfer electrodes are alternately provided in the vertical direction, wherein the plurality of second dummy area first layer transfer electrodes and the plurality of second dummy area second layer transfer electrodes total m/2;

one of the plurality of second dummy area first layer transfer electrodes, and one of the plurality of first dummy area first layer transfer electrodes, which correspond to each other are supplied with a transfer control signal at the same timing;

one of the second dummy area second layer transfer electrodes, and one of the first dummy area second layer transfer electrodes, which correspond to each other are supplied with a transfer control signal at different timings; and the first dummy section in the second dummy area transfers, by m/2-phase driving in the vertical direction, the charges transferred by the pixel area vertical transfer register section, with m/2 number of transfer electrodes being treated as one set; and in the second dummy section in the second dummy area,
two second dummy area transfer electrodes are provided, and are supplied with a transfer control signal at a different timing from the pixel area vertical transfer electrodes corresponding to the pixel area;

the second dummy area first layer transfer electrode among the two transfer electrodes, and one of the first dummy area first layer transfer electrodes, which correspond to each other are supplied with a transfer control signal at the same timing; and the second dummy area second layer transfer electrode among the two transfer electrodes, and one of the first dummy area second layer transfer electrodes, which correspond to each other are supplied with a transfer control signal at different timings;

the second transfer step comprising the step of, while the first dummy section in one of the first dummy area and the second dummy area is driven by m/2-phase driving to transfer the charges, setting a second layer transfer electrode which is closest to the horizontal transfer register section among the plurality of second layer transfer electrodes in the other of the first dummy area and the second dummy area to a low level, setting the remaining second layer transfer electrodes to a high level, and setting at least one transfer electrode in the second dummy section in each of the first dummy area and the second dummy area to a low level, such that the other of the first dummy area and the second dummy area holds the charges.

* * * * *